United States Patent [19]
Tobita

[11] Patent Number: 5,805,508
[45] Date of Patent: Sep. 8, 1998

[54] SEMICONDUCTOR MEMORY DEVICE WITH REDUCED LEAK CURRENT

[75] Inventor: Youichi Tobita, Hyogo, Japan

[73] Assignee: Mitsubishi Denki Kabushiki Kaisha, Tokyo, Japan

[21] Appl. No.: 780,247

[22] Filed: Jan. 8, 1997

[30] Foreign Application Priority Data

Feb. 27, 1996 [JP] Japan ................................. 8-039632

[51] Int. Cl.⁶ ................................................ G11C 7/00
[52] U.S. Cl. ............................. 365/189.09; 365/189.07; 365/203; 365/207; 365/226
[58] Field of Search ............................. 365/226, 189.09, 365/189.07, 203, 207

[56] References Cited

U.S. PATENT DOCUMENTS

| | | | |
|---|---|---|---|
| 5,404,335 | 4/1995 | Tobita | 365/222 |
| 5,568,440 | 10/1996 | Tsukude et al. | 365/189.09 X |
| 5,604,707 | 2/1997 | Kuge et al. | 365/189.09 X |
| 5,677,889 | 10/1997 | Haraguchi et al. | 365/189.09 X |

FOREIGN PATENT DOCUMENTS 5-282865  10/1993  Japan.
6-28847   2/1994   Japan.

OTHER PUBLICATIONS

"Standby power consumption is reduced to a conventional level by . . . ", Kuroda et al., Nikkei Microdevices Mar. 1995, pp. 58–60.

Primary Examiner—Do Hyun Yoo
Attorney, Agent, or Firm—McDermott, Will & Emery

[57] ABSTRACT

In a data holding mode, a potential on a substrate region in a memory cell array is fixed at the same level as that in a normal operation mode, and an absolute value of a bias voltage applied to a substrate region in a peripheral circuit is made larger than that in the normal operation mode. When an operation mode changes, a memory cell transistor substrate potential does not change, and therefore a potential on a storage node of a memory cell does not change, so that the storage data is stably held. A threshold voltage of an MOS transistor in the peripheral circuit increases in absolute value, and a subthreshold current is reduced. A current consumption is reduced in the data holding mode of a semiconductor memory device without adversely affecting storage data.

14 Claims, 21 Drawing Sheets

FIG. 5A
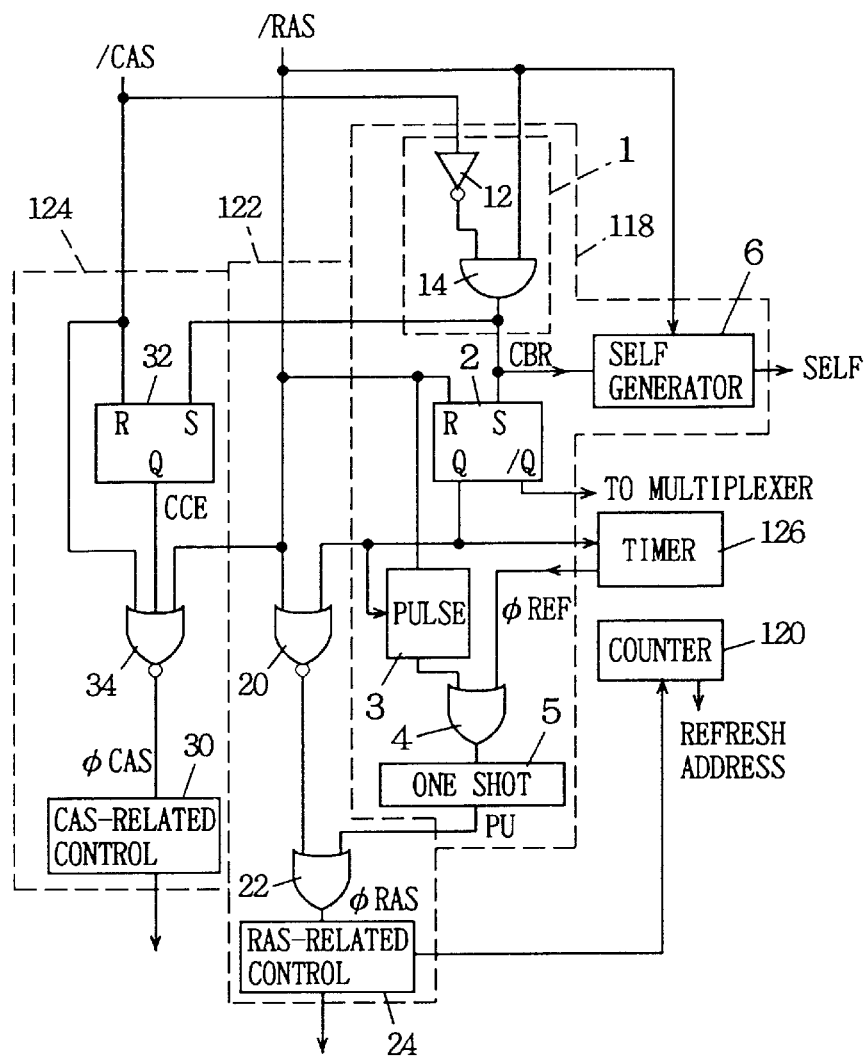
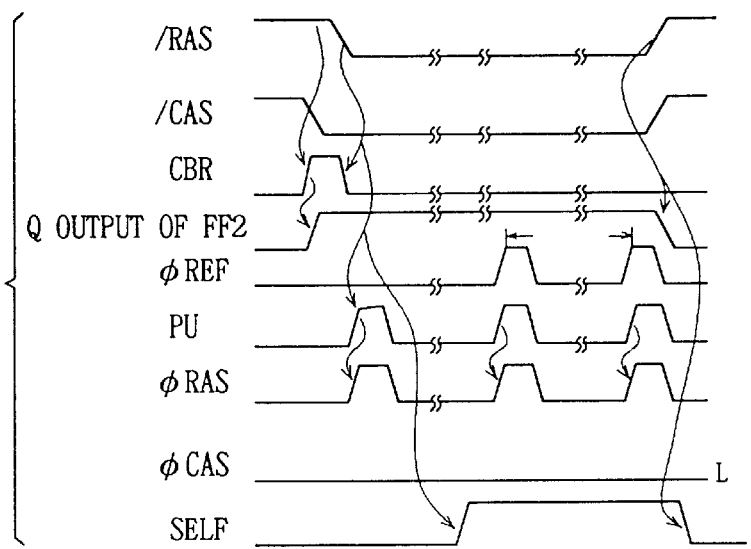
FIG. 5B

FIG. 20A
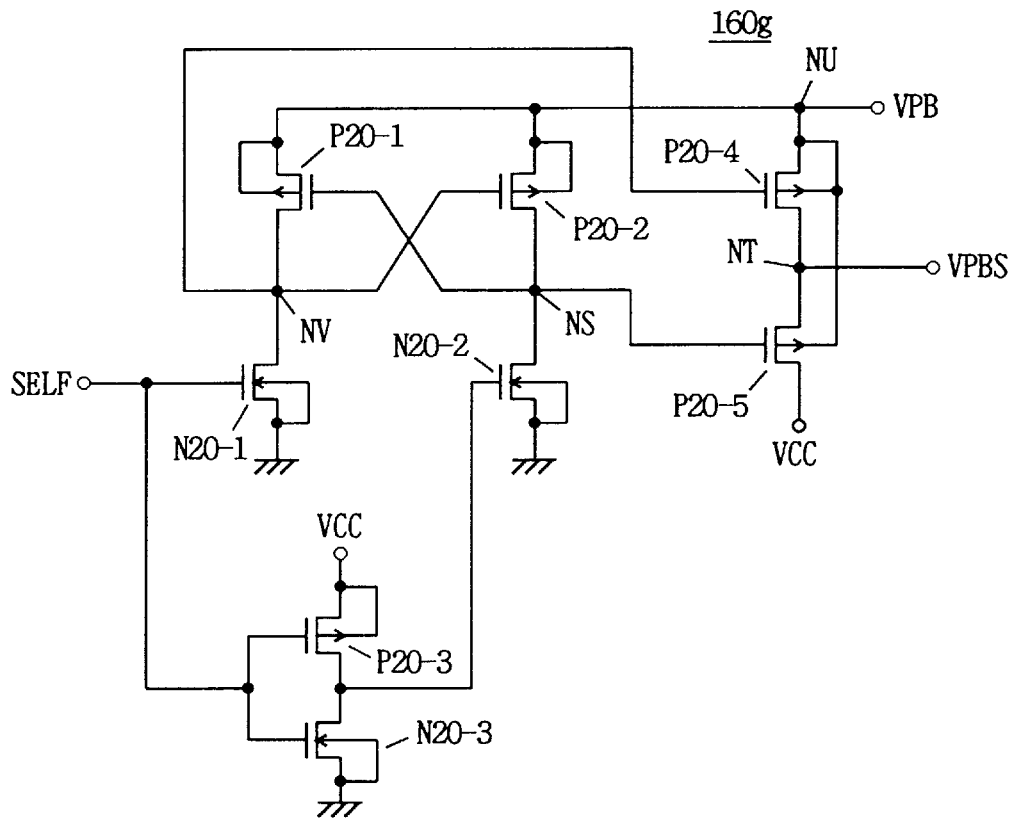
FIG. 20B
FIG. 25
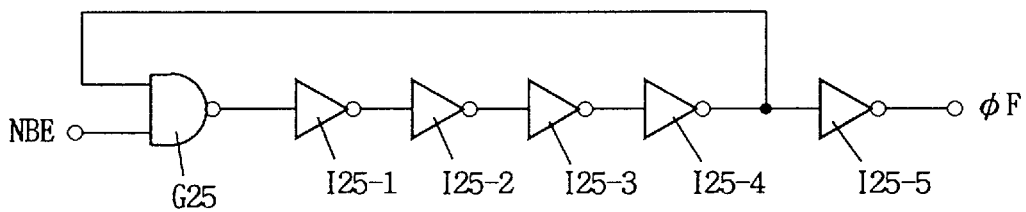

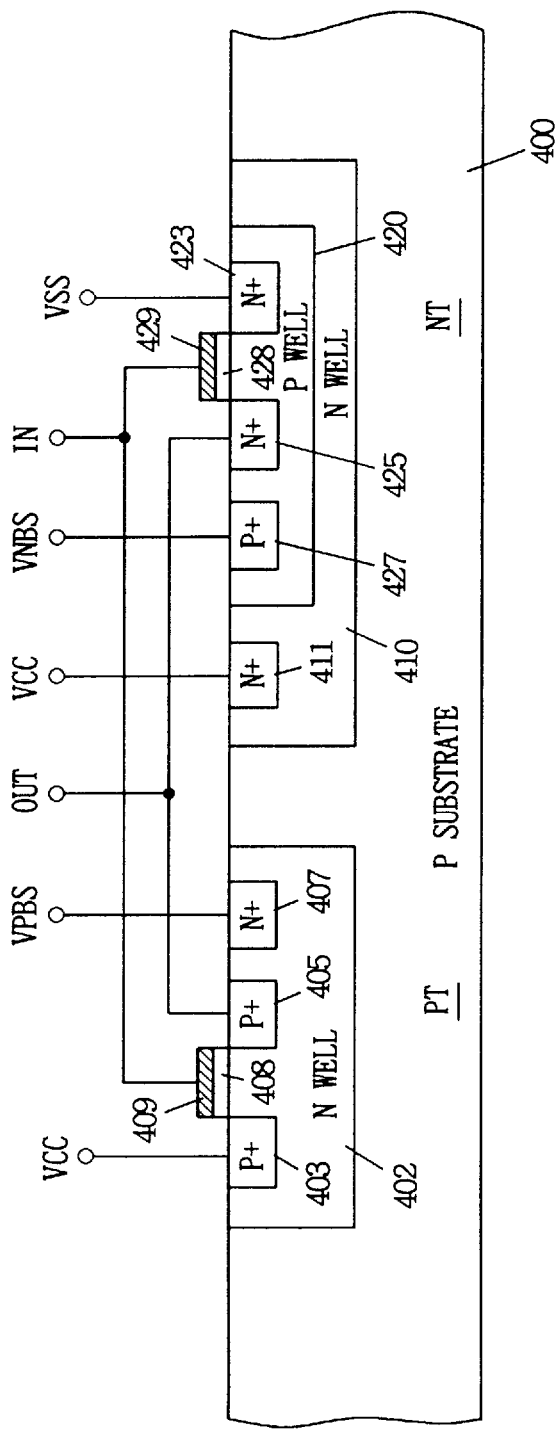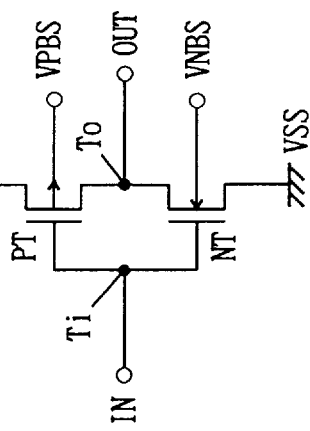
FIG. 30A
FIG. 30B

FIG. 37 PRIOR ART
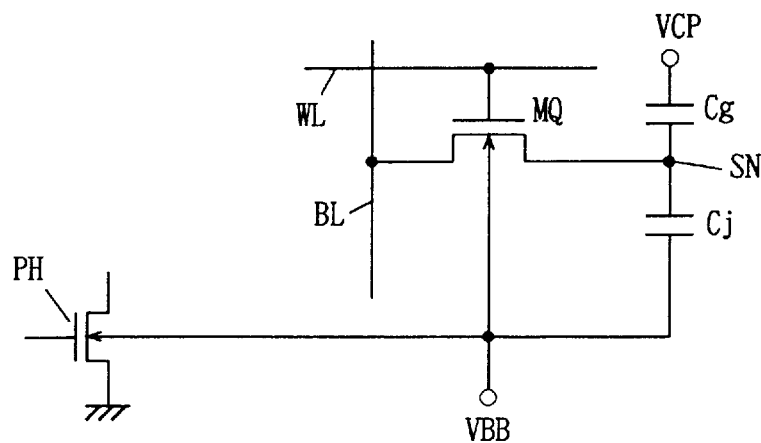
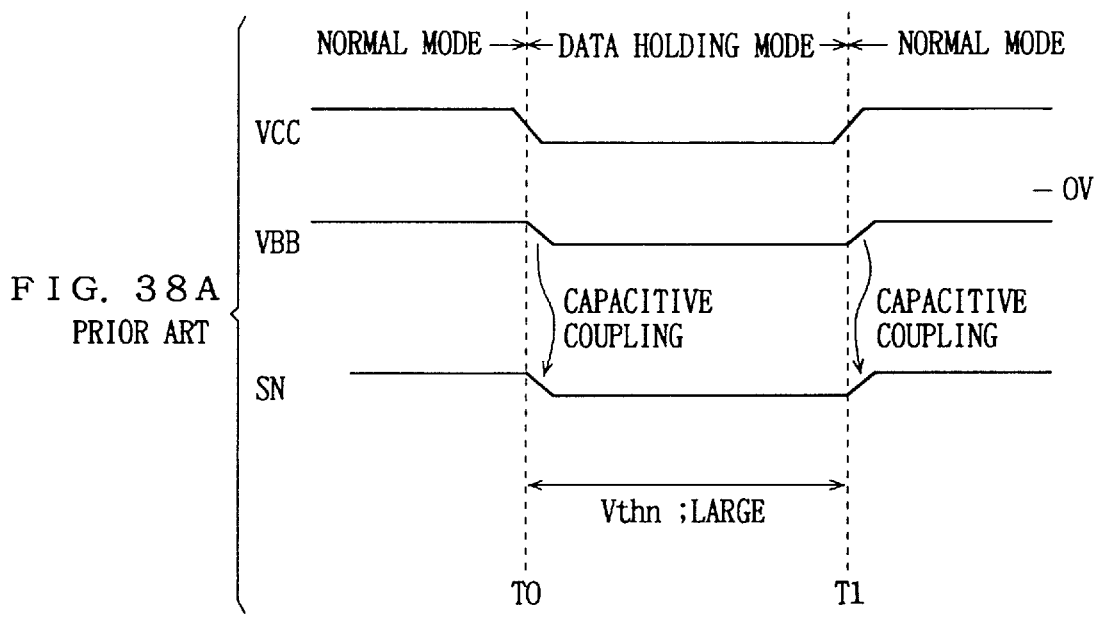
FIG. 38A PRIOR ART
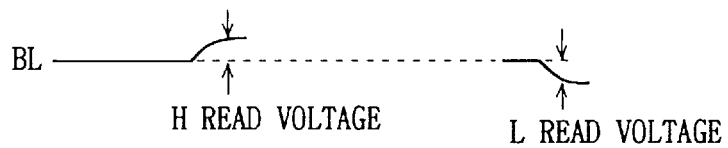
FIG. 38B PRIOR ART

SEMICONDUCTOR MEMORY DEVICE WITH REDUCED LEAK CURRENT

BACKGROUND OF THE INVENTION

1. Field of the Invention

The present invention relates to a semiconductor memory device, and in particular to a structure of a substrate bias generating circuit of a semiconductor memory device operable in a data hold mode.

2. Description of the Background Art

DRAMs (Dynamic Random Access Memories) have been widely used in PDAs (personal digital assistants) such as a notebook personal computer and portable equipments (portable information terminals) such as a PAGER (portable digital telephone). Since these portable equipments work on batteries, devices of a low power consumption are particularly required. Among various measures for reducing the power consumption, reduction of an operation power supply voltage is most effective, because the power consumption is proportional to the square of the operation power supply voltage. From this viewpoint, it is now demanded to use the power supply voltage of 2 V in some cases. In accordance with reduction of the power supply voltage, MOS transistors (insulated gate field-effect transistors) are scaled down along a scaling rule in order to maintain operation characteristics. However, it is usually difficult to reduce a threshold voltage in accordance with reduction of the power supply voltage, because a subthreshold current increases as will be described later.

FIG. 33 shows a relationship between a gate voltage and a drain current of an n-channel MOS transistor. The abscissa gives a drain current Ids, and the ordinate gives a gate voltage (i.e., gate voltage with reference to a source voltage) Vgs. A threshold voltage of MOS transistor is defined as a gate voltage at the time when a certain amount of drain current flows. In an MOS transistor having a gate width, e.g., of 10 μm, the gate voltage Vgs at the time when the drain current of 1 μA flows is defined as the threshold voltage Vth. In FIG. 33, the values of the gate voltage Vgs when a drain current I0 flows are defined as threshold voltages Vth1 (curve I) and Vth2 (curve II). In the MOS transistor, when gate voltage Vgs decreases to or below the threshold voltage, drain current Ids lowers exponentially (since FIG. 33 has a logarithmic scale, it lowers linearly), but drain current Ids does not go to 0 V even when gate voltage Vgs goes to 0 V.

When the threshold voltage of MOS transistor lowers from Vth1 to Vth2, the characteristic curve of MOS transistor changes from curve I to curve II.

Accordingly, a current (i.e., subthreshold current) which flows when gate voltage Vgs is 0 V increases from I1 to I2. Therefore, mere reduction of the threshold voltage results in increase of the subthreshold current and hence increase of current consumption. Characteristics of a p-channel MOS transistor can be derived by inverting a sign of gate voltage Vgs in FIG. 33, and a similar problem arises.

From an experiment using, e.g., a 16M-DRAM, the following has been found. When absolute values of the threshold voltages of n-channel and p-channel MOS transistors are both reduced to about 0.4 V, the power supply current consumed during standby (during an inactive state of a chip) increases to about 500 μA with the power supply voltage of 2 V. In a practical operation, the DRAM is held at the standby state during which the DRAM is set to the self-refresh mode, i.e., data holding mode and has refreshing internally performed. In this data holding mode operation, a refresh current of about 50 μA which is consumed during refreshing is required in addition to a standby current which is consumed during standby. Generally, a portable equipment in the data holding mode is required to have a standby current of about 100 μA or less in view of the refresh current required for self-refreshing. For example, Japanese Patent Laying-Open No. 6-28847 (1994) has disclosed a structure for suppressing the subthreshold current in the standby state (standby cycle).

FIG. 34 schematically shows a whole structure of a conventional semiconductor memory device. In FIG. 34, a semiconductor memory device PSR includes an internal circuit LC including a memory array and peripheral circuitry, a bias generating circuit VBG which supplies bias voltages VBB and VWB to a substrate region provided for forming internal circuit LC and including a well and a substrate, a data holding mode detecting circuit DRD which detects designation of the data holding mode in accordance with an externally applied data holding mode designating signal ZRF and a power supply voltage VCC, and a bias control circuit VBC which increases absolute values of bias voltages VBB and VWB generated from bias generating circuit VBG in accordance with activation of a holding mode detection signal DRM from data holding mode detecting circuit DRD.

Internal circuit LC includes an n-channel MOS transistor formed at a P-type substrate region and a p-channel MOS transistor formed at an N-type substrate region. Data holding mode detecting circuit DRD determines that the data holding mode is designated when holding mode designating signal ZRF is held at L-level for a predetermined period, or when power supply voltage VCC is set to or below a predetermined voltage level. Bias generating circuit VBG applies negative bias voltage VBB to the P-type substrate region, and applies positive bias voltage VWB to the N-type substrate region. Operation of the semiconductor device shown in FIG. 34 will be described below with reference to a waveform diagram of FIG. 35.

In a normal mode (normal operation mode), power supply voltage VCC is held at a voltage level, e.g., of 5 V. In this state, holding mode designating signal ZRF is inactive at H-level, and holding mode detection signal DRM from data holding mode detecting circuit DRD is inactive at L-level. In this state, substrate bias voltage VBB supplied from bias generating circuit VBG is held at a voltage level of −3·Vthn, and substrate bias voltage VWB is held at power supply voltage VCC level. Vthn represents a threshold voltage of the n-channel MOS transistor.

At time T0, the data holding mode is designated, and that power supply voltage VCC is lowered to a level of 3 V. This data holding mode is detected by data holding mode detecting circuit DRD detecting that holding mode designating signal ZRF is set at L-level for a predetermined period, or that power supply voltage VCC lowers in potential level. When the data holding mode is entered, holding mode detection signal DRM from data holding mode detecting circuit DRD is activated to attain H-level at time T0, and bias control signal VCL from bias control circuit VBC is activated. Bias generating circuit VBG lowers the potential level of bias voltage VBB to −4·Vthn in accordance with bias control signal VCL, and raises the potential level of bias voltage VWB to VCC+2·|Vthp|, where Vthp represents a threshold voltage of the p-channel MOS transistor.

Bias voltages VBB and VWB provide back gate potentials of the n-channel and p-channel MOS transistors, respectively. In an MOS transistor, when a potential on a back gate increases in absolute value, a threshold voltage thereof also increases in absolute value. Subthreshold currents of the p-channel and n-channel MOS transistors are reduced by increasing in absolute value of the bias voltages VBB and VWB and thereby making greater the absolute values of the threshold voltages of these transistors.

At time T1, the normal mode is entered, returning from the data holding mode, so that power supply voltage VCC returns to the voltage level of 5 V, and data holding mode detection signal DRM is set to the inactive state of L-level. Thereby, bias voltage VBB rises to the voltage level of −3·Vthn again, and bias voltage VWB returns to the voltage level of power supply voltage VCC.

In the normal mode, absolute values of bias voltages VBB and VWB are made smaller to reduce in absolute value of the threshold voltages of MOS transistors, whereby it is possible to achieve operation characteristics which are required for the semiconductor memory device in the normal operation mode.

In the foregoing Japanese Patent Laying-open No. 6-28847, the bias voltages are increased in absolute value in the data holding mode, and thereby absolute values of the threshold voltages of MOS transistors are made greater for reducing the subthreshold currents. This prior art reference concerns with disadvantageous increase of the subthreshold current at the time of increase of an operation temperature, but does not concern with reduction of the threshold voltage of the MOS transistor for ensuring a high speed operation ability in a semiconductor memory device which operates with a low power supply voltage, e.g., of 2.0 V. Further, the structure shown in FIG. 34 suffers from a problem peculiar to the dynamic semiconductor memory device, because bias voltages VBB and VWB applied to the whole of the substrate regions, at which internal circuit LC is formed, change in the data holding mode.

FIG. 36 is a partial cross sectional view of the internal circuit shown in FIG. 34. In FIG. 36, the peripheral circuitry and the memory array are formed on a P-type semiconductor substrate 900. The peripheral circuitry is formed at an N-well 901 and a P-well 906 formed at the surface of semiconductor substrate 900. The memory array is formed on a P-well 920, which is formed at the surface of P-type semiconductor substrate 900 and is spaced from P-well 906. This structure is generally called a twin well structure.

N-well 901 receives bias voltage VWB via a heavily doped N-type impurity region (N+ region) 902. At the surface of N-well 901, there are formed heavily doped P-type impurity regions (P+ regions) 903 and 904, and there is also formed a gate electrode 905 which is located on a channel region between P+ regions 903 and 904 with a gate insulating film (not shown) therebetween. P+ impurity regions 903 and 904 and gate electrode 905 form a p-channel MOS transistor. P-well 906 which is electrically connected to P-type semiconductor substrate 900 may be eliminated.

At the surface of P-well 906, there are formed N+ regions 908 and 909 spaced from each other, and there is also formed a gate electrode 910 located on a channel region between N+ regions 908 and 909 with a not-shown gate insulating film therebetween. N+ regions 908 and 909 as well as gate electrode layer 910 form an n-channel MOS transistor. In FIG. 36, P+ region 903 receives power supply voltage VCC, and N+ region 908 receives a ground voltage VSS. P+ region 904 and N+ region 909 are mutually connected, and gate electrodes 905 and 910 are mutually connected. These structures implement a CMOS inverter which inverts an input signal IN and produces an output signal OUT.

In the memory array, P-well (or P-type semiconductor layer) 920 receives bias voltage VBB via a P+ region 921. At the surface of P-well 920, there are formed N+ regions 922 and 923 spaced from each other, and there is also formed a gate electrode layer 926 which is located on a channel region between N+ regions 922 and 923 with a not-shown gate insulating film therebetween. A conductive layer 924 is electrically connected to N+ region 923. A conductive layer 925 is formed on conductive layer 924 with a capacitor insulating film (not shown) therebetween. N+ region 922 is connected to a bit line BL, and a gate electrode layer 926 is connected to a word line WL. Conductive layer 925 receives a constant cell plate voltage VCP. In this memory array, N+ regions 922 and 923 and gate electrode 926 form an access transistor of a memory cell, and N+ region 923 and conductive layers 924 and 925 form a capacitor for data storage.

FIG. 37 is an electrically equivalent circuit diagram of the memory array shown in FIG. 36. In FIG. 37, the memory cell includes an n-channel MOS transistor MQ having a gate connected to word line WL as well as conductive nodes which are connected to bit line BL and a storage node SN, respectively, a capacitor Cg connected between storage node SN and a node for applying cell plate voltage VCP, and a capacitor Cj connected between storage node SN and a node for applying bias potential VBB. MOS transistor MQ corresponds to the structure including N+ regions 922 and 923 as well as gate electrode 926 in FIG. 36. Capacitor Cg corresponds to a capacitor formed of conductive layers 924 and 925. Capacitor Cj corresponds to a junction capacitance formed between N+ region 923 and P-well 920. Substrate bias voltage VBB is also applied to a back gate of an MOS transistor PH in a peripheral circuit. Transistor PH in the peripheral circuit corresponds to a transistor formed of N+ regions 908 and 909 as well as gate electrode 910 in FIG. 36. In the dynamic semiconductor memory device, storage node SN stores information in the form of electric charges.

In the data holding mode, the dynamic semiconductor memory device periodically performs refreshing of stored data. More specifically, word line WL is selected, and electric charges stored on storage node SN are read onto bit line BL via MOS transistor MQ. The bit line potential thus read is amplified by an unillustrated sense amplifier, and the bit line potential thus amplified is written to storage node SN. In the data holding mode, when substrate bias voltage VBB increases in absolute value, threshold voltage Vthn of MOS transistor MQ increases. In this case, if storage node SN has stored data at H-level, the read voltage read onto bit line BL decreases due to an influence by threshold voltage loss across MOS transistor MQ, and thus an operation margin of the sense amplifier (i.e., a voltage difference not impeding an accurate sensing) decreases. In this state, therefore, refreshing of the stored data may not be performed accurately.

At time T0 shown in FIG. 38A, the device operation mode shifts from the normal mode to the data holding mode. At this time, if substrate bias voltage VBB has a large absolute value, i.e., if the potential of the substrate lowers, the potential on storage node SN lowers due to capacitive coupling of capacitor Cj (MOS transistor MQ is off and storage node SN is floated). Therefore, if storage node SN has stored data at H-level, the quantity of positive charges thereat and therefore the potential level of H-level data lower, so that the read voltage on bit line BL shown in FIG. 38B lowers during refreshing. Therefore, the sensing margin (read operation margin) decreases similarly.

When the return is made from the data holding mode to the normal mode at time T1 in FIG. 38A, the absolute value of substrate bias voltage VBB decreases. Thus, the substrate bias voltage VBB changes in a positive direction. At this time, the potential on storage node SN rises due to the capacitive coupling of capacitor Cj. When storage node SN has stored data at L-level, the potential of L-level data rises. In this case, the read voltage of stored data of this memory cell decreases in the normal mode (see FIG. 38B), and the sensing margin of L-level data is reduced, resulting in a problem that data may not be read accurately in the normal mode.

The read voltage on bit line BL is normally precharged to an intermediate level equal to the voltage level of cell plate voltage VCP as shown in FIG. 38B. The bit line voltage at the time of reading H-level data is higher than this intermediate voltage, and the L-read voltage at the time of reading L-level data is equal to a difference between this intermediate voltage and the voltage appearing on bit line BL. As the potential of H-level data lowers, the H-read voltage decreases. When the potential of L-level data rises, the L-read voltage decreases. Particularly, when low power supply voltage VCC of 2.0 V is used, change in the read voltage exerts a large influence on operations. This is because the read voltage ΔV can be expressed by the following formula, and read voltage ΔV decreases in absolute value even in the accurate operation:

$$\Delta V = \pm(CS \cdot VCC/2)(1/(CS+CB))$$

where CS represents a capacitance of the capacitor (combination of parallel capacitors Cg and Cj) in the memory cell, and CB represents the bit line capacitance. The sign "±" represents the H- and L-read voltages.

SUMMARY OF THE INVENTION

An object of the invention is to provide a semiconductor memory device, in which current consumption is reduced without an influence on storage data while allowing use of a low power supply voltage.

Another object of the invention is to provide a dynamic semiconductor memory device with current consumption reduced in a data holding mode without adversely affecting storage data in a memory cell.

A memory device according to the invention includes a memory cell array including a plurality of memory cells, an array bias circuit for supplying a constant bias potential to a substrate region having the memory cell array formed thereat, a peripheral circuit for driving the memory cell array to a selected state, and a peripheral bias circuit for supplying a bias potential to a substrate region having the peripheral circuit formed thereat. The peripheral bias circuit includes a bias control circuit for setting the bias voltage supplied by the peripheral bias circuit during an active state of the data holding mode designating signal to an absolute value larger than that during an inactive state of the data holding mode designating signal.

In both of the normal mode and the data holding mode, a constant bias potential supplied to the memory cell array is fixed. During the data holding mode in which the data holding mode designating signal is active, the substrate region at which the peripheral circuit is formed is supplied with the bias voltage of an absolute value larger than that of the bias voltage supplied during the normal mode in which the data holding mode designating signal is inactive. Thereby, the absolute value of the threshold voltage of a transistor element increases owing to a back gate effect of the transistor element formed at this peripheral circuit, and the subthreshold current is suppressed. Meanwhile, the bias potential applied to the memory cell array region is constant. This suppresses change of the potential on the storage node of the memory cell capacitor, which may occur at the time of shift from the normal mode to the data holding mode and vice versa.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 5A shows structures of a refresh control circuit and a control signal generating circuit shown in FIG. 3;

FIG. 5B is a waveform diagram representing operations of the circuits shown in FIG. 5A;

FIG. 10 is a waveform diagram representing an operation of the circuit shown in FIG. 9 performed upon power-on;

FIG. 20A shows a specific structure of a select circuit shown in FIG. 9;

FIG. 20B is a waveform diagram representing an operation of the circuit shown in FIG. 20A;

FIG. 22 is a waveform diagram representing an operation of the circuit shown in FIG. 21 performed upon power-on;

FIG. 25 shows a specific structure of a repetitive signal generating circuit shown in FIG. 21;

FIG. 30A schematically shows a sectional structure of a CMOS transistor in the peripheral circuitry;

FIG. 30B shows a circuit electrically equivalent to the structure in FIG. 30A;

FIG. 37 shows a structure of a memory cell in a memory array included in the internal circuit shown in FIG. 34;

FIG. 38A is a waveform diagram representing an operation of the memory cell shown in FIG. 37; and FIG. 38B illustrates a problem of the memory cell in FIG. 37.

DESCRIPTION OF THE PREFERRED EMBODIMENTS

[Description of Basic Operation]

Figure 1:
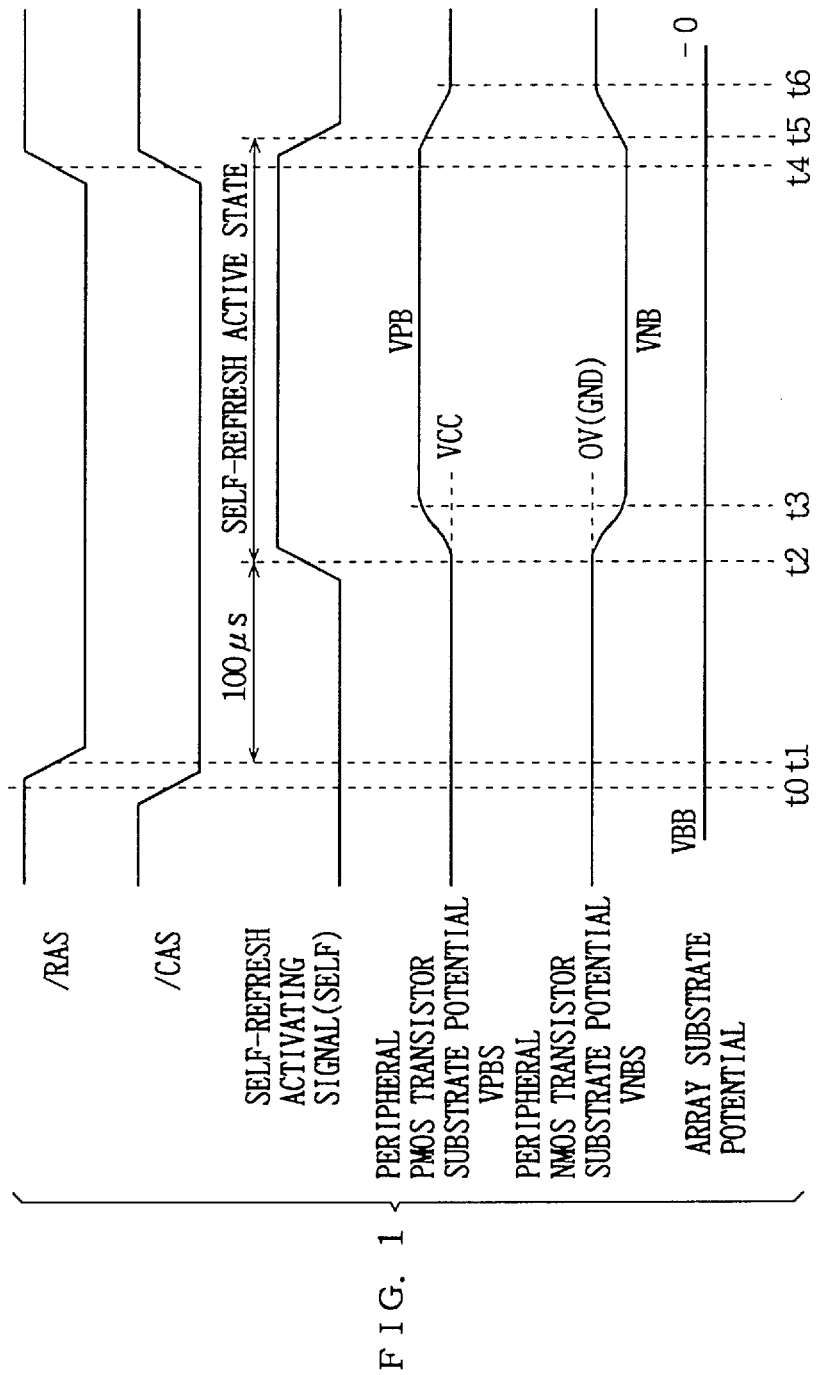
FIG. 1 is a waveform diagram representing a basic operation of a semiconductor memory device according to the invention.

FIG. 1 is a timing diagram representing a basic operation of a semiconductor memory device according to an embodiment of the invention. In the following description, a DRAM is described as an example of a semiconductor memory device, but the present invention can be applied to various kinds of semiconductor memory devices operable in a data holding mode.

At time t0 in FIG. 1, a row address strobe signal /RAS is at H-level, and column address strobe signal /CAS falls to L-level. At time t1 after about 10 ns (nanoseconds) from t0, row address strobe signal /RAS falls, and /CAS-before-/RAS (CBR) refresh mode is set. When this CBR refresh mode is set, refreshing of memory cell data is internally performed in response to falling of row address strobe signal /RAS.

When row address strobe signal /RAS and column address strobe signal /CAS are both held at L-level for 100 μs (microseconds), a self-refresh activating signal (SELF) is activated at time t2, so that the semiconductor memory device enters the self-refresh mode, i.e., data holding mode. Before time t2, a substrate potential of a p-channel MOS (PMOS) transistor in a peripheral circuit is held at a level of power supply voltage VCC which is one of the operation power source voltages, and a substrate potential of an n-channel MOS (NMOS) transistor in the peripheral circuit is held at a ground potential (GND) level of 0 V which is the other power source voltage level. A potential VBB of an array substrate region at which a memory cell is formed is held at a predetermined negative potential level.

At time t2, self-refresh activating signal (SELF) is activated, so that substrate potentials of PMOS and NMOS transistors in the peripheral circuit change. At time t3 after tens or hundreds of nanoseconds from time t2, the substrate potential of PMOS transistor changes from power supply potential VCC to a higher potential VPB and is stabilized, and the substrate potential of the peripheral NMOS transistor completes the change from ground potential of 0 V to a negative potential VNB and is stabilized. Thereby, the substrate potentials of PMOS and NMOS transistors in the peripheral circuit increase in absolute value, and the absolute values of threshold voltages thereof rise. Thereby, a subthreshold current at the peripheral circuit is suppressed, which allows a low-power operation. The potential of the array substrate at which the memory cell is formed is held at constant bias voltage VBB even in this self-refresh mode. Therefore, the storage node of the memory cell does not change in potential, and stably holds the potential corresponding to the stored electric charges.

In this self-refresh mode, refreshing is executed at predetermined periods.

At time t4, row address strobe signal /RAS rises. At time t5 after several tens or hundreds of nanoseconds from time t4, the self-refresh activating signal (SELF) is deactivated, and the shift is made from the self-refresh mode to the normal mode. A certain time period is provided between times t4 and t5 for the following reason. When row address strobe signal /RAS rises to H-level at time t4, there is a possibility that the refreshing is internally being performed, and this refreshing must be surely completed. The time period between times t4 and t5 is provided for completing this refreshing, and is set to a value (hundreds of nanoseconds) equal to one operation cycle of refreshing at the maximum.

At time t5, self-refreshing activating signal (SELF) is deactivated. Thereby, the substrate potentials of peripheral circuit change, so that the substrate potential of the peripheral PMOS (p-channel MOS) transistor starts to lower, and the substrate potential of the peripheral NMOS (n-channel MOS) transistor starts to rise.

At time t6 after several tens or hundreds of nanoseconds from time t5, the substrate potential of the peripheral PMOS transistor changes from potential VPB to power supply potential VCC and is stabilized. Also, the substrate potential of the peripheral NMOS transistor completes the change from potential VNB to the ground potential of 0 V. Thereby, the threshold voltage of transistor in the peripheral circuit is reduced in absolute value, which allows fast operation. The potential of memory cell array substrate does not change, and maintains constant bias voltage VBB.

The power supply voltage of DRAMs which are now generally used is 3.3 V, and magnitudes of threshold voltages VTN and VTP of the NMOS and PMOS transistors used therein satisfy the relationship of VTN=|VTP|=0.7 V. A power supply voltage of about 2.0 V is required in devices such as portable equipment requiring reduction in power dissipation. Assuming that the power supply voltage is 2.0 V, it is desirable that the absolute value of threshold voltage is lowered to about 0.42 (=0.7·2.0/3.3) in proportion to lowering of the power supply voltage from the viewpoint of appropriately ensuring an operation speed of DRAM as well as operation stability against variation in the threshold voltage which may be caused by variation in manufacturing parameters. From an experiment with a 16M-DRAM, it is found that an operation speed of an MOS transistor of VTN=|VTP|=0.7 V decreases about 1.5 times when the power supply voltage lowers from 3.3 V to 2.0 V. The reason for this is as follows. The ratio of the threshold voltage to the power supply voltage becomes large, and the timing of start of signal change is relatively delayed when charging/discharging of the MOS transistor starts, even if the signal amplitude is small. Further, when MOS transistor operates in a saturation region, the drain current is proportional to the square of the difference between the gate-to-source voltage and the absolute value of threshold voltage, so that the charge/discharge current is small, and thus the signal cannot be changed rapidly. These are the reasons for the foregoing speed decrease.

According to the experiment with the 16M-DRAM, the following is also found. In the DRAM which uses an MOS transistor having a threshold voltage of 0.7 V in absolute value, the power supply current of about 10 $\mu$A flows during standby (inactive state of chip) when the power supply voltage is 3.3 V. Meanwhile, if the absolute value of threshold voltage is lowered 0.4 V, the power supply current during standby increases to about 500 $\mu$A even when the power supply voltage is 2 V. In an actual operation, the chip of DRAM is held at the standby state in such a manner that the DRAM is set to the self-refresh mode, i.e., data holding mode, and memory cell data is periodically and internally refreshed. When the refreshing is performed, therefore, the refresh current of about 50 $\mu$A is consumed during refreshing in addition to the power supply current consumed for standby. Generally, according to specifications of the portable equipments, the standby current consumed during the self-refreshing in the data holding mode is generally required to be about 100 $\mu$A or less.

In the normal mode (during operation other than the self-refresh active state), therefore, a shallow substrate bias is set for the MOS transistors in the peripheral circuit, the absolute values of threshold voltages of these peripheral MOS transistors are set to about 0.4 V, as shown in FIG. 1. When the DRAM enters the self-refresh mode, i.e., data holding mode, the absolute value of substrate potential is made large, and the threshold voltage of peripheral MOS transistors is increased in absolute value to about 0.7 V. During the normal operation (i.e., access operation for externally reading and writing data), the DRAM must perform such a high speed operation that a delay time per logic gate is about 500 ps (picosecond) to 1 ns in order to achieve a fast access. This satisfies the requirement that the absolute value of threshold voltage of MOS transistors in the peripheral circuit is made small and the fast operation is performed. Meanwhile, in the self-refresh mode that external access is not made and only data holding operation is performed, the internal refresh cycle is about a hundred and tens of microseconds, and thus is about one thousand times longer than the cycle time (i.e., time required for one access operation) in the normal operation. Therefore, no problem arises and internal refreshing of memory cell data is surely conducted, even when the absolute value of threshold voltage of the MOS transistor in the peripheral circuit is large and thereby the delay time of the circuit increases about 1.5 times. Most of the refresh current is consumed for charging/discharging of bit lines, and the requirements for the power supply current in the holding mode can be fully satisfied because of 50 $\mu$A+10 $\mu$A<100 $\mu$A.

In the normal operation, input/output of data is performed, and the power supply current of about 50 to about 100 $\mu$A flows. Even when the absolute value of threshold voltage of the peripheral MOS transistor is lowered, the power supply current increases only about several milliamperes, and this increase of power supply current caused by reduction in absolute value of the threshold voltage exerts only an extremely slight influence on the power supply current during operation.

As shown in FIG. 1, a time is required for change (stabilization) of the substrate potential of the MOS transistor in the peripheral circuit for the following reasons. The peripheral substrate region of the peripheral circuit (i.e., region (well or semiconductor layer) at which the MOS transistor is formed in the peripheral circuit) forms a back gate electrode of the MOS transistor, and therefore a relatively large parasitic capacitance (PN junction capacitance) exists at the substrate region. Therefore, tens to hundreds of nanoseconds are required for changing the substrate potential, but no practical problem arises even if a long time is required for change from the normal operation mode to the self-refresh mode and vice versa. Thus, the time required for change of the back gate voltage (substrate potential) does not cause a problem. When the mode changes from the normal operation mode to the self-refresh mode, it is required only to perform refreshing after the substrate potential is stabilized. For the mode change from the self-refresh mode to the normal mode, it is required only to define in the specifications that an access should be made after the substrate potential is stabilized and an access is made according to the conditions defined in the specifications.

As shown in FIG. 1, therefore, the absolute value of back gate voltage of the peripheral MOS transistor and hence the absolute value of threshold voltage thereof are made large in the self-refresh mode, i.e., data holding mode. Meanwhile, the absolute value of back gate voltage (substrate potential) of MOS transistor in the peripheral circuit and hence the threshold voltage thereof are made small in the normal operation mode. Thereby, it is possible to achieve an operation speed similar to that of the DRAM using the power supply voltage of 3.3 V as well as a smaller power consumption during standby. Since the substrate potential of memory cell array is fixed, the potential on storage node of memory cell does not change, and thus the read voltage is not suffered disadvantageously, so that the refreshing can be performed accurately to hold data.

[Relationship Between Threshold Voltage And Back Gate Voltage]

Figure 2:
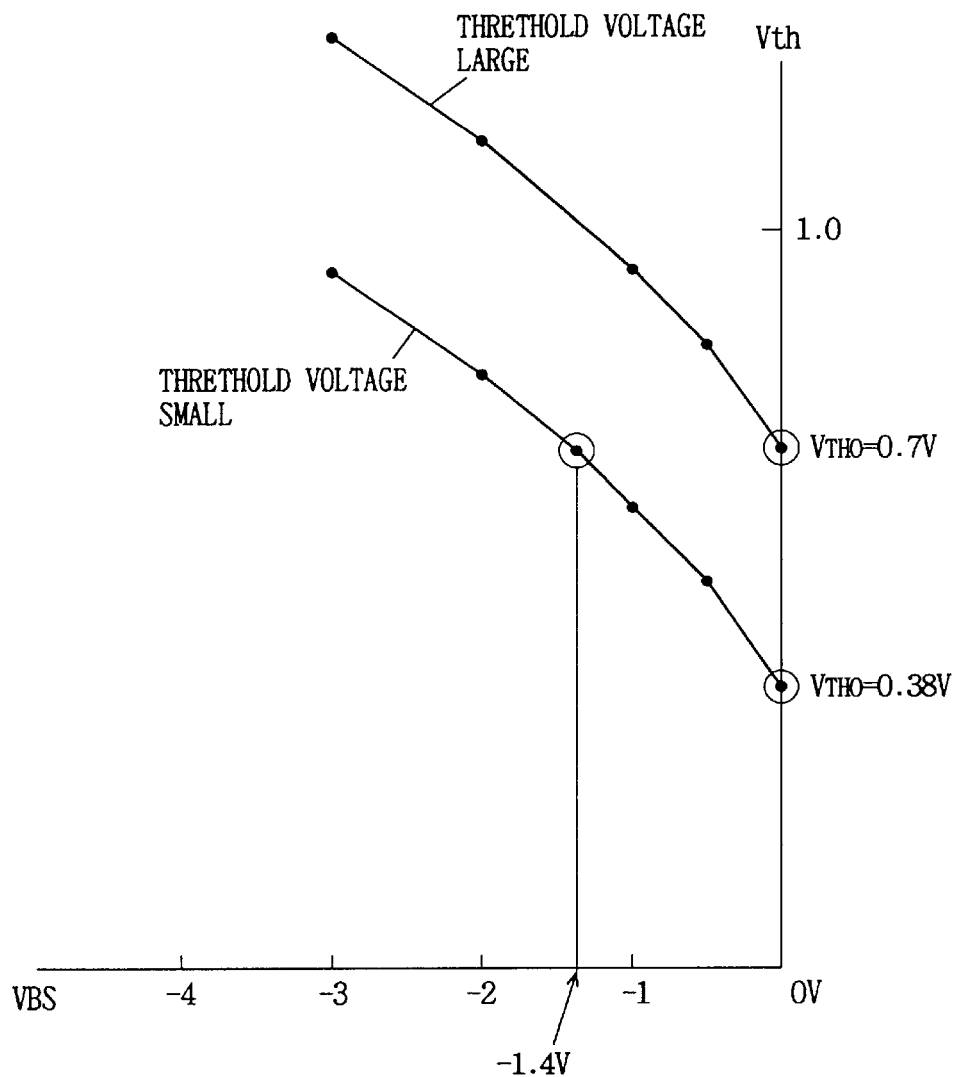
FIG. 2 shows an operation principle of the invention.

FIG. 2 schematically shows change of threshold voltage Vth of the NMOS transistor as a function of a potential difference VBS between the back gate and the source. Threshold voltage Vth of NMOS transistor can be expressed by the following formula (1).

$$Vth = VTH0 + |K|[(|2 \cdot \phi F| + |VBS|)^{1/2} - (|2 \cdot \phi F|)^{1/2}] \quad (1)$$

In formula (1), VBS represents a back gate potential with reference to the source potential, K represents a substrate effect constant, $\phi$F represents a substrate surface potential, and VTH0 represents a threshold voltage in a case where VBS is 0 V. In the NMOS transistor, as is apparent from the graph of FIG. 2, threshold voltage Vth increases in accordance with increase of back gate voltage VBS in a negative direction. It is now assumed that two kinds of MOS transistors, of which threshold voltages VTH0 are 0.7 V and 0.38 V when VBS is 0 V, respectively, are prepared, for example, by controlling an ion implantation dose in the gate regions (channel regions) of the NMOS transistors, and that back gate voltage VBS of 0 V is set in the NMOS transistor having threshold voltage VTH0 of 0.7 V, and the NMOS transistor having threshold voltage VTH0 of 0.38 V is supplied on its back gate with a voltage of 0 V or −1.4 V. The threshold voltage Vth of the NMOS transistor having threshold voltage VTH0 of 0.7 V is always fixed at 0.7 V, because its back gate voltage VBS is 0 V. The threshold voltage Vth of the NMOS transistor having threshold voltage VTH0 of 0.38 V is 0.38 V when back gate voltage VBS is 0 V, and is about 0.7 V when back gate voltage is −1.4 V.

Therefore, back gate voltage VBS of the NMOS transistor in the peripheral circuit determining the operation speed of DRAM is set to 0 V in the normal operation, and is set to −1.4 V during standby (data holding mode and hence self-refresh mode), whereby fast operation in the normal operation mode and low-power supply voltage operation during standby can be achieved.

In the DRAM, the operation speed is mainly determined by the peripheral circuit. The relationship between the back gate voltage and the threshold voltage of the NMOS transistor is established also in the PMOS transistor. In the PMOS transistor, if the back gate voltage increases in a positive direction, its threshold voltage decreases (increases in a negative direction). Therefore, by setting the back gate voltages, i.e., substrate bias voltages of the PMOS and NMOS transistors which are components of the peripheral circuit such that the absolute values thereof in the normal operation are larger than those in the data holding mode, it is possible to increase the operation speed in the normal operation and reduce the power consumption in the data holding mode.

[Setting of Self-Refresh Mode]

As already described, the self-refresh mode is used for data holding. As will be described below, the self-refresh mode can be effectively used as measures for minimizing the power which is consumed when only the information holding operation is performed. The self-refresh mode is set by the CBR condition. The row address strobe signal designates the memory cell select operation of DRAM, and also determines a period for which the DRAM inner circuitry is selected. Column address strobe signal /CAS determines a timing for taking in the column address signal of the DRAM and a timing for controlling the column select operation, and is further used as a signal determining timings for writing and reading external data in the normal operation mode (normal mode).

In the self-refresh mode, an address counter internally provided in the DRAM produces a refresh address (i.e., address designating a row to be refreshed), and a timer internally provided in the DRAM provides a refresh timing (i.e., timing for refreshing memory cell data). Therefore, it is not necessary to generate periodically a pulse signal for defining the refresh timing, e.g., from an external DRAM controller. Accordingly, a power is not consumed at an external refresh control circuit such as a DRAM controller, and the power consumption of the whole system can be reduced. In the CBR refresh mode, refreshing is executed in response to a refresh request signal from the internal timer. As long as row address strobe signal /RAS is set at L-level, refreshing is repeated at a constant cycle, e.g., of 125 μs.

[Whole Structure]

Figure 3:
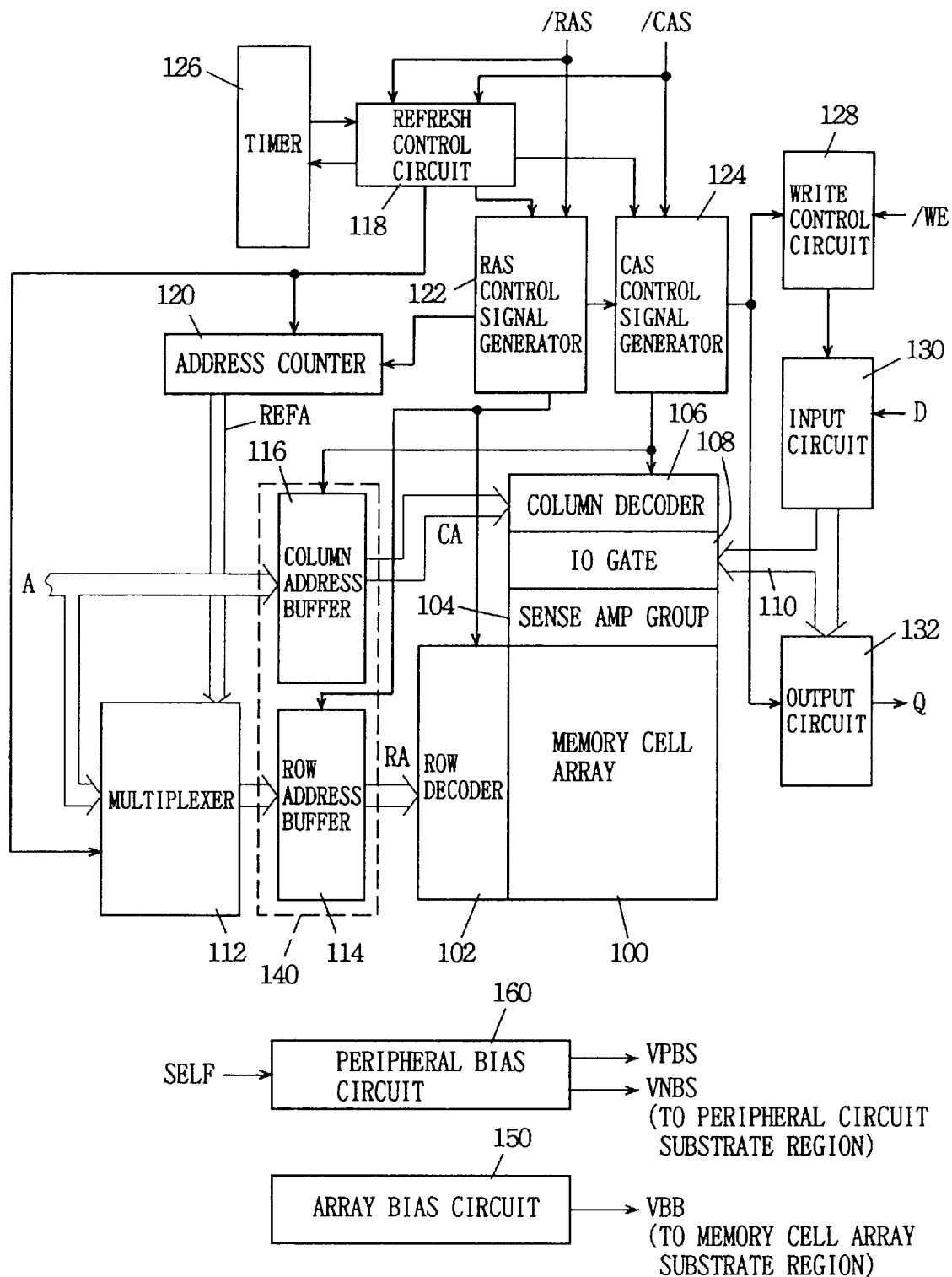
FIG. 3 schematically shows a whole structure of the semiconductor memory device according to the invention.

FIG. 3 schematically shows a whole structure of a DRAM according to the invention. In FIG. 3, the DRAM includes a memory cell array 100 having dynamic memory cells arranged in a matrix of rows and columns, a row decoder 102 which decodes an internal row address signal RA to select a corresponding row in memory cell array 100, a sense amplifier group 104 which senses and amplifies data of memory cells connected to the selected row in memory cell array 100, a column decoder 106 which decodes an applied internal column address signal CA to generate a column select signal selecting a corresponding column in memory cell array 100, and an I/O gate 108 which connects the selected column in memory cell array 100 to an internal data line 110 in response to the column select signal from column decoder 106.

Sense amplifier group 104 includes sense amplifiers provided corresponding to the respective columns in memory cell array 100. Each column in memory cell array 100 is generally formed of a pair of bit lines, and each sense amplifier differentially amplifies the potentials on the corresponding bit line pair.

The DRAM further includes a multiplexer 112 which allows passage of one of externally applied address signal A and refresh address REFA from address counter 120, a row address buffer 114 which receives a signal from multiplexer 112 and produces internal row address signal RA, a column address buffer 116 which receives externally applied address signal A and produces internal column address signal CA, a refresh control circuit 118 which receives externally applied row address strobe signal /RAS and column address strobe signal /CAS, and generates various control signals required for refreshing when the refresh mode is designated, an RAS control signal generating circuit 122 which is responsive to row address strobe signal /RAS and the control signal from refresh control circuit 118 to generate signals for controlling circuits related to signal RAS, and a CAS control signal generating circuit 124 which is responsive to column address strobe signal /CAS and the control signals from RAS control signal generating circuit 122 and refresh control circuit 118 to generate signals for controlling circuits related to signal CAS.

The control signals from RAS control signal generating circuit 122 are applied to row decoder 102 and row address buffer 114 for determining their operation timings, and also determines the operation timing of sense amplifier group 104 through a not shown path. Circuits related to signal RAS include the circuits (row address buffer 114 and row decoder 102) related to row selection as well as the circuit (sense amplifier group 104) related to sensing operation.

The control signals from CAS control signal generating circuit 124 determine the operation timings of column decoder 106 and column address buffer 116, and also determine the timings of external writing and reading. In the normal operation, CAS control signal generating circuit 124 is made active, when RAS control signal generating circuit 122 activates internal RAS signal, and the DRAM is active and the row select operation is performed.

The DRAM further includes a timer 126 which is activated in response to the refresh instruction from refresh control circuit 118 and generates (activates) the refresh request signal at predetermined intervals, an address counter 120 which executes the count operation under the control of refresh control circuit 118, a write control circuit 128 which is responsive to the control signal from CAS control signal control circuit 124 and an externally applied write enable signal /WE to generate an internal write signal determining the data write timing, an input circuit 130 which is responsive to the internal write signal from write control circuit 128 to produce internal write data from externally applied write data D and transmit the same to the selected memory cell in memory cell array 100, and an output circuit 130 which is responsive to the control signal from CAS control signal generating circuit 124 to produce external read data Q from data of the selected memory cell in memory cell array 100.

Write control circuit 128 produces the internal write signal in accordance with later one of the fall timings of column address strobe signal /CAS and write enable signal /WE. The output circuit 132 is activated in response to falling of column address strobe signal /CAS.

In FIG. 3, an address buffer 140 includes row address buffer 114 and column address buffer 116, of which address take-in timings are determined by the control signals from RAS and CAS control signal generating circuits 122 and 124, respectively. As for external address signal A, row and column address signals may be applied in a multiplexed form or may be in a nonmultiplexed form. Input circuit 130 and output circuit 132 may perform input/output of data via different pin terminals, respectively, or may perform the input/output via a common pin terminal.

The DRAM further includes an array bias circuit 150 which always produces a constant substrate bias potential VBB and applies the same to the substrate region at which memory cell array 100 is formed, and a peripheral bias circuit 160 which applies bias potentials VPBS and VNBS to the substrate region at which the peripheral circuit is formed. The peripheral bias circuit 160 increases in absolute value the bias potentials VPBS and VNBS above those in the normal operation mode, when self-refresh activating signal SELF is active. Operation of the DRAM shown in FIG. 3 will be briefly described below.

In the normal operation of reading and writing data, peripheral bias circuit 160 produces bias voltage VPBS and VNBS, which are at power supply voltage VCC level and ground voltage VSS level, respectively, and applies the same to the peripheral circuit substrate region. As will be described later, the peripheral circuitry include a bit line equalize/precharge circuit as well as the sense amplifiers, row decoder, and column decoder. Array bias circuit 150 always produces and applies a constant bias potential (negative potential) to the substrate region of memory cell array 100. Multiplexer 112 applies external address signal A to row address buffer 114. When row address strobe signal /RAS falls to L-level, the DRAM is activated and a memory cell cycle is started. RAS control signal generating circuit 122 generates and applies the internal control signal to row address buffer 114 in response to the falling of signal /RAS.

Row address buffer 114 responds to the control signal thus applied and produces internal row address signal RA from address signal A received via multiplexer 112 for applying the same to row decoder 102. Row decoder 102 responds to the control signal from RAS control signal generating circuit 122 and decodes internal row address signal RA to select a corresponding row in memory cell array 100. Then, sense amplifier group 104 is activated in response to an unillustrated control signal from RAS control signal generating circuit 122, so that it amplifies and latches data of memory cells connected to the selected row.

When column address strobe signal /CAS falls to L-level, column address buffer 116 takes in external address signal A and produces internal column address signal CA under the control of CAS control signal generating circuit 124. Column address strobe signal /CAS falls after elapsing of a predetermined time (RAS-CAS delay time) since falling of signal /RAS, if the row and column address signals are applied in a time division multiplexed form. If the row and column address signals are applied simultaneously, column address strobe signal /CAS falls to L-level at the substantially same timing as row address strobe signal /RAS.

Then, column decoder 106 is activated under the control of the CAS control signal generating circuit, so that it decodes internal column address signal CA and generates the column select signal selecting the corresponding column in memory cell array 100. In response to this column select signal, I/O gate 108 connects the selected column in memory cell array 100 to internal data line 110.

In the data write operation, write enable signal /WE is at the active state of L-level, and write control circuit 128 generates the internal write signal when both signals /CAS and /WE attain L-level. Input circuit 130 produces internal write data from external write data D in accordance with the internal write signal from write control circuit 128. Thereby, data is written into the memory cell arranged corresponding to a crossing of the column and row which are selected by column and row decoders 106 and 102, respectively.

In the data read operation, output circuit 132 is controlled by CAS control signal generating circuit 124 to produce external read data Q from data read onto internal data line 110 and output the same.

Bias potentials VPBS and VNBS applied from peripheral bias circuit 160 are small in absolute value, and the threshold voltage of the MOS transistor which is a component of the peripheral circuit is set to about 0.4 V. Thereby, write/read of data can be performed at high speed.

In the self-refresh operation mode, refresh control circuit 118 is activated. When refresh control circuit 118 detects that the self-refresh mode is designated in accordance with combination of the states of signals /RAS and /CAS (CBR condition), it applies a switch signal to multiplexer 112, and enables address counter 120. In the normal operation mode, address counter 120 is set to such a state that it latches its count. Peripheral bias circuit 160 increases in absolute value of the substrate bias potentials VPBS and VNBS in accordance with activation of self-refresh activating signal SELF from refresh control circuit 118. The potential level of substrate bias potential VBB applied from array bias circuit 150 is kept constant. Thereby, the threshold voltage of MOS transistor which is a component of the peripheral circuit increases in absolute value to 0.7 V.

Refresh control circuit 118 activates timer 126, and also applies the control signal to RAS control signal generating circuit 122 to active RAS control signal generating circuit 122. In response to this, RAS control signal generating circuit 122 generates the control signals, and row address buffer 114 produces internal row address signal RA from refresh address REFA, which is supplied from address counter 120 Via multiplexer 112, and applies the same to row decoder 102. Row decoder 102 decodes internal row address signal RA produced from refresh address REFA and selects the corresponding row in memory cell array 100. Sense amplifier group 104 is activated under the control of RAS control signal generating circuit 122, and operates to sense, amplify and latch data of memory cells connected to the selected row.

CAS control signal generating circuit 124 is disabled of operation under the control of refresh control circuit 118 while signal /RAS is at L-level. Thereby, column address buffer 116, column decoder 106, write control circuit 128 and output circuit 132 are disabled of operation. The internal control signal from RAS control signal generating circuit 122 is maintained only for a predetermined period under the control of refresh control circuit 118. All the control signals from RAS control signal generating circuit 122 are deactivated upon expiration of this refresh period. During this refresh period, data of the memory cells, which has been sensed, amplified and latched by sense amplifier group 104, are written into original memory cells, so that refreshing of storage data is completed, and the DRAM returns to the precharge state.

Subsequently, timer 126 detects elapsing of a predetermined time period, and applies the refresh request signal to refresh control circuit 118. Refresh control circuit 118 activates RAS control signal generating circuit 122 again in response to this refresh request signal. Address counter 120 has already incremented (or decremented) its count by one in accordance with the count signal which was applied from RAS control signal generating circuit 122 upon completion of the last refreshing. In this refresh cycle, therefore, refresh address REFA from address counter 120 designates the next row. In accordance with refresh address REFA, row selection and restoring (refreshing) of data in the memory cells are executed. Thereafter, the above refresh operation is executed at predetermined time periods while signals /RAS and /CAS are at L-level.

When signal /RAS rises to H-level, refresh control circuit 118 resets timer 126, and sets multiplexer 112 to the state for selecting external address signal A. Further, refresh control circuit 118 changes its count by one and subsequently sets address counter 120 to the latch state, when the last refresh operation is completed. Refresh control circuit 118 is released from its refresh control operation when signal /RAS rises to H-level.

In the self-refresh mode, data of memory cells are internally and automatically refreshed. During this operation, bias potentials VPBS and VNBS of peripheral bias circuit 160 are set to large absolute values, and the subthreshold current of the peripheral circuit is reduced. Bias potential VBB of array bias circuit 150 is at the same level as that in the normal operation mode. In the refresh operation, therefore, refreshing can be surely performed while reducing a standby current (power supply current during standby) in the self-refresh mode and preventing reduction of the read voltage margin for data in the memory cells.

[Application Form of Substrate Bias]

Figure 4:
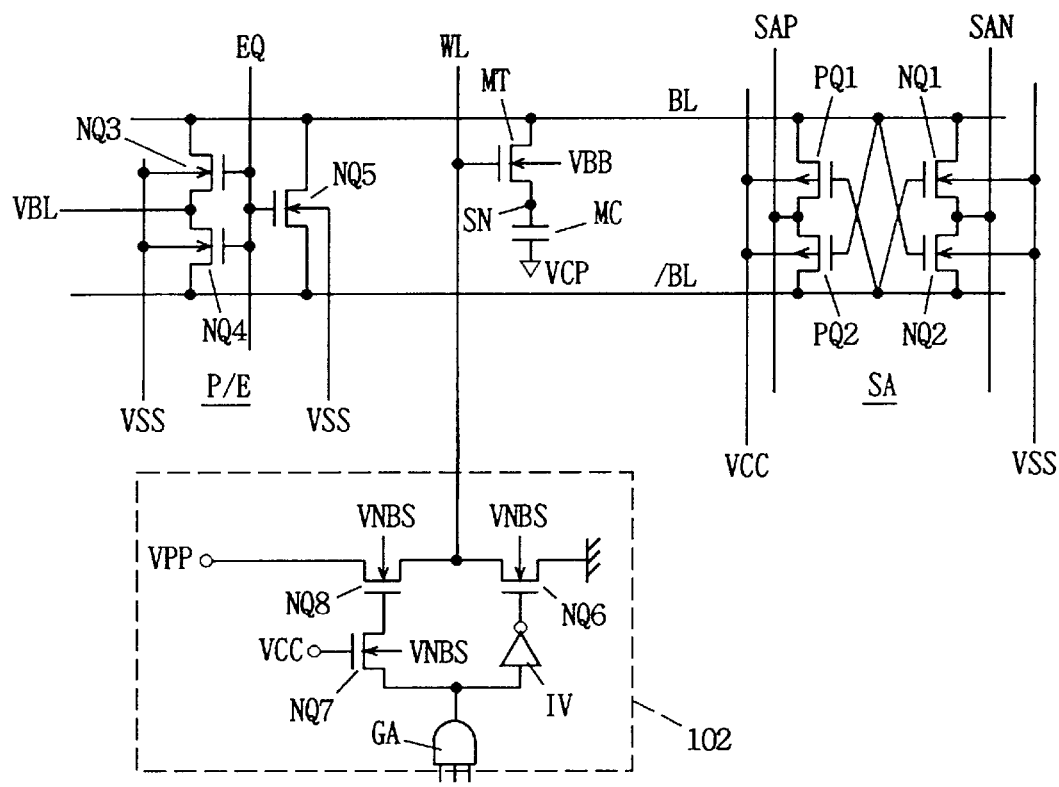
FIG. 4 shows structures of an array and peripheral circuitry of the semiconductor memory device according to the invention.

FIG. 4 shows a form of application of the substrate bias potentials in the DRAM according to the invention. More specifically, FIG. 4 shows a structure of a portion related to a pair of bit lines BL and /BL as well as one word line WL. For bit line pair BL and /BL, there are provided a precharge/equalize circuit P/E for equalizing and precharging the potentials on these bit lines BL and /BL to an intermediate potential VBL (=VCC/2), and a sense amplifier SA for complementarily amplifying the potentials on bit lines BL and /BL. For word line WL, there is provided row decoder 102.

Sense amplifier SA includes a p-channel MOS transistor PQ1 which has a conduction terminal connected to bit line BL, a gate connected to bit line /BL and another conduction terminal receiving sense amplifier activating signal SAP, a p-channel MOS transistor PQ2 which has a conduction terminal connected to bit line /BL, a gate connected to bit line BL and another conduction terminal receiving sense amplifier activating signal SAP, an n-channel MOS transistor NQ1 which has a conduction terminal connected to bit line BL, a gate connected to bit line /BL and another conduction terminal receiving sense amplifier activating signal SAN, and an n-channel MOS transistor NQ2 which has a conduction terminal connected to bit line /BL, a gate connected to bit line BL and another conduction terminal receiving sense amplifier activating signal SAN. MOS transistors PQ1 and PQ2 are supplied on their substrate regions (back gates) with power supply voltage VCC. MOS transistors NQ1 and NQ2 are supplied on their back gates with ground voltage VSS. During standby, sense amplifier activating signals SAP and SAN are held at the intermediate potential level (=VCC/2).

Precharge/equalize circuit P/E includes n-channel MOS transistors NQ3 and NQ4 which are turned on to transmit intermediate potential VBL (=VCC/2) to bit lines BL and /BL respectively in response to activation of equalize instruction signal EQ, and an n-channel MOS transistor NQ5 which is turned on to electrically short-circuit bit lines BL and /BL in response to activation of equalize instruction signal EQ. These MOS transistors NQ3, NQ4 and NQ5 are supplied on their back gates with ground voltage VSS, and their threshold voltages are fixed.

The memory cell includes a capacitor MC which has an electrode connected to storage node SN and another electrode receiving cell plate potential VCP (=VCC/2), and an n-channel MOS transistor MT which has a gate electrode connected to word line WL, one conduction node connected to bit line BL and another conduction node connected to storage node SN. MOS transistor MT is supplied on its back gate with bias potential VBB.

Row decoder 102 includes an AND decoder circuit GA which decodes the internal row address signal, an n-channel MOS transistor NQ8 which is turned on to transmit a boosted voltage VPP to word line WL when the output signal of AND decode circuit GA is at H-level, and an n-channel MOS transistor NQ6 which is turned on to discharge word line WL to the ground potential level when the output signal of decode circuit GA is at L-level. An n-channel MOS transistor NQ7 receiving power supply voltage VCC on its gate is arranged between the gate of MOS transistor NQ8 and decode circuit GA. MOS transistors NQ6–NQ8 receive bias potential VNBS on their back gates. Boosted voltage VPP has a potential level higher than that of the power supply voltage, and eliminates an influence of the threshold voltage loss at memory transistor MT.

During standby, equalize instruction signal EQ is set to H-level. When power supply voltage VCC is 2.0 V, equalize instruction signal EQ is also 2.0 V. Even when threshold voltages of MOS transistors NQ3–NQ5 are fixed at 0.4 V, the potentials of bit lines BL and /BL are equal to intermediate potential VBL or 1.0 V, and a current does not flow through MOS transistors NQ3–NQ5 after equalization of the bit line potentials. Also in sense amplifier SA on standby, sense amplifier activating signals SAP and SAN are at the intermediate potential level which is equal to the precharge potential of bit lines BL and /BL, and a current does not flow through MOS transistors PQ1, PQ2, NQ1 and NQ2. Therefore, a leak current does not flow in MOS transistors NQ1, NQ2, PQ1 and PQ2 even when their substrate bias potentials are fixed. This ensures high speed operation through reduction of the threshold voltage.

In the memory cell, the back gate of MOS transistor MT is at constant potential VBB, and its threshold voltage does not change and is held at about 0.7 V in the normal operation mode and data holding mode (self-refresh mode). This threshold voltage is particularly set to a large value in order to avoid outflow of storage charges which may be caused by a leak current between storage node SN and bit line BL (/BL).

Also in row decoder 102, the threshold voltages of MOS transistors NQ6–NQ8 are set to a large value in the self-refresh mode in order to suppress a leak current from boosted voltage VPP to ground voltage VSS during standby. Therefore, a charging/discharging speed of word line WL decreases to a slight extent. When the output signal of gate circuit GA is at H-level, its potential level decreases due to an influence of the threshold voltage of MOS transistor NQ7. However, when word line WL is driven, the gate potential of MOS transistor NQ8 rises owing to the self-bootstrap function of MOS transistor NQ8, so that MOS transistor NQ8 is reliably turned on without being affected by increase of the threshold voltage of MOS transistor NQ7.

In decode circuit GA, the p-channel MOS transistor receives bias potential VPBS on its back gate, and n-channel MOS transistor receives bias potential VNBS. This merely results in that the speed of row selecting operation is reduced in the self refresh mode. Increase of the subthreshold current can be reliably suppressed during standby.

This peripheral circuit includes a circuit for driving the memory cell array to the selected state, and further includes I/O gate 108, column decoder 106, address buffer 140, RAS control signal generating circuit 122, CAS control signal generating circuit 124, write control circuit 128, input circuit 130, output circuit 132 and refresh control circuit 118 shown in FIG. 3. However, it does not include sense amplifier SA and bit line equalize circuit P/E.

[Structure of Refresh Control Circuit]

FIG. 5A shows an example of the structures of refresh control circuit 118, RAS control signal generating circuit 122 and CAS control signal generating circuit 124 shown in FIG. 3. In FIG. 5A, refresh control circuit 118 includes a CBR detecting circuit 1 which is responsive to signals /RAS and /CAS to generate internal refresh instruction signal CBR indicating whether the self-refresh mode is designated or not, a set/reset flip-flop (hereinafter simply referred to as an "RS flip-flop)) which is set in response to signal CBR from CBR detecting circuit 1 and is reset in response to rising of signal /RAS, a pulse generating circuit 3 which is activated by output Q of RS flip-flop 2 and produces a pulse of one shot in response to signal /RAS, an OR circuit 4 which receives a refresh request signal (φREF from timer 126 and the output pulse signal of pulse generating circuit 3, a one-shot pulse generating circuit 5 which is responsive to the output signal of OR circuit 4 to produce a pulse signal PU of one shot, and an SELF generating circuit 6 which is responsive to internal refresh instruction signal CBR and row address strobe signal /RAS to produce self-refresh activating signal SELF.

SELF generating circuit 6 sets the self-refresh activating signal SELF to the active state of H-level, when a predetermined time elapses after row address strobe signal /RAS attains L-level subsequently to setting of internal refresh instruction signal CBR to the active state of H-level. Self-refresh activating signal SELF is set to the inactive state of L-level in response to rising of row address strobe signal /RAS.

CBR detecting circuit 1 includes an inverter circuit 12 which inverts column address strobe signal /CAS, and an AND circuit 14 which receives the output signal of inverter circuit 12 and row address strobe signal /RAS. AND circuit 14 generates a signal at H-level when both of its inputs attain H-level. RS flip-flop 2 is set to generate the signal at H-level from its output Q in response to rising of internal refresh instruction signal CBR to H-level, and is reset to set its output Q to L-level in response to rising of signal /RAS to H-level. The signal from output /Q of RS flip-flop 2 is used as a select operation control signal for multiplexer 112.

OR circuit 4 generates a signal at H-level when at least one of its inputs attains H-level. One-shot pulse generating circuit 5 generates a pulse signal PU of a predetermined time width (usually, a time width containing a time period from start of the row selection to completion of the sensing and latching operations) in response to rising of the output signal of OR circuit 4.

RAS control signal generating circuit 122 includes a NOR circuit 20 which receives row address strobe signal /RAS and the signal from output Q of RS flip-flop 2, an OR circuit 22 which receives the output signals of NOR circuit 20 and one-shot pulse generating circuit 5, and an RAS-related control circuit 24 which generates a signal controlling circuits related to signal RAS in response to the output signal of OR circuit 22. NOR circuit 20 generates a signal at L-level when at least one of its inputs attains H-level.

CAS control signal generating circuit 124 includes an RS flip-flop 32 which is set in response to activation of internal refresh instruction signal CBR and is reset in response to rising of column address strobe signal /CAS, a 3-input NOR circuit 34 which receives a signal CCE from output Q of RS flip-flop 32 as well as row address strobe signal /RAS and column address strobe signal /CAS, and a CAS-related control circuit 30 which is responsive to the output signal of NOR circuit 34 to generate a signal for controlling circuits related to signal CAS. Now, operation of the circuits in FIG. 5A related to self-refresh control will be described below with reference to FIG. 5B showing an operation waveform in the self-refresh operation.

When signals /RAS and /CAS are set to the timing of /CAS-before-/RAS, signal CBR from CBR detecting circuit 1 rises to H-level. Internal refresh instruction signal CBR falls to L-level in response to falling of row address strobe signal /RAS. RS flip-flop 2 is set in response to rising of internal refresh instruction signal CBR, and thereby operates to activate timer 126 and inhibit the row selecting operation by row address strobe signal /RAS through NOR circuit 20. Signal CBR activates SELF generating circuit 6.

Then, in response to falling of row address strobe signal /RAS, the output signal of pulse generating circuit 3 rises to H-level, which is kept for a predetermined period, and the output signal of OR circuit 4 rises to H-level. One-shot pulse generating circuit 5 generates a signal PU at H-level, which is kept for a predetermined period, in response to the output signal of OR circuit 4. In accordance with internal RAS signal φRAS, RAS-related control circuit 24 executes the control operation related to row selection. At this time, the signal from output /Q of RS flip-flop 2 is applied to multiplexer 112, which changes its connection path to select the refresh address from address counter 120 for application to the row address buffer.

Meanwhile, RS flip-flop 32 is set in response to internal refresh instruction signal CBR, so that its output Q attains H-level, and the output signal of NOR circuit 34 attains L-level. While output signal CCE of RS flip-flop 32 is at H-level, internal column address strobe signal φCAS which is the output signal of NOR circuit 34 is kept at L-level. Thereby, in the self-refresh mode, it is possible to inhibit erroneous write and read of data, which may be caused by an influence of, e.g., noises in column address strobe signal /CAS.

When a predetermined time elapses after row address strobe signal /RAS is set to L-level subsequently to activation of internal refresh instruction signal CBR, self-refresh activating signal SELF from SELF generating circuit 6 is activated and attains H-level. Subsequently, timer 126 generates refresh request signal φREF. Refresh request signal φREF from timer 126 is generated (activated) after self-refresh activating signal SELF is set to the active state of H-level, and substrate potentials VPBS and VNBS are stably held at predetermined potentials of VPB and VNB, respectively.

In accordance with refresh request signal φREF, internal RAS signal φRAS, which has a pulse width corresponding to pulse signal PU, is produced through OR circuit 4, one-shot pulse generating circuit 5 and OR circuit 22, so that refreshing is executed again. When the refreshing is completed, RAS-related control circuit 24 increments or decrements the count of counter 120 by one. Thereafter, the refreshing is executed at predetermined time intervals, and specifically every time timer 126 generates refresh request signal φREF. When row address strobe signal /RAS rises to H-level, RS flip-flop 2 is reset, and a signal at L-level is generated from its output Q. Thereby, timer 126 is reset, and the multiplexer is set to the state for selecting the external address signal. Also, the counter 120 is set to the state for latching the count in accordance with the output of RS flip-flop 2, of which path is not shown in the figure. Further, SELF generating circuit 6 is deactivated, and the self-refresh activating signal SELF attains L-level and is deactivated.

When signal /RAS rises, self-refresh may be being performed in accordance with refresh request signal φREF from timer 126 in some cases. This is because it is impossible to determine externally the proceeding stage in the self-refresh. Even when signal /RAS rises to H-level, the self-refresh is executed in accordance with internal RAS signal φRAS, if this signal φRAS is already generated. For stabilizing the substrate voltage, therefore, it is required that, as already described with reference to FIG. 1, signal /RAS is maintained at H-level for at least one cycle period (corresponding to the time width of signal PU) after rising of signal /RAS to H-level so as to complete the self-refresh, when signal /RAS is to be lowered from H-level to L-level for shifting the operation mode from the self-refresh mode to the normal operation mode.

RS flip-flop 32 is provided for preventing such a situation in the self-refresh mode that internal CAS signal φCAS is generated and erroneous writing and reading of data are performed. If it is intended merely to prevent generation of internal signal φCAS, RS flip-flop 32 is not needed. This can be achieved merely by applying the output signal of RS flip-flop 2 directly to NOR circuit 34. For the following reason, there is arranged RS flip-flop 32 which is reset in response to column address strobe signal /CAS, and in addition column address strobe signal /CAS is applied to NOR circuit 34.

In the self-refresh mode, refresh address counter 120 issues the refresh address. For periodically refreshing the memory cells in respective rows of the memory cell array in DRAM, the refresh address counter must operate accurately, and the refresh address must be issued periodically. It is now assumed that refresh address counter 120 is a counter of 10 bits, in which case the same refresh address must be issued every 1024 cycles. In order to perform the counter check for determining whether the refresh address counter is operating accurately or not, it is necessary to set the operation mode to the self-refresh mode and perform write/read of memory cell data in the self-refresh mode. RS flip-flop 32 is provided for this purpose. In other words, the foregoing structure is provided for resetting flip-flop 32 by signal /CAS and operating the CAS-related circuits (circuits related to column selection).

In the self-refresh mode, pulse signal PU which is generated from one-shot pulse generating circuit 5 has a time width approximately equal in length to the cycle period which is required for normal write/read of data. In the case of CBR refresh for performing refreshing only one time (i.e., refreshing using only the refresh address counter without using a timer, and being performed when signal SELF is at the inactive state of L-level), a period for maintaining signal /RAS at L-level is set to about 10 μs at the maximum. The purpose for setting the maximum period for the active state of signal /RAS during one cycle period is to prevent reduction of the word line potential, e.g., due to leak, and thereby to prevent such a situation that accurate write/read (refresh) of data cannot be performed.

[Structure of SELF Generating Circuit]

Figure 6:
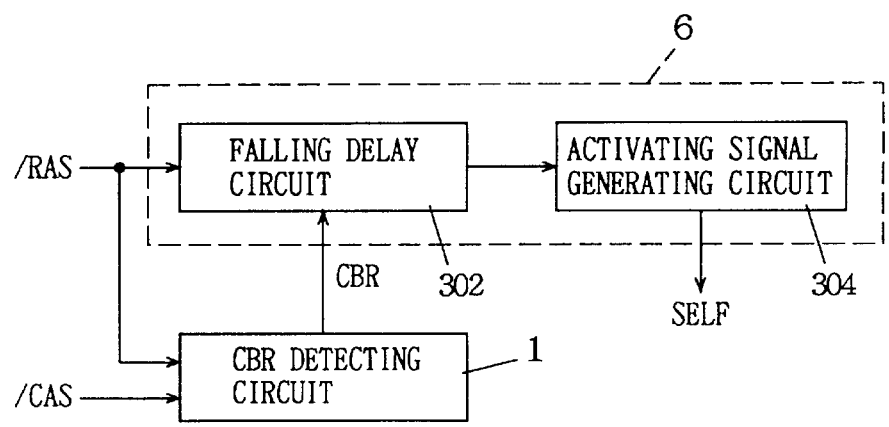
FIG. 6 schematically shows a structure of an SELF generating circuit shown in FIG. 5A.

FIG. 6 schematically shows a structure of SELF generating circuit 6 shown in FIG. 4A. In FIG. 6, SELF generating circuit 6 includes a falling delay circuit 302, which is activated in response to activation of internal refresh instruction signal CBR from CBR detecting circuit 1 to delay the falling of row address strobe signal /RAS by a predetermined time, and an activating signal generating circuit 304 which is responsive to activation of the output signal of falling delay circuit 302 to generate self-refresh activating signal SELF. The delay time of falling delay circuit 302 determines a time period from application of the CBR condition to the entry into the self-refresh mode. CBR detecting circuit 1 has the structure shown in FIG. 4A.

Figure 7:
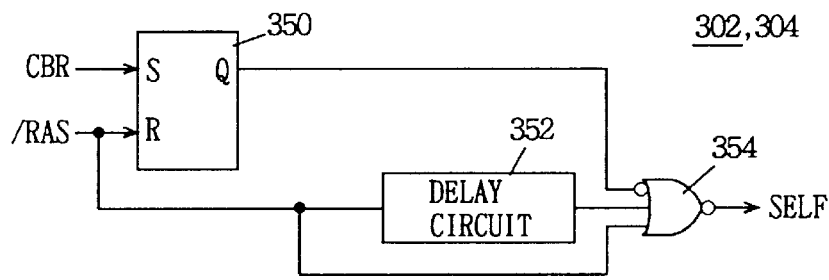
FIG. 7 schematically shows a specific structure of the SELF generating circuit shown in FIG. 6.
Figure 8:
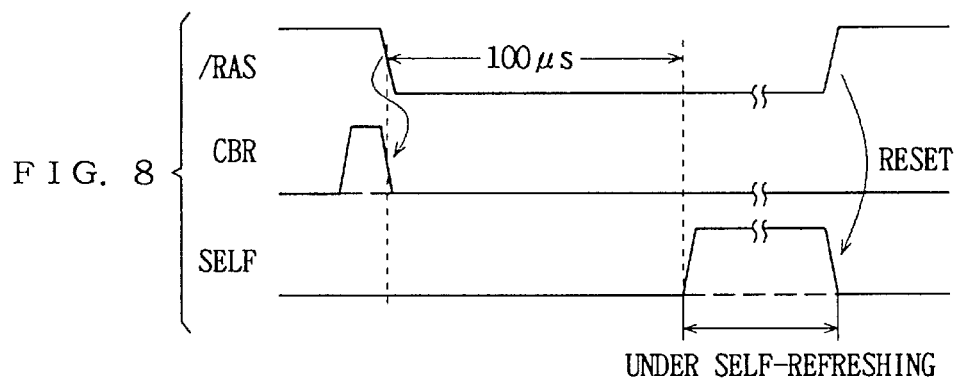
FIG. 8 is a waveform diagram representing an operation of the SELF generating circuit shown in FIGS. 6 and 7.

FIG. 7 shows an example of a specific structure of SELF generating circuit 6 shown in FIG. 6. In FIG. 7, SELF generating circuit 6 includes an RS flip-flop 350 which has a set input S receiving internal refresh instruction signal CBR and a reset input R receiving row address strobe signal /RAS, a delay circuit 352 which delays row address strobe signal /RAS by a predetermined time, and a gate circuit 354 which receives the output signal from output Q of RS flip-flop 350, the output signal of delay circuit 352 and row address strobe signal /RAS.

RS flip-flop 350 is set in response to activation of internal refresh instruction signal CBR and thereby generates a signal at H-level from output Q, and is reset in response to falling of row address strobe signal /RAS and thereby changes the output signal from output Q to the inactive state of L-level. Delay circuit 352 has a delay time of, e.g., 100 μs, and determines the time from application of the CBR condition to the entry into the self-refresh mode. Gate circuit 354 sets self-refresh activating signal SELF to the active state of H-level, when the output signal of RS flip-flop 350 is at H-level and both the output signal of delay circuit 352 and row address strobe signal /RAS are at L-level. Now, operation of the SELF generating circuit shown in FIG. 7 will be described below with reference to an operation waveform diagram of FIG. B.

When the CBR condition is satisfied, internal refresh instruction signal CBR attains H-level, RS flip-flop 350 is set and its output signal from output Q attains H-level When row address strobe signal /RAS falls to L-level, internal refresh instruction signal CBR is set to L-level. At this time, the output signal of delay circuit 352 is still at H-level, and self-refresh activating signal SELF is at L-level. When the delay time (100 μs) of delay circuit 352 elapses, the output signal of delay circuit 352 attains L-level, and self-refresh activating signal SELF from gate circuit 354 attains the active state of H-level. Thereby, the DRAM enters the self-refresh mode.

When row address strobe signal /RAS attains H-level, RS flip-flop 350 is reset, and the output signal from output Q attains L-level. Thereby, self-refresh activating signal SELF from gate circuit 354 attains the inactive state of L-level.

In accordance with self-refresh activating signal SELF, the potential level of bias potential of the substrate region in the peripheral circuit is switched. When self-refresh activating signal SELF shifts from the active state to the inactive state, self-refreshing may be being performed internally.

Change of the substrate potential during self-refreshing can be prevented only by delaying the shift of self-refresh activating signal SELF to the inactive state by one operation cycle (i.e., operation period for refreshing). This delay time is sufficiently smaller than the delay time (100 μs) of delay circuit 352, and thus does not adversely affect the timing for entry into the self-refresh mode.

[Structure of Peripheral Bias Circuit]

Figure 9:
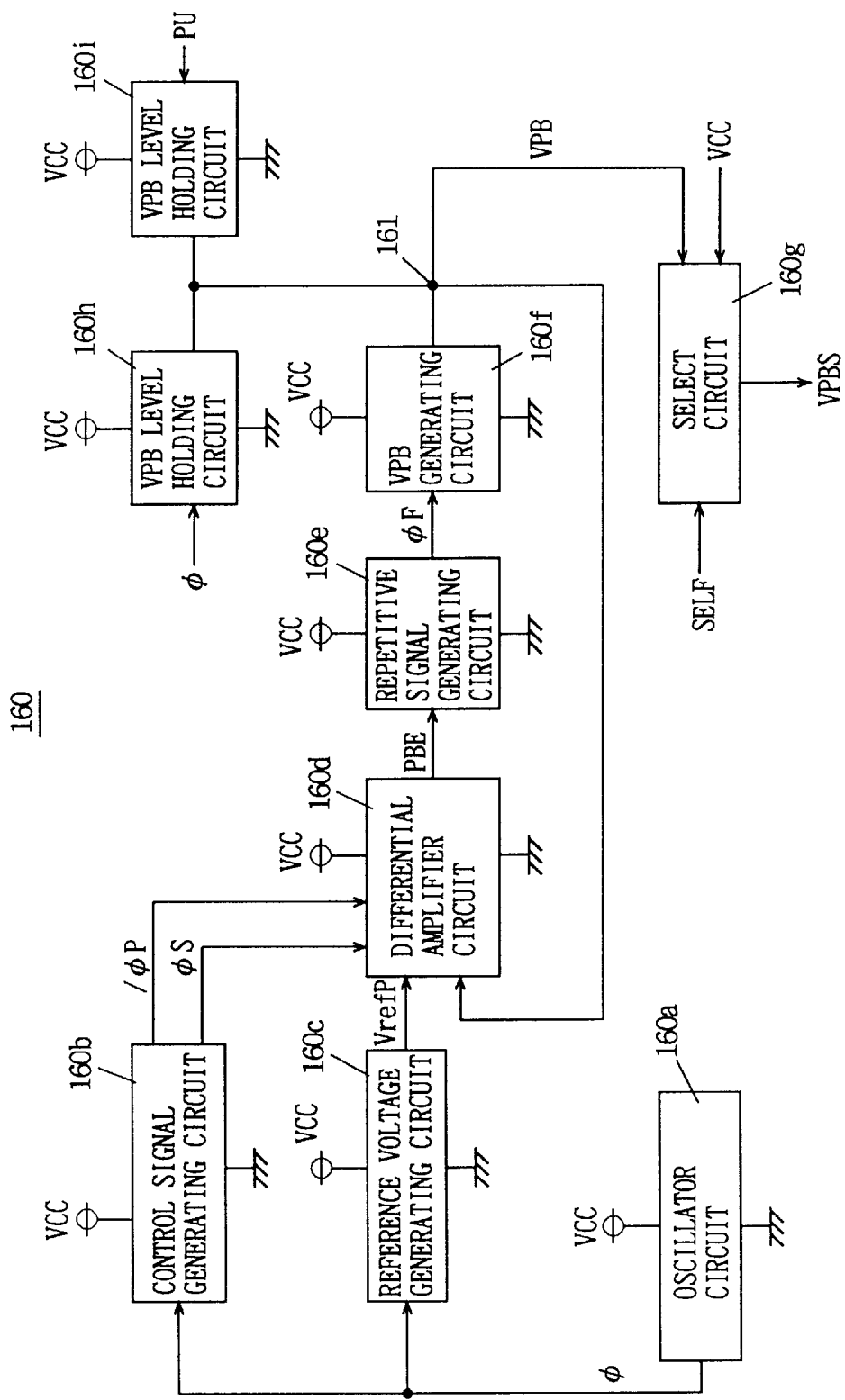
FIG. 9 schematically shows a structure of a p-channel MOS transistor substrate bias voltage generating portion in a peripheral bias circuit shown in FIG. 3.

FIG. 9 is a block diagram schematically showing a structure of the VPNBS generating portion in the peripheral bias circuit shown in FIG. 3. In FIG. 9, a peripheral bias circuit 160 includes an oscillator circuit 160a which uses both of power supply voltage VCC and ground voltage as the operation power source voltages and generates a repetitive signal φ (clock signal) having a predetermined cycle, a control signal generating circuit 160b which is responsive to repetitive signal φ to generate control signals /φP and φS of two phases having active periods different from each other, a reference voltage generating circuit 160c which is responsive to repetitive signal φ to perform a charge pump operation for producing a reference voltage VrefP, a differential amplifier circuit 160d which is responsive to control signals /φP and φS to activate the precharging operation and the comparing operation, respectively, and compares reference voltage VrefP with bias voltage VPB on output node 161 when the comparing operation is active, a repetitive signal generating circuit 160e which is activated to generate a repetitive signal φF having a predetermined cycle in response to an output signal PBE from differential amplifier circuit 160d, a VPB generating circuit 160f which is responsive to repetitive signal φF to perform the charge pumping operation for producing bias voltage VPB, and a select circuit 160g which selects one of bias voltage VPB and power supply voltage VCC, and transmits substrate bias voltage VPBS to the substrate at the PMOS transistor formation region in the peripheral circuit.

Oscillator circuit 160a performs oscillation after supply of power supply voltage VCC. Repetitive signal φ, which is the clock signal, is also a basic signal determining the comparing operation timing in differential amplifier circuit 160d, and is used merely for holding bias voltage VPB at a constant voltage level in the data holding mode (self-refresh mode). Therefore, high speed characteristic is not required for repetitive signal φ, so that the cycle time of repetitive signal φ is generally set to about several microseconds to tens of microseconds. Also, reference voltage generating circuit 160c performs the charge pump operation for producing reference voltage VrefP in accordance with repetitive signal φ. However, reference voltage VrefP is supplied only to the gate of MOS transistor at the differential comparison stage in differential amplifier circuit 160d, and a large load against the voltage VrefP does not exist. Therefore, even with relative slow repetitive signal φ, reference voltage VrefP can be stabilized sufficiently rapidly.

Meanwhile, repetitive signal φF from repetitive signal generating circuit 160e is required to achieve rapid stabilization of bias voltage VPB. When select circuit 160g selects bias voltage VPB, it is required to drive a large load capacitance. Therefore, the cycle of repetitive signal OF is set to about 100 ns.

Peripheral bias circuit 160 further includes a first VPB level holding circuit 160h which is responsive to repetitive signal φ to perform the charge pumping operation for holding the voltage level of bias voltage VPB, and a second VPB level holding circuit 160i which performs the charge pumping operation in accordance with a pulse signal PU corresponding to internal RAS signal produced during the self-refresh mode, and thereby operates to supply charges to an output node 161 and hold the voltage level of bias voltage VPB. VPB level holding circuit 160h is provided for compensating for level lowering of bias voltage VPB which is caused by the current leak during standby of the DRAM, and has a charge supply power which is sufficiently smaller than that of VPB generating circuit 160f.

VPB level holding circuit 160i is provided for preventing lowering of bias voltage VPB (VPBS) due to a hot carrier current at the substrate, which is caused by substrate current caused during execution of refresh operation. For this purpose, VPB level holding circuit 160i has a charge supply power which is sufficiently larger than that of VPB level holding circuit 160h.

All of circuits 160b–160i operate using power supply voltage VCC and ground voltage as one and the other operation power source voltages, respectively.

Figure 10:
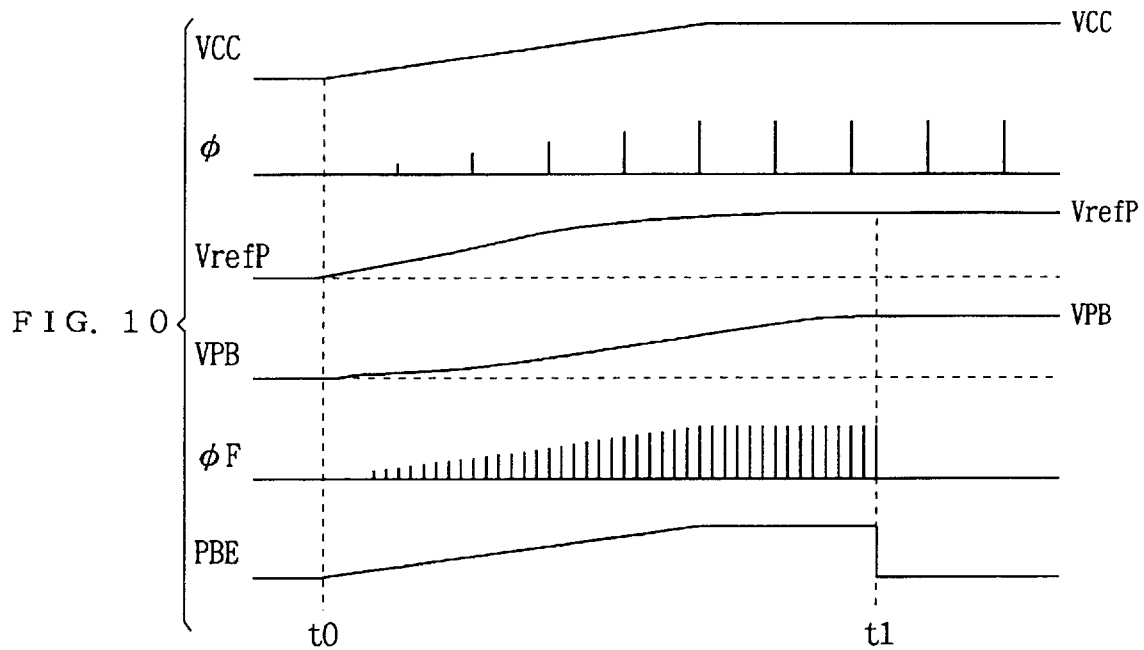

By using the structure shown in FIG. 9, the voltage level of bias voltage VPB can be set to a predetermined level with a reduced power consumption within a predetermined time upon power-on and change of power supply voltage VCC, as will be described later. By provision of VPB level holding circuits 160h and 160i, it is possible to shorten the operation period of VPB generating circuit 160f having a large charge supply power, and thus it is possible to reduce the power consumption required for generating bias voltage VPB. In circuits 160a–160g shown in FIG. 9, high speed operation is not required, so that a majority of them are formed of MOS transistors having threshold voltages of a large absolute value as will be described later. Operation which is performed upon power-on of the bias circuit shown in FIG. 9 will be described below with reference to an operation waveform diagram of FIG. 10.

At time t0, the power is turned on and the voltage level of power supply voltage VCC rises. As power supply voltage VCC rises, oscillator circuit 160a operates to produce repetitive signal φ, of which amplitude increases in accordance with rise of power supply voltage VCC (as will be described later, oscillator circuit 160a performs oscillation when power supply voltage VCC is supplied thereto). In accordance with repetitive signal φ, reference voltage generating circuit 160c performs the charge pumping operation to produce reference voltage VrefP. Reference voltage VrefP drives only the gate capacitance of MOS transistor at the comparing state of differential amplifier circuit 160d, and reference voltage VrefP reaches a predetermined voltage level at an early timing. Differential amplifier circuit 160d compares bias voltage VPB with reference voltage VrefP in accordance with control signals /φP and φS from control signal generating circuit 160b. In the initial state, the voltage level of reference voltage VrefP is higher than that of bias voltage VPB (the load capacitance of output node 161 is large (as will be described later, a stabilizing capacitance is provided)), so that signal PBE from differential amplifier circuit 160d attains the active state of H-level. The H-level of signal PBE rises in accordance with rise of power supply voltage VCC. Repetitive signal generating circuit 160e is activated to generate repetitive signal φF in accordance with signal PBE. Repetitive signal φF has a short cycle time of about 100 ns, and VPB generating circuit 160f performs the charge pumping operation at high speed in accordance with repetitive signal φF, so that it supplies charges to output node 161 and raises the voltage level of bias voltage VPB.

At time t1, the voltage level of bias voltage VPB becomes equal to that of reference voltage VrefP, so that signal PBE from differential amplifier circuit 160d attains L-level, and repetitive signal generating circuit 160e stops the operation of generating repetitive signal φF. Thereby, VPB generating circuit 160f stops the charge pumping operation, and charges are not supplied to output node 161 no longer.

After time t1, a main operation being performed is only oscillation of oscillator circuit 160a, and the peripheral bias circuit consumes only a power for a current which VPB level holding circuit 160h uses for compensating for the leak current by supplying charges. Since this leak current is extremely small and is several nanoseconds, VPB level holding circuit 160h consumes only an extremely small current. Therefore, circuits 160e and 160f, which operate relatively fast only upon power-on and consume a large power, are operated only for a predetermined period, and the power consumption of peripheral bias circuit 160 is sufficiently small.

Second VPB level holding circuit 160i operates for raising the level of bias voltage VPB, which may lower due to a hot carrier current flowing through the substrate when the DRAM enters the data holding mode (self-refresh mode) and performs refreshing. Therefore, the power consumption of second VPB level holding circuit 160i is relatively large. However, in the self-refresh mode, it is only during the refreshing that internal RAS signal (pulse signal PU) is generated, (activated) and its refresh cycle is sufficiently long (about hundreds of microseconds), so that the power consumption (average power consumption) of second VPB level holding circuit 160i is sufficiently small.

In differential amplifier circuit 160d, control signals /φP and φS having such phases that active periods thereof are different from each other, are used for stably amplifying a minute potential difference which appears on comparison nodes after the precharging of the comparison nodes is surely completed, as will be described more in detail later. Structures of respective portions will now be described below.

[Oscillator Circuit]

Figure 11:
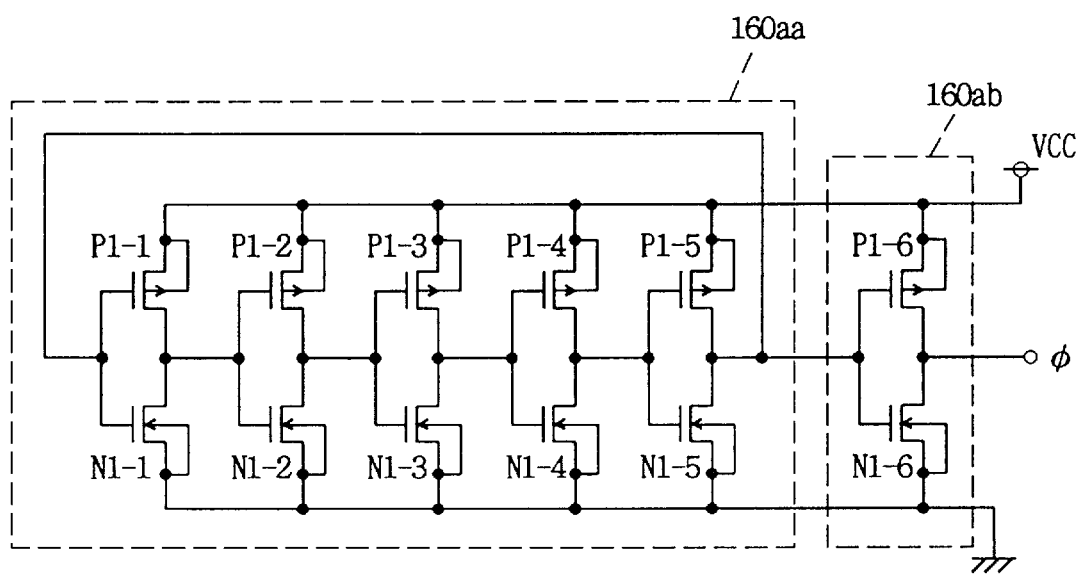
FIG. 11 specifically shows a structure of an oscillator circuit shown in FIG. 9.

FIG. 11 shows a structure of oscillator circuit 160a shown in FIG. 9. In FIG. 11, oscillator circuit 160a includes a ring oscillator 160aa which uses power supply voltage VCC and ground voltage as its operation power source voltages and oscillates at a predetermined cycle, and a drive circuit 160ab which inverts and buffers the output signal of ring oscillator 160aa for outputting. Ring oscillator 160aa includes, for example, five CMOS inverters in tandem. Each CMOS inverter is formed of a p-channel MOS transistor P1-i (i=1–5) and an n-channel MOS transistor N1-i. The back gate of each of p-channel MOS transistors P1-1–P1-5 is connected to the corresponding source (i.e., node which is supplied with power supply voltage VCC and will be simply referred to as a "power supply node" hereinafter), and the back gate of each of n-channel MOS transistors N1-1–N1-5 is connected to the corresponding source (i.e., node which is supplied with the ground voltage and will be simply referred to as a "ground node" hereinafter).

By the interconnection of the back gate and source in these MOS transistors, an influence of the back gate effect is eliminated, and the threshold voltage is held at a constant value. The output signal of the CMOS inverter (MOS transistors P1-5 and N1-5) at the final stage is applied to the gate of the CMOS inverter (MOS transistors P1-1 and N1-i) at the first stage. The cycle of ring oscillator 160aa is set to about 10 μs, high speed operation is not required, and the threshold voltages of MOS transistors P1-1–P1-5 and N1-1–N1-5 have a large absolute value of about 0.7 V. Further, these MOS transistors are not required to drive a large load, and thus has a small current drive capability whereby the current consumption of ring oscillator 160a is reduced.

Drive circuit 160ab includes a p-channel MOS transistor P1-6 and an n-channel MOS transistor N1-6 forming a CMOS inverter. The back gate of p-channel MOS transistor P1-6 is connected to its source for receiving power supply voltage VCC, and the back gate of n-channel MOS transistor N1-6 is connected to its source for receiving the ground potential. Drive circuit 160ab applies repetitive signal φ to reference voltage generating circuit 160c, control signal generating circuit 160b and VPB level holding circuit 160h as shown in FIG. 9, and is required to drive these circuits. Therefore, it has a relatively large current driving capability, and the transistors have a relatively large gate width (channel width) W. The threshold voltage is approximately equal to that of the MOS transistor included in ring oscillator 160aa. Operation will now be briefly described below.

Power supply voltage VCC is supplied, and rises above the absolute value of the threshold voltage of MOS transistor included in ring oscillator 160aa. Ring oscillator 160aa operates (oscillates) to produce the repetitive signal. Drive circuit 160ab issues repetitive signal φ in accordance with the repetitive signal sent from ring oscillator 160aa. The amplitude of repetitive signal φ gradually increases in accordance with rise of power supply voltage VCC, because the amplitude of repetitive signal φ depends on the operation power supply voltage of CMOS inverter. The cycle of ring oscillator 160aa is relatively long and, for example, about 10 μs, and the current is consumed due to flow of a through current which occurs only when the CMOS inverter performs the switching operation. Since the threshold voltage is set to a large absolute value, the subthreshold current is extremely small when the output signals of these CMOS generating circuit 160c, control signal generating circuit 160b and VPB level holding circuit 160h as shown in FIG. 9, and is required to drive these circuits. Therefore, it has a relatively large current driving capability, and the transistors have a relatively large gate width (channel width) W. The threshold voltage is approximately equal to that of the MOS transistor included in ring oscillator 160aa. Operation will now be briefly described below.

When power supply voltage VCC is supplied, and rises above the absolute value of the threshold voltage of MOS transistor included in ring oscillator 160aa, ring oscillator 160aa operates (oscillates) to produce the repetitive signal. Drive circuit 160ab generates repetitive signal φ in accordance with the repetitive signal from ring oscillator 160aa. The amplitude of repetitive signal φ gradually increases in accordance with rise of power supply voltage VCC, because the amplitude of repetitive signal φ depends on the operation power supply voltage of CMOS inverter.

The cycle of ring oscillator 160aa is relatively long and, for example, about 10 μs, and the current is consumed due to flow of a through current which is caused only when the CMOS inverter performs the switching operation. Since the threshold voltage is set to a large absolute value, the subthreshold current is extremely small when the output signals of these CMOS inverters are defined. Accordingly, oscillator circuit 160a stably operates to generate repetitive signal φ with a low power consumption, even in the case that it continues oscillating operation after power-on.

[Structure of Reference Voltage Generating Circuit]

Figure 12:
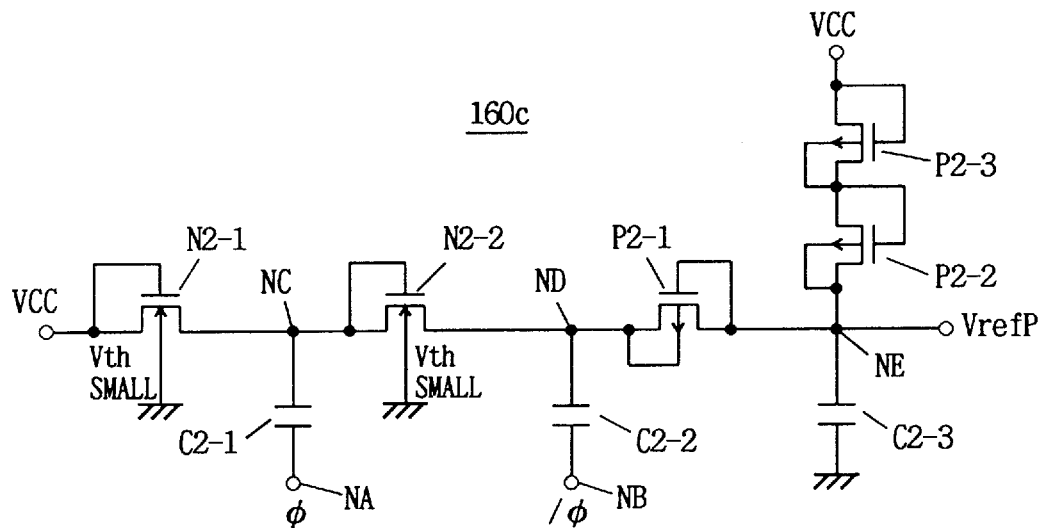
FIG. 12 shows a specific structure of a reference voltage generating circuit shown in FIG. 9.

FIG. 12 shows a structure of a reference voltage generating circuit 160c shown in FIG. 9. In FIG. 12, reference voltage generating circuit 160c includes an n-channel MOS transistor N2-1 which is forwardly diode-connected between power supply node VCC and a node NC, an n-channel MOS transistor N2-2 which is forwardly diode-connected between nodes NC and ND, a p-channel MOS transistor P2-1 which is forwardly diode-connected between node ND and an output node NE, p-channel MOS transistors P2-2 and P2-3 which are forwardly diode-connected and are mutually connected in serial between node NE and power supply node VCC, a charge pump capacitor C2-1 which supplies charges to node NC in accordance with repetitive signal φ applied to node NA, a charge pump capacitor C2-2 which supplies charges to node ND in accordance with inverted signal /φp of repetitive signal φ applied to node NB, and a stabilizing capacitor C2-3 for stabilizing the voltage level of reference voltage VrefP applied from node NE.

Back gates of p-channel MOS transistors P2-1–P2-3 are connected to the sources (nodes at a higher potential) of the corresponding transistors, respectively. The back gates of n-channel MOS transistors N2-1 and N2-2 are coupled to receive the ground potential. For the following reason, n-channel MOS transistors N2-1 and N2-2 are used.

During rising of the potentials on nodes NC and ND, if p-channel MOS transistors were used, the P+ region (source/drain) and the substrate region would be forwardly biased and a current would flow to the substrate. In order to avoid the forward biasing at the P/N junction, n-channel MOS transistors N2-1 and N2-2 are used and are coupled such that the back gates thereof receive the ground potential lower than the voltage level at the N+ region. N-channel MOS transistors N2-1 and N2-2 have large threshold voltages due to the back gate effect. In this case, reference voltage VrefP at the necessary level may not be ensured when power supply voltage VCC varies. Therefore, MOS transistors having small threshold voltages are used as n-channel MOS transistors N2-1 and N2-2. P-channel MOS transistors P2-1–P2-3 have large threshold voltages of about 0.7 V in absolute value. P-channel MOS transistors P2-1–P2-3 have a source potential which is always higher than the drain potential, and each have the back gate and the source coupled together, so that the substrate bias effect is eliminated, and the threshold voltages are held at a constant voltage level. Operation will now be briefly described below.

MOS transistor N2-1 transmits a voltage of (VCC–VTN1) to node NC when it is on. VTN1 represents the threshold voltage of MOS transistor N2-1. In this state, when repetitive signal φ rises to H-level, the potential on node NC rises to the voltage level of (2·VCC–VTN1) owing to the charge pumping operation of charge pump capacitor C2-1. In this operation, repetitive signal /φ falls to L-level, so that the potential on node ND lowers, and MOS transistor N2-2 is turned on. Thereby, the potential on node ND rises to the voltage level of (2·VCC–VTN1–VTN2). If the potential difference between nodes ND and NE is not larger than |VTP|, MOS transistor P2-1 is turned off. In this state, when repetitive signal /φ rises to H-level, the potential on node ND rises to (3·VCC–VTN1–VTN2) and MOS transistor P2-1 is turned on, so that the potential on node NE attains the voltage level of (3·VCC–VTN1–VTN2–|VTP|), where VTP represents the threshold voltage of MOS transistor P2-1. In the normal or steady state, the voltage V(NC) of node NC changes between (VCC–VTN1) and (2·VCC–VTN1). The voltage V(ND) of node ND changes between (2·VCC–VTN1–VTN2) and (3·VCC–VTN1–VTN2). Therefore, reference voltage VrefP can rise up to the voltage level of (3·VCC–VTN1–VTN2–|VTP|). However, MOS transistors P2-2 and P2-3 bypass the charges, which are supplied to node NE from MOS transistor P2-1, to node NE, and reference voltage VrefP supplied from node NE is fixed at the voltage level of (VCC+2|VTP|).

It is now assumed that all p-channel MOS transistors P2-1–P2-3 have the same threshold voltage. MOS transistors P2-2 and P2-3 each have the threshold voltage of a large absolute value, and have the back gate connected to the source. Further, threshold voltage VTP is constant and –0.7 V. Therefore, reference voltage VrefP attains the voltage level higher by 1.4 V than power supply voltage VCC. Reference voltage VrefP on node NE is stably held by stabilizing capacitor C2-3, and reference voltage VrefP at the predetermined voltage level is stably supplied even if noises are generated. Now, the voltage level of reference voltage VrefP will be derived below.

Since n-channel MOS transistors N2-1 and N2-2 have the grounded back gates, a back gate bias effect arises. Voltage V(NC) on node NC can be expressed by the following formula:

$$\begin{aligned} V(NC) &= VCC - VTN1 \\ &= |VTH0| + |K|\{(|2 \cdot \phi F| + |V(NC)|)^{1/2} - (2 \cdot \phi F|)^{1/2}\} \\ &= |VTH0| + |K|\{(|2 \cdot \phi F| + |VCC - VTN1|)^{1/2} - (2 \cdot \phi F|)^{1/2}\} \end{aligned}$$

Assuming that relationships of |VTH0|=0.38 (V), |K|=0.5 (√V), 2φF|=0.6 (V) and VCC=2.0 (V), the following relationship is established:

VTN1=0.7 (V)

The voltage V (ND) which appears on node ND when repetitive signal φ raises the potential on node NC is expressed by the following formula. In the following formula, the threshold voltage of MOS transistor N2-1 at node NC is not taken into consideration, because, in this state, MOS transistor N2-1 is off and charges are not supplied to node NC. Further, the threshold voltage, which MOS transistor N2-2 attains when the level of node NC is raised, is taken into consideration for the reason that MOS transistor N2-2 is turned on, and charges are supplied from node NC to node ND.

$$\begin{aligned} V(ND) &= 2 \cdot VCC - VTN1 - VTN2 \\ &= |VTH0| + |K|\{(|2 \cdot \phi F| + |V(ND)|)^{1/2} - (2 \cdot \phi F|)^{1/2}\} \\ &= |VTH0| + |K|\{(|2 \cdot \phi F| + |2 \cdot VCC - VTN1 - VTN2|)^{1/2} - (2 \cdot \phi F|)^{1/2}\} \end{aligned}$$

By using the above conditions from which threshold voltage VTN1 of MOS transistor N2-1 is derived, the following can be obtained:

VTN2=0.86 (V)

Further, voltage V(NE), which appears on output node NE when the potential on node ND is raised by repetitive signal /φ, can be expressed by the following formula, where VTP represents the threshold voltage of p-channel MOS transistor P2-1:

$$V(NE) = 2 \cdot VCC - VTN1 - VTN2 + VCC - |VTP|$$
$$= 3 \cdot VCC - VTN1 - VTN2 - |VTP|$$

Assuming that VCC=2.0 (V), VTN1=0.7 (V), VTN2= 0.86 (V) and |VTP|=0.7 (V), the following can be obtained:

$$V(NE) = 3 \cdot 2 - 0.7 - 0.86 - 0.7$$
$$= 3.74 \, (V)$$

Thus, reference voltage VrefP can rise to 3.74 V. P-channel MOS transistors P2-2 and P2-3 clamp the voltage level of node NE at the voltage level of VCC+2|VTP|=2+ 1.4=3.4 (V). The voltage (3.74 (V)) which can be produced from the charge pump circuit formed of MOS transistors N2-1, N2-2 and P2-2 and capacitors C2-1 and C2-2 is higher in level than the voltage (3.4 (V)) required for reference voltage VrefP. Therefore, it is possible to produce reference voltage VrefP at the level sufficient for the necessary voltage level.

As described above, the p-channel MOS transistor having a threshold voltage of a large absolute value is used, and the n-channel MOS transistor having a small threshold voltage is used, whereby reference voltage VrefP at a predetermined voltage level can be stably produced with a low power consumption.

[Structure of Control Signal Generating Circuit]

Figure 13A:
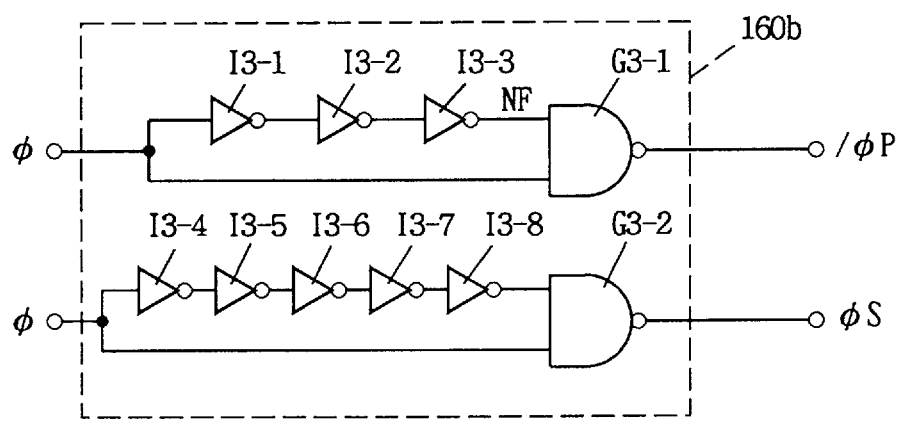
FIG. 13A shows a specific structure of a control signal generating circuit shown in FIG. 9.

FIG. 13A shows a structure of control signal generating circuit 160b shown in FIG. 9. In FIG. 13A, control signal generating circuit 160b includes cascaded three inverters I3-1–I3-3 receiving repetitive signal φ, and an NAND circuit G3-1 receiving repetitive signal φ and an output signal of inverter I3-3. NAND circuit G3-1 issues control signal /φP.

Control signal generating circuit 160b further includes five tandem inverters I3-4, I3-5, I3-6, I3-7 and I3-8 receiving repetitive signal φ as well as an NAND circuit G3-2 receiving repetitive signal φ and an output signal of inverter I3-8. NAND circuit G3-2 generates control signal φS.

Figure 13B:
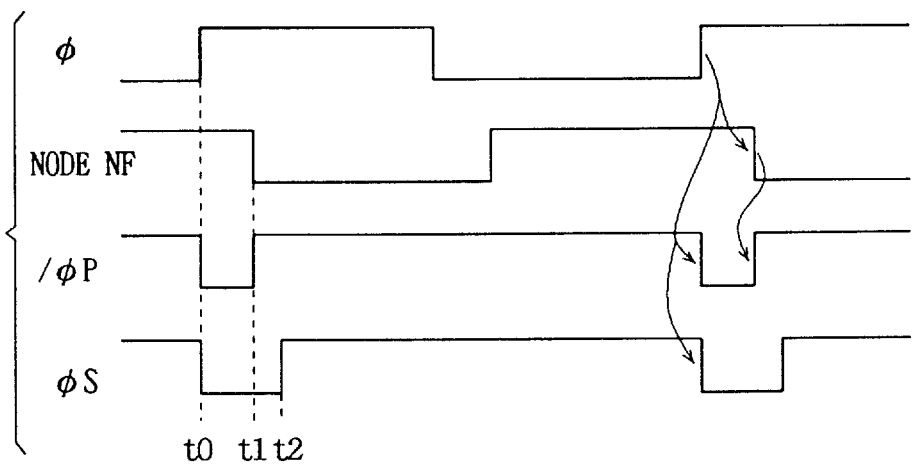
FIG. 13B is a waveform diagram representing an operation of the circuit shown in FIG. 13A.

Control signal generating circuit 160b has a structure of a so-called one-shot-pulse generating circuit. Inverters I3-1–I3-3 determine an active period of control signal /φP, and inverters I3-4–I3-8 determine a period of L-level of control signal φS. Further, inverters I3-1–I3-3 have a function of a delay circuit, and inverters I3-4–I3-8 also have a function of a delay circuit. The delay time of inverters I3-4–I3-8 is larger than that determined by inverters I3-1–I3-3. Operation of control signal generating circuit 160b shown in FIG. 13A will now be described below with reference to an operation waveform diagram of FIG. 13B.

Before time t0, both control signals /φP and φS are at H-level when repetitive signal φ is at L-level. The potential on node NF is held at H-level by inverters I3-1–I3-3.

At time t0, repetitive signal φ rises from L-level to H-level, but the output signal from inverters I3-3 and I3-8 is still at H-level, so that control signals /φP and φS from NAND circuits G3-1 and G3-2 maintaining L-level. When the delay time of inverters I3-1–I3-3 elapses, the potential on node NF lowers to L-level, and control signal /φP from NAND circuit G3-1 rises to H-level (time t1). At this time, the output signal of inverter I3-8 is still at H-level, and control signal φS is still at L-level.

When the delay time of inverters I3-4–I3-8 elapses, the output signal of inverter I3-8 falls to L-level at time t2, so that control signal φS generated from NAND circuit G3-2 rises to H-level. The period of L-level of control signal φS is determined to be longer than the period of L-level of control signal /φP for the purpose of stably performing differential amplification in the differential amplifier circuit, which will be described later. Here, control signal /φP is active when it is at L-level, and control signal φS is active when it is at H-level.

[Structure of Differential Amplifier Circuit]

Figure 14:
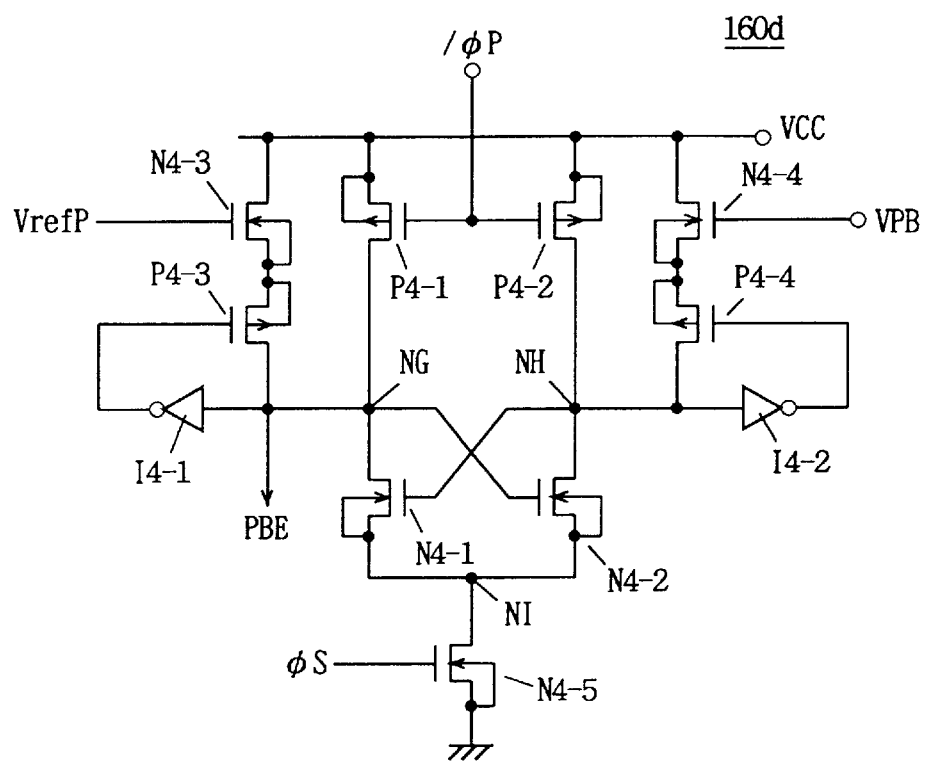
FIG. 14 shows a specific structure of a differential amplifier circuit shown in FIG. 9.

FIG. 14 specifically shows a structure of differential amplifier circuit 160d shown in FIG. 9. In FIG. 14, differential amplifier circuit 160d includes a p-channel MOS transistor P4-1 which is connected between power supply node VCC and node NG, and is turned on in response to control signal /φP, a p-channel MOS transistor P4-2 which is connected between power supply node VCC and node NH, and is turned on to charge node NH to power supply voltage VCC level in response to control signal /φP, an n-channel MOS transistor N4-1 which is connected between nodes NG and NI, and has a gate connected to node NH, an n-channel MOS transistor N4-2 which is connected between nodes NH and NI, and has a gate connected to node NG, n- and p-channel MOS transistors N4-3 and P4-3 which are connected in series between power supply node VCC and node NG, n- and p-channel MOS transistors N4-4 and P4-4 which are connected in series between power supply node VCC and node NH, an inverter I4-1 which inverts the potential on node NG for application to a gate of p-channel MOS transistor P4-3, an inverter I4-2 which inverts the potential on node NH for application to a gate of p-channel MOS transistor P4-4, and an n-channel MOS transistor N4-5 which is connected between node NI and ground node, and receives control signal φS on its gate.

Each of MOS transistors P4-1–P4-4 and N4-1–N4-5 has a back gate connected to a corresponding source. N-channel MOS transistor N4-3 receives reference voltage VrefP on its gate, and n-channel MOS transistor N4-4 receives bias voltage VPB on its gate.

MOS transistors P4-1 and P4-2 have functions of precharging nodes NG and NH to power supply voltage VCC level, respectively. MOS transistors N4-1 and N4-2 are activated to amplify differentially a minute potential difference between nodes NG and NH, when MOS transistor N4-5 is turned on. MOS transistors N4-3 and N4-4 function as a potential difference detecting circuit for supplying currents corresponding to a difference between reference voltage VrefP and bias voltage VPB to nodes NG and NH. MOS transistors P4-3 and P4-4 are turned off in accordance with the output signals of inverters I4-1 and I4-2 when the potentials on nodes ND and NH lower to L-level, respectively, and thereby cut off the current paths from power supply node VCC to the ground node.

Figure 15:
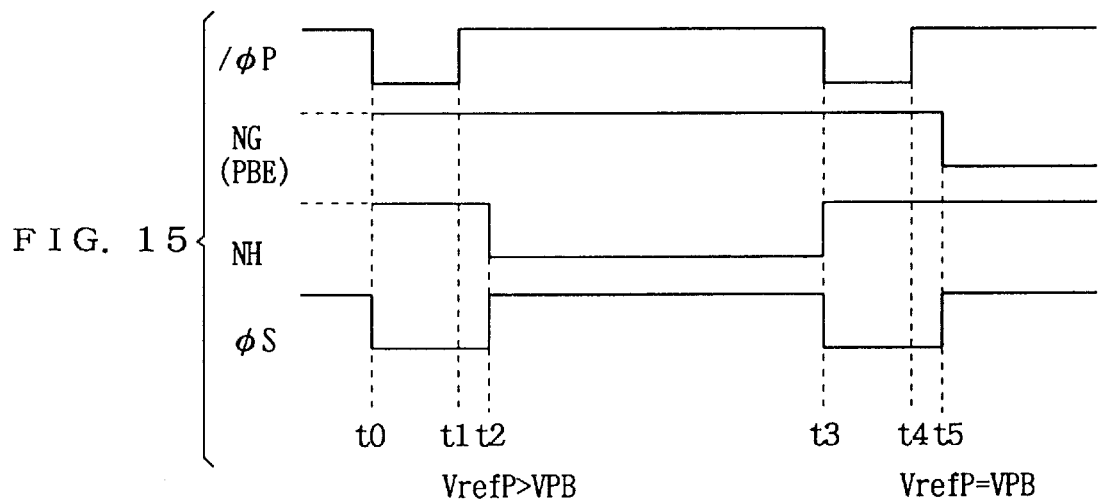
FIG. 15 is a waveform diagram representing an operation of the differential amplifier circuit shown in FIG. 14.

In the differential amplifier circuit shown in FIG. 14, the sizes and arrangement of the MOS transistors are substantially symmetrical with respect to a vertical direction in FIG. 14. However, MOS transistors N4-3 and N4-4, which have nearly equal sizes, differ from each other in that a slightly larger (about 5% to about 10%) current drive power (e.g., a larger gate with) is given to MOS transistor N4-4 so that output signal PBE can attain L-level when reference voltage VrefP and bias voltage VPB are at the same voltage level. Referring now to an operation waveform diagram of FIG. 15, operation of the differential amplifier circuit shown in FIG. 14 will be described below.

Before time t0, both of control signals /φP and φS are at H-level. In this state, MOS transistors P4-1 and P4-2 for precharge are off, MOS transistor N4-5 is on, and the voltage level of signal PBE generated from node NG is determined in accordance with the difference between reference voltage VrefP and bias voltage VPB.

At time t0, both of control signals /φP and φS fall to L-level, whereby MOS transistor N4-5 is turned off, and MOS transistors P4-1 and P4-2 for precharge are turned on. Thereby, nodes NG and NH are charged to power supply voltage VCC level, and signal PBE attains H-level. Owing to charging of nodes NG and NH, the output signals of inverters I4-1 and I4-2 attain L-level, and MOS transistors P4-3 and P4-4 are both turned on, so that current paths from power supply voltage VCC to nodes NG and NH are formed. In this operation, only the charging of nodes NG and NH is performed, and a current path from the power supply node to the ground node is cut off (MOS transistor N4-5 is off), so that the current consumption is very small.

At time t1, control signal /φP rises to H-level, MOS transistors P4-1 and P4-2 are turned off, and precharging of nodes NG and NH is completed. At this time, control signal φS is still at L-level, and MOS transistor N4-5 is off, so that the comparing operation has not yet started.

At time t2, control signal φS rises to H-level, so that MOS transistor N4-5 is turned on, and current paths from nodes NG and NH to the ground node are formed, whereby a minute potential difference between nodes NG and NH is differentially amplified.

It is now assumed that reference voltage VrefP is higher than bias voltage VPB. In this case, the conductance of MOS transistor N4-4 is smaller than that of MOS transistor N4-3, and a current flowing from power supply node VCC to node NG through MOS transistors N4-3 and P4-3 is larger than a current flowing from power supply node VCC to node NH through MOS transistors N4-4 and P4-4. MOS transistors N4-1 and N4-2 start discharging of nodes NG and NH, respectively, when MOS transistor N4-5 is turned on. In this operation, since the potential on node NG lowers more slowly than the potential on node NH owing to supply of a larger current, so that the current flowing through MOS transistor N4-1 is smaller than that flowing through MOS transistor N4-2, and therefore node NH is rapidly discharged to L-level.

When the potential on node NH lowers, the level of output signal of inverter I4-2 rises, and MOS transistor P4-4 is finally turned off, so that a current path from power supply node VCC to node NH is cut off. Thereby, node NH is completely discharged to the ground potential level, and node NG substantially maintains power supply voltage VCC level. Therefore, when reference voltage VrefP is higher than bias voltage VPB, output signal PBE maintains H-level.

When the comparing operation is completed, the voltage levels on nodes NG and NH attain H-level and L-level, respectively. In this state, a current scarcely flow through MOS transistors N4-1 and N4-2, so that the current consumption in the comparing operation is reduced.

At time t3, control signals /φP and φS lower to L-level again, whereby the comparing operation is completed, and nodes NG and NH are precharged to power supply voltage VCC level again. The output signal of inverter I4-2 attains L-level, and MOS transistor P4-4 is turned on again.

At time t4, control signal /φP rises to H-level, and precharging of nodes NG and NH is completed. Then, at time t5, control signal φS rises to H-level, and comparison and differential amplification are executed. When bias voltage VPB is at a raised level equal to reference voltage VrefP, MOS transistors N4-3 and N4-4 have the gate voltages at the same voltage level. However, the current drive capability of MOS transistor N4-4 is larger than that of MOS transistor N4-3. Therefore, the current flowing to node NH is larger than that flowing to node NG. In this case, therefore, node NH is set to H-level, and node NG is set to L-level. In accordance with lowering of the potential level of node NG, the output signal of inverter I4-1 attains H-level, and MOS transistor P4-3 is turned off.

Since the period of L-level of control signal /φP is longer than the period of L-level of control signal φS, the comparison and differential amplification can be stably performed after nodes NG and NH have precharging thereto completed, and are charged only by currents supplied thereto through MOS transistors N4-3 and N4-4.

Here, power supply voltage VCC is about 2.0 V, and reference voltage VrefP is about 3.4 V as already described. MOS transistors N4-3 and N4-4 can transmit power supply voltage VCC to nodes NG and NH, although their current supply rates are different from each other. MOS transistors N4-3 and N4-4 are operating in a saturation region, and drain currents supplied from MOS transistors N4-3 and N4-4 each are proportional to the square of the gate voltage. Therefore, even a minute potential difference can cause a relatively large current difference, and nodes NG and NH can be accurately set to the voltage levels depending on the difference between reference voltage VrefP and bias voltage VPB.

By using inverters I4-1 and I4-2 as well as p-channel MOS transistors P4-3 and P4-4, the p-channel MOS transistor (P4-3 or P4-4) connected to the node at L-level can be turned off after completion of the comparing operation, and thus a current path from power supply node VCC to the ground node can be cut off, so that the current consumption can be reduced.

According to the above structure, a minute potential difference can be accurately sensed with a low current consumption, and thereby signal PBE at a voltage level equal to either power supply voltage VCC level or ground voltage level can be produced. After completion of the differential amplification, nodes NG and NH are held at the state that their potential are latched by n-channel MOS transistors N4-1 and N4-2, respectively, until nodes NG and NH are both precharged to power supply voltage VCC level.

[Structure of Repetitive Signal Generating Circuit]

Figure 16:
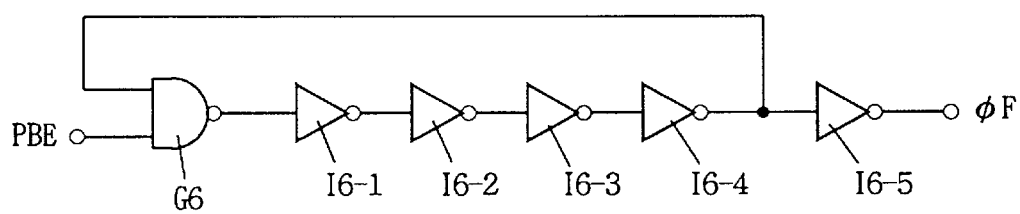
FIG. 16 shows a specific structure of a repetitive signal generating circuit shown in FIG. 9.

FIG. 16 shows a structure of repetitive signal generating circuit 160e shown in FIG. 9. In FIG. 16, repetitive signal generating circuit 160e includes cascaded five inverters I6-1–I6-5, and an NAND circuit G6 receiving output signal PBE from the differential amplifier circuit and the output signal from inverter I6-4. The output signal of NAND circuit G6 is applied to the input of inverter I6-1. Inverters I6-1–I6-4 have relatively small current drive capabilities. Meanwhile, inverter I6-5 generating signal φF has a relatively large drive capability in order to drive a VPB generating circuit performing the charge pumping operation at the next stage. Operation will now be briefly described below.

When signal PBE is at L-level, bias voltage VPB is equal in voltage level to or higher than reference voltage VrefP. In this state, the output signal of NAND circuit G6 is fixed at H-level, and hence signal φF is fixed at L-level.

When signal PBE is at L-level indicating that the voltage level of reference voltage VrefP is higher than that of bias voltage VPB, NAND circuit G6 functions as an inverter, and NAND circuit G6 and inverters I6-1–I6-4 operate as a ring oscillator formed of five stages of inverters, so that signal φF from inverter I6-5 Varies at a predetermined cycle time. The cycle of this ring oscillator is 100 ns and hence is relatively short, so that bias voltage VPB is rapidly raised to reference voltage VrefP. However, the cycle of this ring oscillator is about 100 ns, and NAND circuits G6 and inverters I6-1–I6-5, which are formed of CMOS circuits, are not particularly required to perform fast operations, so that the MOS transistors, i.e., components of them may have the threshold voltages of a large absolute value, e.g., of 0.7 V. Only inverter I6-5 at the final stage has a large current drive capabilities, and inverters I6-1–I6-4 and NAND circuit G6 may have small current drive capacities. Therefore, the current consumption during operation of repetitive signal generating circuit 160e is sufficiently suppressed.

[Structure of VPB Generating Circuit]

Figure 17:
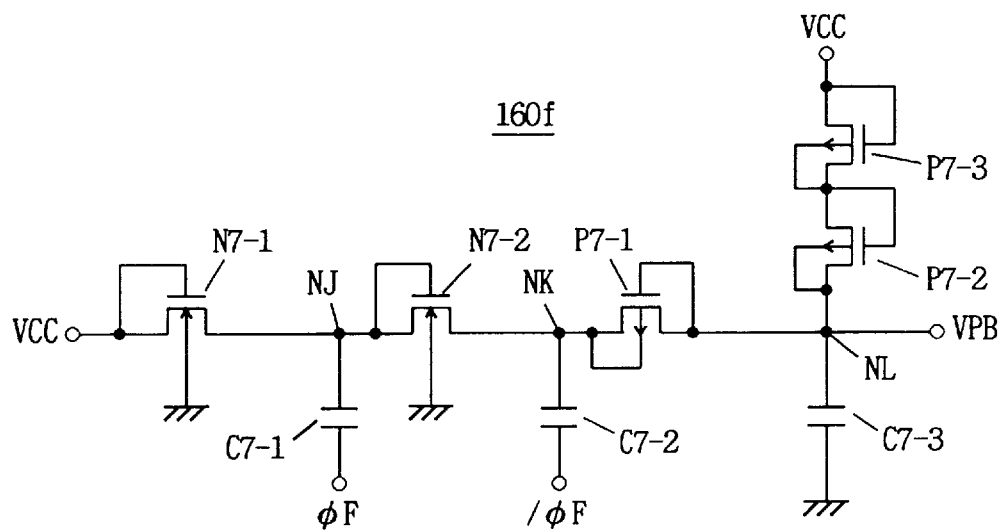
FIG. 17 shows a specific structure of a VPB generating circuit shown in FIG. 9.

FIG. 17 shows an example of a specific structure of VPB generating circuit 160f shown in FIG. 9. In FIG. 17, VPB generating circuit 160f includes an n-channel MOS transistor N7-1 which is forwardly diode-connected between power supply node VCC and a node NJ, an n-channel MOS transistor N7-2 which is forwardly diode-connected between nodes NJ and NK, a p-channel MOS transistor P7-1 which is forwardly diode-connected between nodes NK and NL, p-channel MOS transistors P7-2 and P7-3 which are forwardly diode-connected and are mutually connected in series between node NL and power supply node VCC, a charge pump capacitor C7-1 which supplies charges to node NJ in accordance with repetitive signal ϕF, a charge pump capacitor C7-2 which supplies charges to node NK in accordance with repetitive signal /ϕF, and a stabilizing capacitor C7-3 for stabilizing bias voltage VPB on node NL.

MOS transistors N7-1 and N7-2 are connected to receive on their back gates the ground potential. Each of the back gates of MOS transistors P7-1 and P7-3 is connected to one (source) of conduction nodes of the same transistor.

The structure of VPB generating circuit shown in FIG. 17 is substantially the same as that of reference voltage generating circuit 160c already described with reference to FIG. 9. Therefore, MOS transistors N7-1 and N7-2 have small threshold voltages, and MOS transistors P7-1–P7-3 have threshold voltages of a large absolute value. MOS transistors N7-1 and N7-2 are formed of n-channel MOS transistors and have their back gates connected to receive the ground potential, as is done in the reference voltage generating circuit shown in FIG. 12.

In the structure of VPB generating circuit shown in FIG. 17, bias voltage VPB attains the voltage level of (VCC+2|VTP|). Since repetitive signal ϕF has a cycle of 100 ns which is shorter than that for the reference voltage generating circuit 160C, bias voltage VPB can be rapidly stabilized at a predetermined voltage level. The quantity of charges supplied by the charge pumping operation depends on the frequency of repetitive signal and the capacitance of charge pump capacitor. Therefore, charge pump capacitors C7-1 and C7-2 may have capacitance values larger than those in the reference voltage generating circuit for rapidly generating bias voltage VPB.

Similarly to reference voltage generating circuit 160c shown in FIG. 12, the VPB generating circuit shown in FIG. 17 can rapidly produce bias voltage VPB with a lower current consumption.

[Structure of First VPB Level Holding Circuit]

Figure 18:
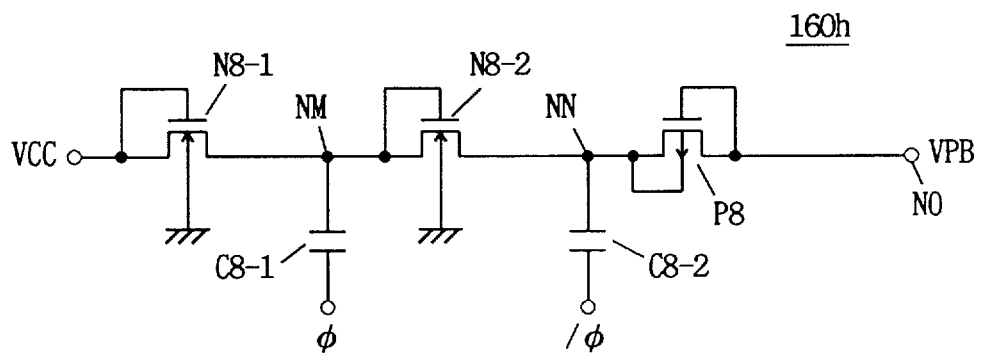
FIG. 18 specifically shows a structure of a first VPB level holding circuit shown in FIG. 9.

FIG. 18 shows a structure of first VPB level holding circuit 160h shown in FIG. 9. In FIG. 18, VPB level holding circuit 160h includes an n-channel MOS transistor N8-1 which is forwardly diode-connected between power supply node VCC and node NM, an n-channel MOS transistor N8-1 which is forwardly diode-connected between nodes NM and NN, a p-channel MOS transistor P8 which is forwardly diode-connected between node NN and an output node NO, a charge pump capacitor C8-1 which supplies charges to node NM in accordance with repetitive signal ϕ, and a charge pump capacitor C8-2 which supplies charges to node NN in accordance with repetitive signal /ϕ.

MOS transistors N8-1 and N8-2 are connected to receive the ground potential on their back gates. The back gate of MOS transistor P8 is connected to node NN. Node NO is connected to output node NL of VPB generating circuit 160f.

VPB level holding circuit 160h shown in FIG. 18 has the same structure as that of VPB generating circuit shown in FIG. 17 except for that the structures of clamp circuit and stabilizing capacitor are not provided at the output stage of the VPB generating circuit. Therefore, VPB level holding circuit 160h supplies the voltage level of (3·VCC−VTN1−VTN2−|VTP|) to node NO. Here, VTN1 and VTN2 represent the threshold voltages of MOS transistors N8-1 and N8-2, respectively, and VTP represent the threshold voltage of MOS transistor P8. This voltage is discharged to power supply node VCC by bypass MOS transistors P7-2 and P7-3 shown in FIG. 17, and the voltage level of node NO goes to (VCC+2|VTP|).

First level holding circuit 160h is used for merely preventing lowering of bias voltage VPB supplied from node NO due to a leak current during standby. This leak current is extremely small and is several nanoamperes, so that the first level holding circuit 160h has a sufficiently small charge supplying capability. Therefore, charge pump capacitors C8-1 and C8-2 each have a capacitance of about several picofarads. Accordingly, the power consumption can be extremely small even when the charge pumping is continuously performed to supply charges to node NO in accordance with repetitive signals ϕ and /ϕ. The reason why MOS transistors N8-1 and N8-2 are connected to receive the ground potential on their back gates is the same as those already described in connection with the reference voltage generating circuit shown in FIG. 12 and VPB generating circuit 160f shown in FIG. 17.

[Second VPB Level Holding Circuit]

Figure 19:
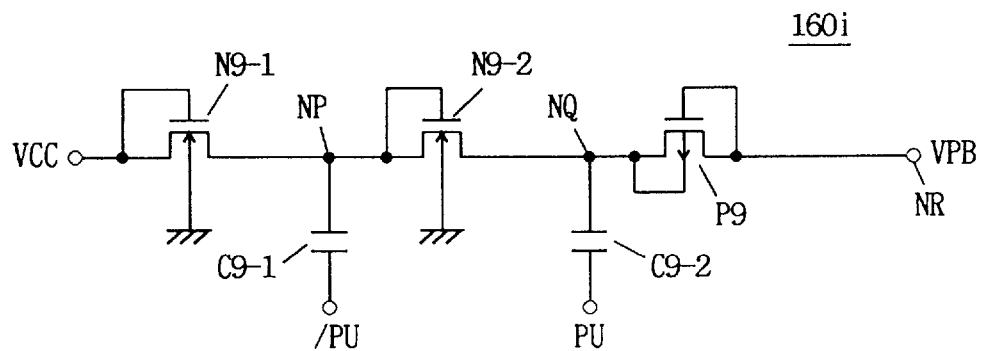
FIG. 19 specifically shows a structure of a second VPB level holding circuit shown in FIG. 9.

FIG. 19 specifically shows a structure of second level holding circuit 160i shown in FIG. 9. In FIG. 19, second VPB level holding circuit 160i includes an n-channel MOS transistor N9-1 which is forwardly diode-connected between power supply node VCC and a node NP, an n-channel MOS transistor N9-2 which is forwardly diode-connected between nodes NP and NQ, a p-channel MOS transistor P9 which is forwardly diode-connected between node NQ and an output node NR, a charge pump capacitor C9-1 which supplies charges to node NP in accordance with a pulse signal /PU, and a charge pump capacitor C9-2 which supplies charges to node NQ in accordance with pulse signal PU.

MOS transistors N9-1 and N9-2 are connected to receive on their back gates the ground potential. The reason why MOS transistors N9-1 and N9-2 are used and are connected to receive on their back gates the ground potential is the same as those already described in connection with the reference voltage generating circuit and the first VPB level holding circuit of the VPB generating circuit. Node NR is connected to node NO in FIG. 17.

Pulse signal PU corresponds to the internal RAS signal which attains the active state of H-level when refreshing is performed in the self-refresh mode. In the refresh operation, the sense amplifier operates, and bit lines are charged and discharged, so that a relatively large substrate current flows. Therefore, the voltage level of bias voltage VPB may lower due to a hot carrier current caused by the substrate current. In order to compensate for the lowering of bias voltage VPB due to the hot carrier current, there is provided second level holding circuit 160i, and therefore charge pump capacitors C9-1 and C9-2 have relatively large capacitances of tens to hundreds of picofarads.

When refreshing is to be performed, pulse signal PU is set to H-level, the voltage level of node NQ rises and MOS transistor P9 is turned on, so that positive charges are supplied to node NR. Therefore, by supplying positive charges to node NR when there is a possibility of lowering of bias voltage VPB, it is possible to suppress lowering of bias voltage VPB, i.e., the substrate bias voltage.

Operation of second VPB level holding circuit 160*i* shown in FIG. 19 is the same as those of the circuits shown in FIGS. 17 and 18 except for that a different kind of repetitive signal is used. In the normal operation mode, pulse signal PU is set to the inactive state of L-level. In this normal operation mode, however, bias voltage VPB is not used, and the select circuit selects power supply voltage VCC for using the same. In this case, therefore, there is no possibility that bias voltage VPB lowers due to an influence of the substrate current, so that it is not particularly necessary to supply charges.

As described above, owing to provision of the second VPB level holding circuit, bias voltage VPB (substrate bias voltage VPBS) can be stably held at an intended voltage level even if refreshing is performed. Also, the operation cycle thereof is the same as the refresh cycle, a current smaller than that (50 $\mu$A) consumed during refreshing is consumed, and increase of the power consumption does not exert a significant influence.

[Structure of Select Circuit]

FIG. 20A shows a specific structure of a select circuit 160*g* shown in FIG. 9. In FIG. 20A, select circuit 160*g* includes a p-channel MOS transistor P2-1 which is connected between a node NU supplied with bias voltage VPB and a node NV, and has a gate connected to a node NS, a p-channel MOS transistor P20-2 which is connected between nodes NU and NS, and has a gate connected to node NV, an n-channel MOS transistor N20-1 which is connected between node NV and the ground node, and has a gate receiving self-refresh activating signal SELF, an n-channel MOS transistor N20-2 which is connected between node NS and the ground node, p- and n-channel MOS transistors P20-3 and N20-3 which form a CMOS inverter inverting self-refresh activating signal SELF, a p-channel MOS transistor P20-4 which is connected between node NU and output node NT, and has a gate connected to node NV, and a p-channel MOS transistor P20-5 which is connected between output node NT and power supply node VCC, and has a gate connected to node NS.

The CMOS inverter formed of MOS transistors P20-3 and N20-3 uses power supply voltage VCC and the ground voltage as its power source voltages. Back gate of each of the above MOS transistors other than p-channel MOS transistor P20-5 is connected to a source of the corresponding transistor. The back gate of p-channel MOS transistor P20-5 is connected to node NU so as to receive bias voltage VPB. If the back gate of MOS transistor P20-5 is connected to receive power supply voltage VCC, charges from bias voltage VPB would flow through the substrate region to power supply node VCC in the MOS transistor P20-5 when the voltage on output node NT attains bias voltage VPB level. The above structure is employed for preventing such leakage.

If the back gate of MOS transistor P20-5 is connected to node NT, substrate bias voltage VPBS would be switched from power supply voltage VCC to bias voltage VPB, so that it would also be necessary to charge the substrate region of MOS transistor P20-5, and thus substrate bias voltage VPBS would rise unpreferably slowly. The above structure also prevents this. By always fixing the back gate of MOS transistor P20-5 at bias voltage VPB, it is possible to prevent the leak current at the substrate region in MOS transistor P20-5, and thus substrate bias voltage VPBS can be rapidly raised to bias voltage VPB level with a lower power consumption. Operation of select circuit 160*g* shown in FIG. 20A will be described below with reference to an operation waveform diagram of FIG. 20B.

The select circuit shown in FIG. 20A is a kind of so-called level converting circuit, and makes conversion from a low voltage signal system to a high voltage signal system with a low power consumption. The structure shown in FIG. 20A uses signal SELF of an amplitude of 2 V to switch substrate bias voltage VPBS between constant voltages, i.e., 2 V (VCC) and 3.4 V (VPB).

In the normal operation mode, self-refresh activating signal SELF is at L-level, MOS transistor N20-1 is off, and MOS transistor N20-2 is turned on in response to the signal at H-level from the CMOS inverter (MOS transistors P20-3 and N20-3). In this state, therefore, node NS is discharged to the ground voltage level by MOS transistor N20-2, MOS transistor P20-1 is turned on, node NV is charged to bias voltage VPB level, and MOS transistor P20-2 is turned off. In this state, therefore, MOS transistor P20-5 is turned on, node NT receives power supply voltage VCC, and substrate bias voltage VPBS at power supply voltage VCC level is supplied.

At this time, MOS transistor P20-4 has the gate voltage at bias voltage VPB level, and is off. When the voltage levels on nodes NS and NV attain L-level and H-level (bias voltage VPB level), respectively, a current other than the subthreshold current does not flow in this level converting circuit. This achieves low current consumption characteristics. Since high speed operation rapidity is not required in select circuit 160*g*, MOS transistors which are components thereof are formed of MOS transistors having high threshold voltages of 0.7 V in order to suppress the subthreshold current.

In the self-refresh mode, self-refresh activating signal SELF is set to H-level. Contrary to the normal operation mode, MOS transistor N20-1 is turned on, and MOS transistor N20-2 is turned off. Thereby, node NV attains the ground potential level, MOS transistor P20-2 is turned on, and MOS transistor N20-2 for discharging node NS is turned off. Thereby, the potential level of node NS rises to bias voltage VPB level, MOS transistor P20-1 is turned off, and node NV is held at the ground potential level. In this state, therefore, MOS transistor P20-4 is turned on, and MOS transistor P20-5 is turned off. Thereby, bias voltage VPB is transmitted to output node NT, resulting in increase of the voltage level of bias voltage VPBS applied to the substrate region of the p-channel MOS transistor formation region in the peripheral circuit.

In the above switching operation, a through current flows only in the CMOS inverter (MOS transistors P20-3 and N20-3), and only slight currents flow in the other portions when switching of node NV or NS to the ground potential is performed, so that reduction of the power consumption can be achieved, and lowering of bias voltage VPB is suppressed.

[Structure of VNBS Generating Portion]

Figure 21:
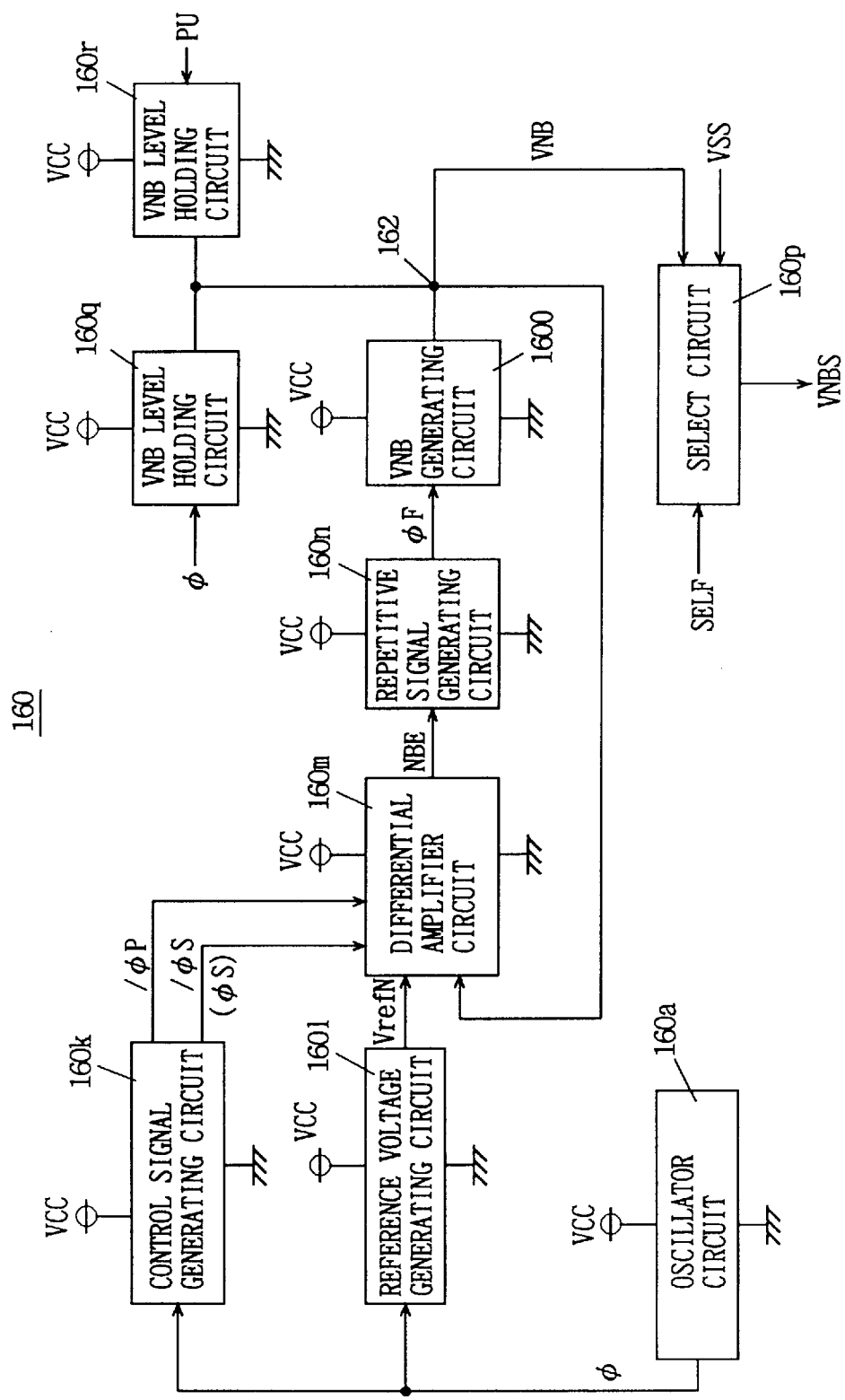
FIG. 21 schematically shows a structure of a portion for generating and supplying a bias voltage to an n-channel MOS transistor substrate region in a peripheral bias circuit.

FIG. 21 shows a structure of a portion generating substrate bias voltage VNBS which is applied to the substrate region of the n-channel MOS transistor (NMOS) transistor. The structure shown in FIG. 21 is included in peripheral bias circuit 160 shown in FIG. 9.

Referring to FIG. 21, the VNBS generating portion in peripheral bias circuit 160 includes a control signal generating circuit 160*k* which is responsive to repetitive signal $\phi$ from oscillator circuit 160*a* to produce control signals /$\phi$P and /$\phi$S having different active periods, a reference voltage generating circuit 160*l* which is responsive to repetitive signal φ to produce a reference voltage VrefN at a constant negative voltage level, a differential amplifier circuit 160*m* which is activated in response to control signals /φP and /φS (φS) to compare reference voltage VrefN with bias voltage VTB on an output node 162 to generate a signal NBE indicative of the result of comparison, a repetitive signal generating circuit 160*n* which is selectively activated in response to signal NBE from differential amplifier circuit 160*m* to generate repetitive signals φF, a VNB generating circuit 160*o* which performs the charge pumping operation to produce negative bias voltage VNB in response to repetitive signal φF, and a select circuit 160*p* which selects one of bias voltage VNB and ground voltage VSS in accordance with self-refresh activating signal SELF and applies the same as substrate bias voltage VNBS.

Oscillator circuit 160*a* is also used as the oscillator circuit for generating bias voltage VPB shown in FIG. 9. These circuits 160*k*–160*o* operate using power supply voltage VCC and ground voltage (VSS) as one and the other operation power source voltages, respectively.

The VNBS generating portion further includes a VNB level holding circuit 160*q* which is responsive to repetitive signal φ to supply negative charges onto output node 162, and a VNB level holding circuit 160*r* which in turn is activated in response to pulse signal PU, which is active during refreshing in the self-refresh mode, to supply negative charges onto output node 162.

VNB level holding circuit 160*q* is required only to supply negative charges for suppressing rise of bias voltage VNB due to a leak current during standby, and therefore has a small charge supply capability.

Meanwhile, VNB level holding circuit 160*r* suppresses rise of bias voltage VNB due to a hot carrier current flowing in the refresh operation, and for this purpose, it supplies negative charges onto output node 162 with a relatively large charge supply capability. Select circuit 160*p* selects bias voltage VNB when self-refresh activating signal SELF is active, and selects ground voltage VSS when self-refresh activating signal SELF is inactive.

Figure 22:
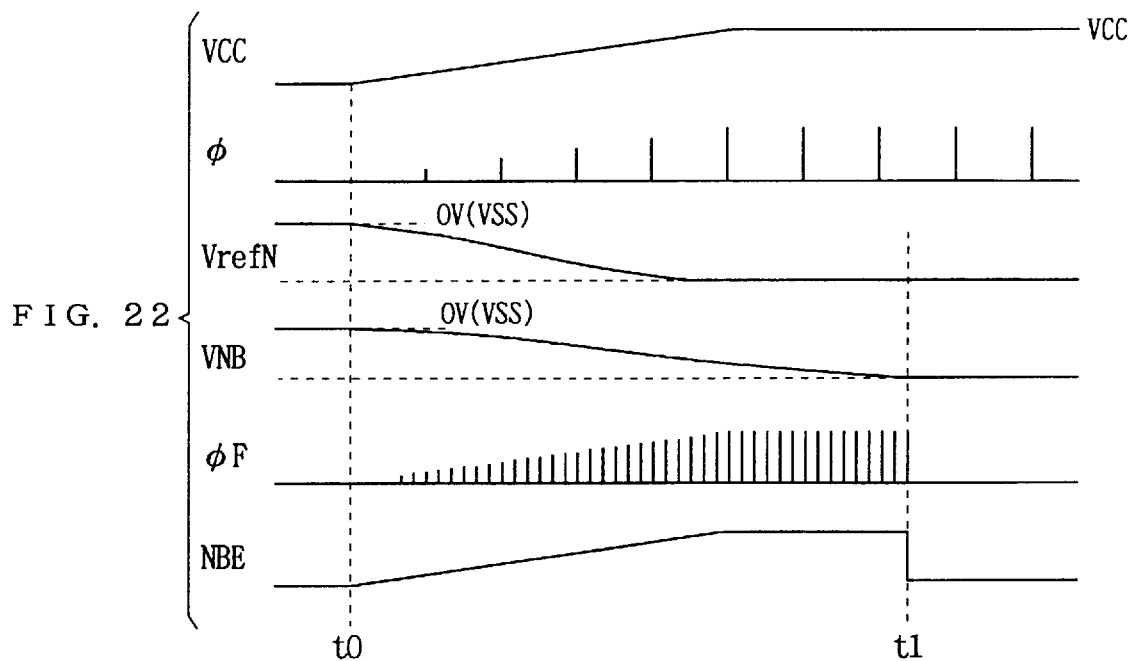

Upon and after power-on, the VNPS generating portion shown in FIG. 21 operates as described below with reference to a waveform diagram of FIG. 22.

At time t0, the power is turned on and power supply voltage VCC rises. Upon this power-on, oscillator circuit 160*a* performs oscillation and generates repetitive signal φ at a predetermined cycle. In accordance with repetitive signal φ, reference voltage generating circuit 160*l* performs the charge pumping operation to produce reference voltage VrefN at the negative voltage level. This reference voltage VrefN performs discharging of only the gate capacitance of the input portion of differential amplifier circuit 160*m*, and reference voltage VrefN rapidly reaches a predetermined voltage level.

Bias voltage VNB is higher (smaller in absolute value) than reference voltage VrefN, so that signal NBE from differential amplifier circuit 160*m* is at H-level (this voltage level rises as power supply voltage VCC rises), and repetitive signal generating circuit 160*n* performs oscillation to generate repetitive signal φF at a predetermined cycle of about 100 ns. In accordance with this repetitive signal φF, VNB generating circuit 160*o* performs the charge pumping operation to supply negative charges to output node 162, so that the voltage level of bias voltage VNB lowers. Since the capacity of output node 162 is large, bias voltage VNB reaches a predetermined voltage level more slowly than reference voltage VrefN.

When bias voltage VNB and reference voltage VrefN become equal to each other at time t1, signal NBE from differential amplifier circuit 160*m* is fixed at L-level, and repetitive signal generating circuit 160*n* stops oscillation. After power-on, VNB generating circuit 160*o* performs the charge pumping operation using repetitive signal φF of a relatively short cycle of about 100 ns received from repetitive signal generating circuit 160*n*, whereby bias voltage VNB at a predetermined voltage level can be produced rapidly.

When bias voltage VNB reaches the predetermined level of reference voltage VrefN, VNB generating potion stops its operation, so that it will no longer consume a current. VNB level holding circuit 160*q* performs the charge pumping in accordance with repetitive signal φ. However, VNB level holding circuit 160*q* performs this operation only for compensating for the leak current, and its current consumption is extremely small and is several nanoamperes. The structure of VNBS generating circuit shown in FIG. 21 is substantially the same as that of VPBS generating circuit shown in FIG. 9 except for that reference voltage VrefN and bias voltage VNB are at negative voltage levels, and that reference voltage VrefP and bias voltage VPB are at positive voltage levels. Structures of respective portions will be described below.

[Structure of Reference Voltage Generating Circuit]

Figure 23:
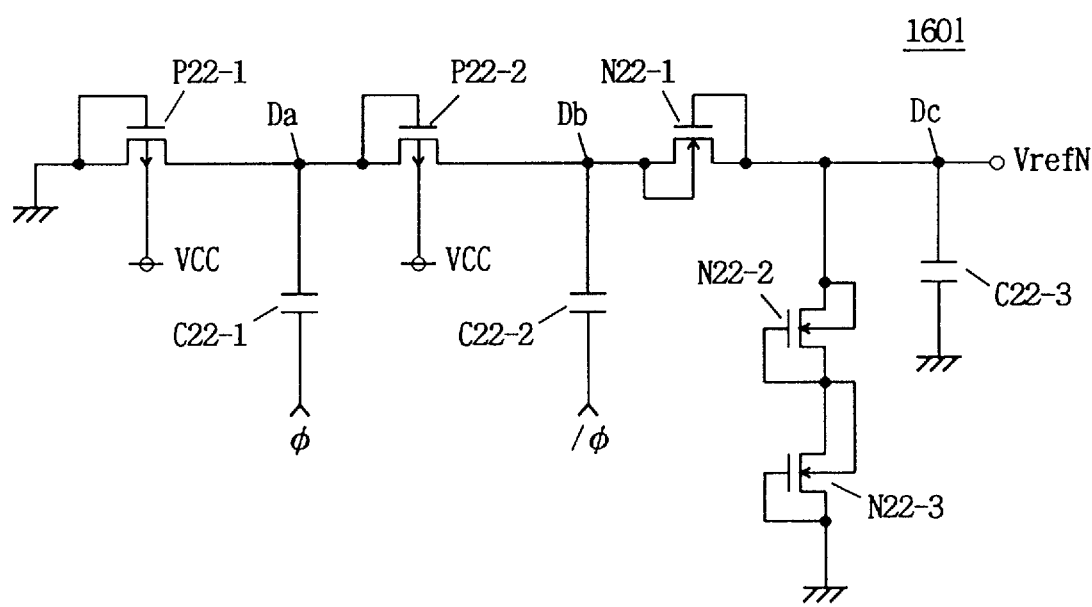
FIG. 23 specifically shows a structure of a reference voltage generating circuit shown in FIG. 21.

FIG. 23 shows a specific structure of reference voltage generating circuit 160*l* shown in FIG. 21. In FIG. 23, reference voltage generating circuit 160*l* includes a p-channel MOS transistor P22-1 which is backwardly diode-connected between the ground node and a node Da, a p-channel MOS transistor P22-2 which is backwardly diode-connected between nodes Da and Db, an n-channel MOS transistor N22-1 which is backwardly diode-connected between nodes Db and Dc, n-channel MOS transistors N22-2 and N22-3 which are mutually connected in series between node Dc and the ground node and are each backwardly diode-connected, a charge pump capacitor C22-1 which supplies charges to node Da in response to repetitive signal φ, a charge pump capacitor C22-2 which supplies charges to node Db in response to repetitive signal /φ, and a stabilizing capacity C22-3 for stabilizing reference voltage VrefN at node Dc.

P-channel MOS transistors P22-1 and P22-2 are connected to receive power supply voltage VCC on their back gates. N-channel MOS transistors N22-1 - N22-3 have their back gates connected to respective sources. P-channel MOS transistors P22-1 and P22-2 are provided for preventing electrical connection between the substrate region and each one conduction node of their MOS transistors, which may occur when the potentials on nodes Da and Db lower due to the charge pumping operation of charge pump capacitors C22-1 and C22-2. P-channel MOS transistors having threshold voltages of a small absolute value are used as p-channel MOS transistors P22-1 and P22-2. The reason for this is to reduce the back gate bias effect and produce reference voltage VrefN at a necessary level. The purpose of provision of such p-channel MOS transistors P22-1 and P22-2 is the same as that of provision of the n-channel MOS transistors in reference voltage generating circuit 160*c* already described with reference to FIG. 12. Operation will now be described below.

When repetitive signal φ is at H-level and repetitive signal /φ is at L-level, positive charges are supplied to node Da, and positive charges are removed from node Db. Since p-channel MOS transistor P22-1 is turned on owing to rise of potential on node Da, node Da is discharged to the ground potential level, and the potential on node Da is clamped at a level of |VTP1|. Here, VTP1 represents a threshold voltage of MOS transistor P22-1. Meanwhile, as the potential on node Db lowers, p-channel MOS transistor P22-2 is reversely biased and thus is turned off, and n-channel MOS transistor N22-1 is turned on, so that positive charges are removed from output node Dc to lower the potential level of node Dc.

When repetitive signal φ attains L-level and repetitive signal /φ attains H-level, the potential on node Db rises, and n-channel MOS transistor N22-1 is turned off. Also, the potential level of node Da lowers, and p-channel MOS transistor P22-2 is turned on, so that the potential on node Db lowers. At this time, p-channel MOS transistor P22-1 is off. By repetitively applying repetitive signals φ and /φ, the potential on node Da changes between |VTP1| and |VTP1|−VCC. When the potential on node Da is at L-level, node Db is precharged, so that the potential on node Db changes between (|VTP1|+|VTP|−VCC) and (|VTP1|+|VTP|−2·VCC).

Since the potential on node Dc is higher than the potential on node Db by a threshold voltage VTN of n-channel MOS transistor N22-1, the potential level of node Dc can lower to a level of VTP+|VTP1|+|VTP2|−2·VCC. However, n-channel MOS transistors N22-2 and N22-3 fix the potential on node Dc to the potential level of −2·VTN. Here, ground voltage VSS is 0 V. By the same manner as that of calculating the output voltage in reference voltage generating circuit 160c already described with reference to FIG. 12, it is possible to obtain the absolute values of threshold voltages of p-channel MOS transistors P22-1 and P22-2, (the absolute values of threshold voltages of MOS transistors P22-1 and P22-2 correspond to threshold voltages VTN1 and VTN2 of MOS transistors N2-1 and N2-2 shown in FIG. 12, respectively).

By using the same conditions, therefore, the following formula can be obtained.

$$|VTP1|=0.7 \text{ (V)}, |VTP2|=0.86 \text{ (V)}$$

Therefore, the voltage V(Dc) generated at output node Dc can be derived from the following formula:

$$\begin{aligned} V(Dc) &= -(2 \cdot VCC - |VTP1| - |VTP2| - VTN) \\ &= -(2 \cdot 2 - 0.7 - 0.86 - 0.7) \\ &= -1.74 \text{ (V)} \end{aligned}$$

The voltage level determined by MOS transistors N22-2 and N22-3 is equal to −2·VTN, and this voltage level determines reference voltage VrefN. Therefore, the voltage level required for reference voltage VrefN is equal to −2·VTN=−2·0.7=−1.4. Accordingly, reference voltage VrefN at the necessary voltage level can be reliably obtained.

[Structure of Differential Amplifier Circuit]

Figure 24A:
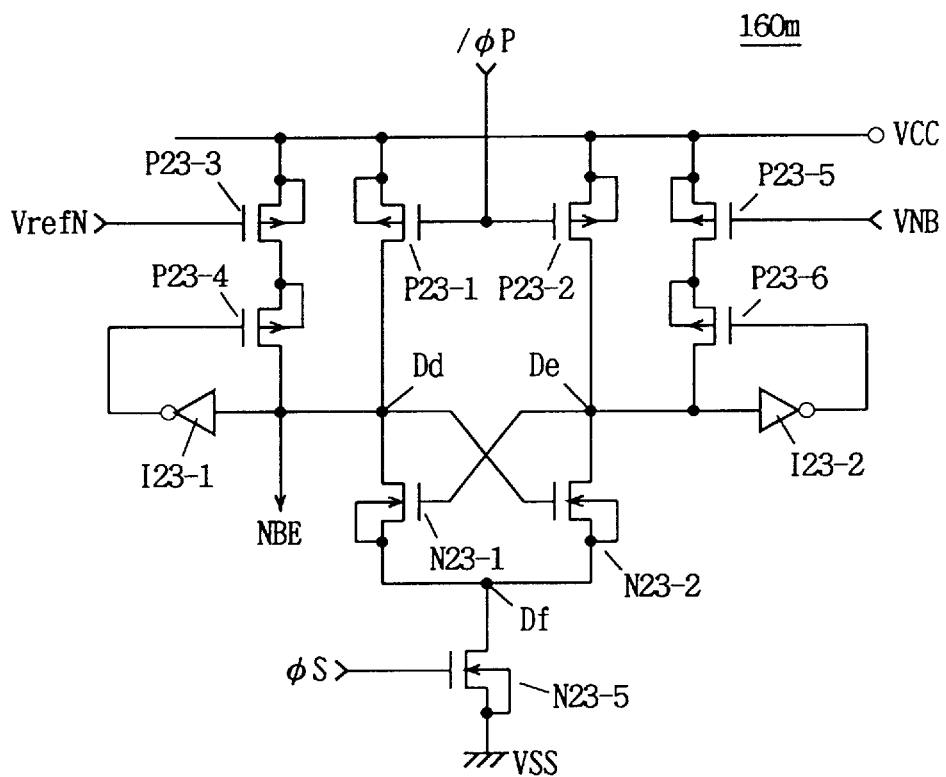
FIG. 24A shows a structure of a differential amplifier circuit shown in FIG. 21.

FIG. 24A shows a specific structure of differential amplifier circuit 160f shown in FIG. 21. In FIG. 24A, differential amplifier circuit 160m includes a p-channel MOS transistor P23-1, which is connected between power supply node VCC and node Dd, and receives control signal /φP on its gate, a p-channel MOS transistor P23-2, which is connected between power supply node VCC and node De, and receives control signal /φP on its gate, an n-channel MOS transistor N23-1, which is connected between nodes Dd and Df, and has a gate connected to node De, an n-channel MOS transistor N23-2, which is connected between nodes De and Df, and has a gate connected to node Dd, and an n-channel MOS transistor N23-5, which is connected between node Df and the ground node (VSS), and has a gate receiving control signal φS on its gate.

P-channel MOS transistors P23-1 and P23-2 have the same size with each other, and is turned on to precharge nodes Dd and De to power supply voltage VCC level when control signal /φP is at L-level. N-channel MOS transistors N23-1 and N23-2 form a flip-flop, and is activated to differentially amplify the potentials on nodes Dd and De when n-channel MOS transistor N23-5 is on.

Differential amplifier circuit 160m further includes p-channel MOS transistors P23-3 and P23-4 which are connected in series between power supply node VCC and node Dd, an inverter I23-1 which inverts the potential on node Dd for application to a gate of p-channel MOS transistor P23-4, p-channel MOS transistors P23-5 and P23-6 which are connected in series between power supply node VCC and node De, and an inverter I23-6 which inverts the potential on node De for application to a gate of p-channel MOS transistor 23-6. Voltages VrefN and VNB are applied to gates of MOS transistors P23-3 and P23-5, respectively.

The structure of differential amplifier circuit 160m shown in FIG. 23 is the same as that of differential amplifier circuit 160d already described with reference to FIG. 14 except for that p-channel MOS transistors P23-3 and P23-5 are used for detecting a difference between voltages VrefN and VNB. In the differential amplifier circuit 160m shown in FIG. 24A, the MOS transistors are symmetrical in size with respect to a vertical direction in FIG. 24A. However, the current drive capability of p-channel MOS transistor P23-5 is slightly smaller (by 5 to 10%) than that of p-channel MOS transistor P23-3. Therefore, a larger current flows from p-channel MOS transistor P23-5 when reference voltage VrefN is equal to bias voltage VNB. Operation is substantially the same as that of the differential amplifier circuit shown in FIG. 14, but will be briefly described below with reference to a waveform diagram of FIG. 24B.

At time t0, both of control signals /φP and φS attain L-level, so that p-channel MOS transistors P23-1 and P23-2 precharge nodes Dd and De to VCC level, respectively. At time t1, control signal /φP rises to H-level, and MOS transistors P23-1 and P23-2 are turned off, so that precharging of nodes Dd and De is completed. At this point of time, control signal φS is still at L-level, and MOS transistor N23-5 is off. Owing to inverters I23-1 and I23-2, p-channel MOS transistors P23-4 and P23-6 are on.

At time t2, control signal φS rises to H-level, so that MOS transistor N23-5 is turned on, and MOS transistors N23-1 and N23-2 start differential amplification. When reference voltage VrefN is lower than bias voltage VNB, the conductance of p-channel MOS transistor P23-3 is larger than that of p-channel MOS transistor P23-5, and a larger current flows from power supply node VCC to node Dd. Therefore, node De is discharged to the ground potential level by MOS transistors N23-2 and N23-5, while node Dd maintains power supply voltage VCC level. In this state, signal NBE maintains H-level.

When nodes Dd and De have their levels changed to H-and L-level, respectively, inverter I23-2 acts to turn off p-channel MOS transistor P23-6, so that a current path from power supply node VCC to node De is cut off. After completion of the comparing operation, therefore, a path of current from power supply node VCC to ground node VSS does not exist, and the current consumption is suppressed.

At time t3, control signals /φP and φS are set to L-level again, and nodes Db and De are precharged to power supply voltage VCC level. At time t4, control signal /φP rises to H-level, and control signal φS rises to H-level at time t5.

When reference voltage VrefN and bias voltage VNB are equal in voltage level to each other, a larger current is supplied to node De, because the current drive capability of p-channel MOS transistor P23-5 is greater than that of p-channel MOS transistor P23-3 as described before. Therefore, node Dd is discharged to the ground potential level. As a result of this potential lowering of node Dd, the output signal of inverter I23-1 attains H-level, and p-channel MOS transistor P23-4 is turned off. In this state, signal NBE from node Dd attains L-level.

Also in this differential amplifier circuit 160m, the active periods of control signals /φP and φS are made different from each other for the purpose of performing comparison (differential amplification) after precharging of nodes Dd and De is completed and such a state is established that nodes Dd and De are surely charged through MOS transistors P23-3 ad P23-5. Since this differential amplifier circuit 160m is not required to have high speed operation ability similarly to the foregoing case, MOS transistors having threshold voltages of a large absolute value are used. This can reduce the subthreshold current.

[Specific Structure of Repetitive Signal Generating Circuit]

FIG. 25 shows a specific structure of repetitive signal generating circuit 160n shown in FIG. 21. In FIG. 25, repetitive signal generating circuit 160n includes five inverters I25-1–I25-5 connected in tandem and an NAND circuit G25 receiving the output signal of inverter I25-4 and signal NBE. The output signal of NAND circuit G25 is applied to the input of first inverter I25-1. Inverter I25-5 generates repetitive signal φF. The structure of repetitive signal generating circuit 160n shown in FIG. 25 is substantially the same as the structure of repetitive signal generating circuit 160e shown in FIG. 16.

NAND circuit G25 and inverters I25-1–I25-5 have an oscillation cycle of about 100 ns, and are not particularly required to have high speed operation ability, so that MOS transistors having large threshold voltages in absolute value are used as their components. Only inverter I25-5 drives VNB generating circuit 160o. Therefore, inverter I25-5 has a large current drive capability, but other inverters I25-1–I25-4 and NAND circuit G25 have a relatively small current drive capability. This achieves reduction of current consumption.

When signal NBE is at L-level, the output signal of NAND circuit G25 is fixed at H-level, and thus repetitive signal φF is fixed at L-level. When signal NBE is at H-level, NAND circuit G25 functions as an inverter, and repetitive signal generating circuit 160n operates as a ring oscillator formed of five cascaded inverters. Thereby, repetitive signal φF changes at a constant period.

[Specific Structure of VNB Generating Circuit]

Figure 26:
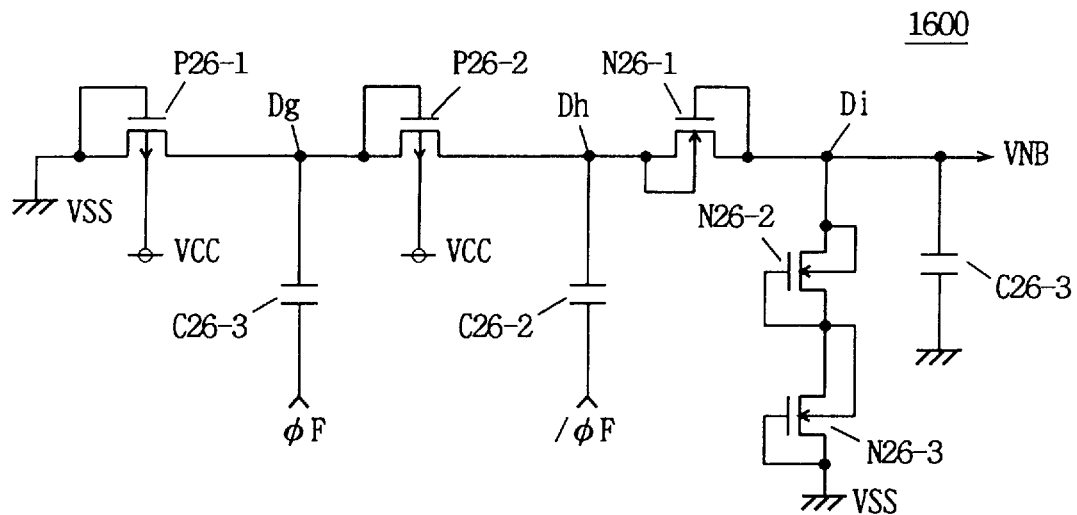
FIG. 26 shows a specific structure of a VNB generating circuit shown in FIG. 21.

FIG. 26 shows a specific structure of VNB generating circuit 160o shown in FIG. 21. In FIG. 26, VNB generating circuit 160o includes a p-channel MOS transistor P26-1 which is backwardly diode-connected between ground node VSS and a node Dg, a p-channel MOS transistor P26-2 which is backwardly diode-connected between nodes Dg and Gh, an n-channel MOS transistor N26-1 which is backwardly diode-connected between nodes Dh and Di, n-channel MOS transistors N26-2 and N26-3 which are mutually connected in series and are each backwardly diode-connected between node Di and ground node VSS, a charge pump capacitor C26-3 which supplies charges to node Dg in response to repetitive signal φF, a charge pump capacitor C26-2 which supplies charges to node Dh in response to repetitive signal /φF, and a stabilizing capacitance C26-3 for stabilizing bias voltage VNB applied from node Di.

The structure of VNB generating circuit 160o shown in FIG. 26 is substantially the same as that of reference voltage generating circuit 160l already described with reference to FIG. 22 except for the repetitive signal applied thereto. Therefore, VNB generating circuit 160o shown in FIG. 26 generates bias voltage VNB at the voltage level of −2·VTN. Here, VTN represents the threshold voltages of MOS transistors N26-2 and N26-3. Also, p-channel MOS transistors P26-1 and P26-2 are used and are connected to receive power supply voltage VCC on their back gates. The reason for this is the same as that already described in connection with reference voltage generating circuit 160l. By performing the charge pumping operation with fast repetitive signals φF and /φF, bias voltage VNB at a constant voltage level can be produced rapidly within a predetermined time.

[Specific Structure of First VNB Level Holding Circuit]

Figure 27:
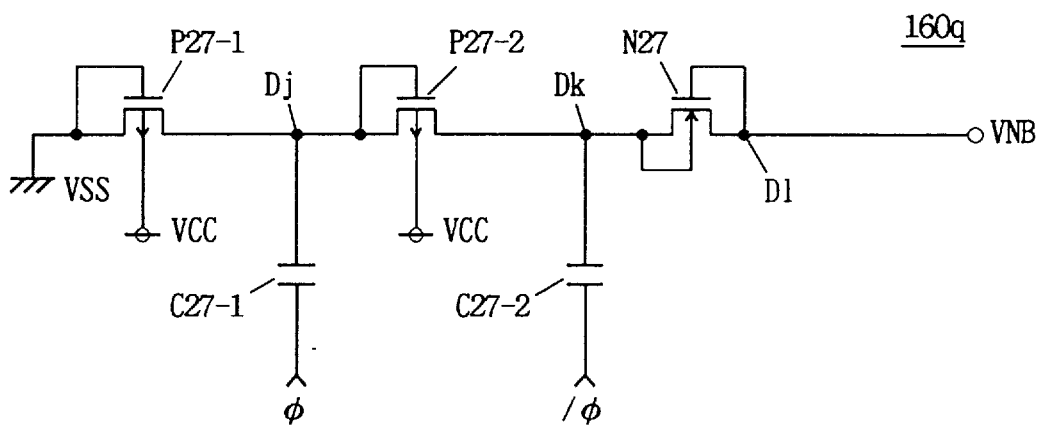
FIG. 27 shows a specific structure of a first VNB level holding circuit shown in FIG. 21.

FIG. 27 shows a specific structure of first VNB level holding circuit 160q shown in FIG. 21. In FIG. 27, first VNB level holding circuit 160q includes a p-channel MOS transistor P27-1 which is backwardly diode-connected between ground node VSS and a node Dj, a p-channel MOS transistor P27-2 which is backwardly diode-connected between nodes Dj and Dk, an n-channel MOS transistor N27 which is backwardly diode-connected between nodes Dk and Dn, a charge pump capacitor C27-1 which supplies charges to node Dj in response to repetitive signal φ, and a charge pump capacitor C27-2 which supplies charges to node Dk in response to repetitive signal /φ.

MOS transistors P27-1 and P27-2 are connected to receive power supply voltage VCC on their back gates. The reason of provision of p-channel MOS transistors P27-1 and P27-2 is the same as that already described in connection with reference voltage generating circuit 160l.

First VNB level holding circuit 160q shown in FIG. 27 is not provided with an n-channel MOS transistor for clamping node D1. This allows the potential on node D1 to reach a value of −2·VCC−|VTP1|−|VTP2|−VTN. However, node D1 is charged to the ground potential by n-channel MOS transistors N26-2 and N26-3 shown in FIG. 26, so that node D1 attains the potential level of −2·VTN.

VNB level holding circuit 160q shown in FIG. 27 compensates only for the leak current during standby, and charge pump capacitors C27-1 and C27-2 each have a small capacitance of several picofarads, so that the current consumption is sufficiently suppressed.

Similarly to the foregoing structure, the structure shown in FIG. 27 uses p-channel MOS transistors P27-1 and P27-2, and their back gates receive power supply voltage VCC for the same reason as that already described in connection with VNB generating circuit 160o shown in FIG. 26. Even when the charge pump operation is always performed in response to repetitive signals φ and /φ, the current consumption can be suppressed sufficiently.

[Specific Structure of Second VNB Level Holding Circuit]

Figure 28:
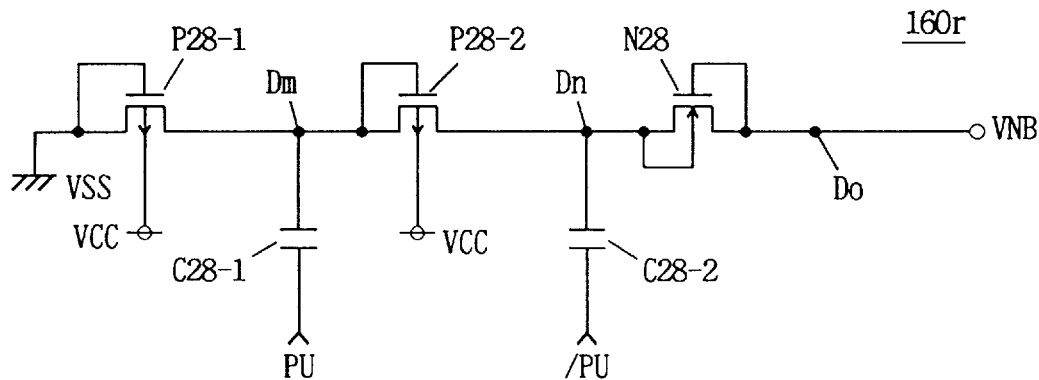
FIG. 28 shows a specific structure of a second VNB level holding circuit shown in FIG. 21.

FIG. 28 shows a specific structure of second VNB level holding circuit 160r shown in FIG. 21. In FIG. 28, second VNB level holding circuit 160r includes a p-channel MOS transistor P28-1 which is backwardly diode-connected between ground node VSS and a node Dm, a p-channel MOS transistor P28-2 which is backwardly diode-connected between nodes Dm and Dn, an n-channel MOS transistor N28 which is reversely diode-connected between nodes Dn and Do, a charge pump capacitor C28-1 which performs a charge pump operation to supply charges to node Dm in accordance with pulse signal PU, and a charge pump capacitor C28-2 which performs a charge pump operation to supply charges to node Dn in accordance with repetitive signal /PU. Node Do is connected to an output node of VNB generating circuit 160o.

Second VNB level holding circuit 160r shown in FIG. 28 has the same structure as first VNB level holding circuit 160q show in FIG. 27, and operates in a similar manner. However, in order to compensate for the level rising of bias voltage VNB due to a hot carrier current during refreshing, it uses a pulse signal corresponding to the internal RALS signal, and charge pump capacitors C28-1 and C28-2 have relatively large capacitances of tens to hundreds of picofarads. When refreshing is performed, pulse signal /PU lowers from H-level to L-level, the potential level of node Dn lowers, positive charges are removed from node Do to node Dn, and the voltage level of bias voltage VNB lowers. This suppresses change of bias voltage VNB which may be caused by the substrate current during refreshing. Similarly to the structure of the holding circuit 160q, second VNB level holding circuit 160r has such a structure that node Do is connected to output node Di of VNB generating circuit 160o shown in FIG. 26, and its potential level is clamped at −2·VTN by MOS transistors N26-2 and N26-3.

[Specific Structure of Select Circuit]

Figure 29A:
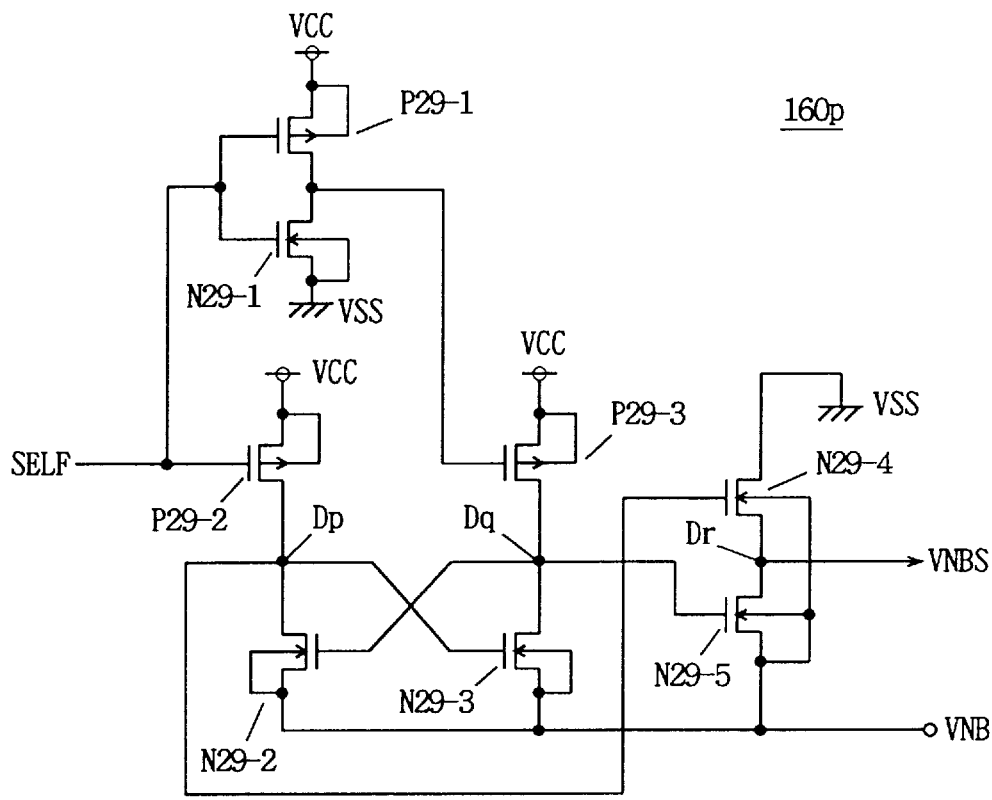
FIG. 29A shows a specific structure of a select circuit shown in FIG. 21.

FIG. 29A shows a specific structure of a select circuit 160p shown in FIG. 21. In FIG. 29A, select circuit 160p includes a p-channel MOS transistor P21-1 and an n-channel MOS transistor N21-1 which form a CMOS inverter inverting self-refresh activating signal SELF, and also includes a p-channel MOS transistor P29-2 which is turned on to transmit power supply voltage VCC to a node Dp when self-refresh activating signal SELF is inactive, a p-channel MOS transistor P29-3 which is turned on to transmit power supply voltage VCC to node Dq when the output signal of the CMOS inverter (MOS transistors P29-1 and N29-1) is at L-level, an n-channel MOS transistor N29-2 which is connected between node Dp and bias node VNB (a voltage and a node corresponding thereto are indicated by the same reference character) and has a gate connected to node Dq, an n-channel MOS transistor N29-3 which is connected between node Dq and bias node VNB, and has a gate connected to node Dp, an n-channel MOS transistor N29-4 which is turned on to transmit ground voltage VSS to node Dr when the potential on node Dp is at H-level, and an n-channel MOS transistor N29-5 which is turned on to transmit bias voltage VNB to output node Dr when the potential on node Dq is at H-level. Substrate bias voltage VNBS is generated from node Dr.

Transistors other than n-channel MOS transistor N29-4, i.e., MOS transistors P29-1–P29-3, N29-1–N29-3 and N29-5 have their back gates connected to their respective sources. The back gate of MOS transistor N29-4 is connected to receive bias voltage VNB for the following purpose. When negative bias voltage VNB is transmitted to output node Dr, forward bias is applied between N+ region and P-type substrate region in MOS transistor N29-4, so that a current from ground node VSS to output node Dr is prevented from flowing.

Figure 29B:
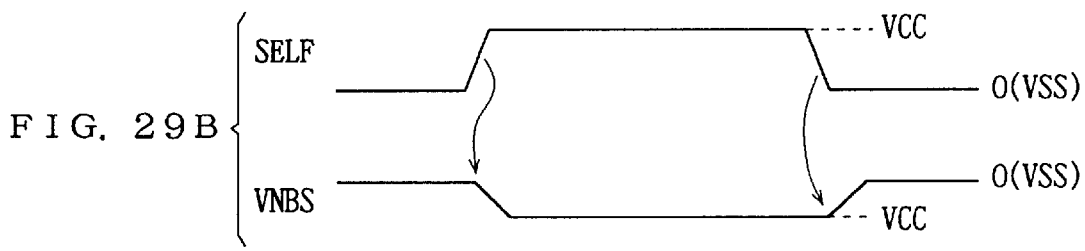
FIG. 29B is a waveform diagram representing an operation of the circuit shown in FIG. 29A.

If the back gate of MOS transistor N29-4 were connected to output node Dr, the substrate region would be discharged concurrently with switching of output node Dr from ground voltage VSS to bias voltage VNB, so that substrate bias voltage VNBS could not change quickly. For the above reason, the back gate of MOS transistor N29-4 is connected to receive bias voltage VNB. Operation of the select circuit shown in FIG. 29A will be described below with reference to an operation waveform diagram of FIG. 29B.

When self-refresh activating signal SELF is at L-level, the output signal of CMOS inverter (MOS transistors P29-1 and N29-1) is at L-level, MOS transistor P29-2 is on, and MOS transistor P29-3 is off. Node Dp is charged to power supply voltage VCC level, MOS transistor N29-3 is turned on, and the potential on node Dq lowers to bias voltage VNB level. In response to potential lowering of node Dq, MOS transistor N29-2 is turned off. In this state, MOS transistor N29-4 is turned on, MOS transistor N29-5 is turned off, and substrate bias voltage VNBS from output node Dr attains ground voltage VSS level.

When self-refresh activating signal SELF attains the active state of H-level, MOS transistor P29-2 is turned off, and MOS transistor P29-3 is turned on. Node Dq is charged by MOS transistor P29-3, and MOS transistor N29-2 is turned on to lower the potential on node Dp. Finally, node Dq attains the potential of power supply voltage VCC level, and node Dp attains the voltage level of bias voltage VNB level. Thereby, MOS transistor N29-4 is turned off, and MOS transistor N29-5 is turned on, so that substrate bias voltage VNBS applied from output node Dr lowers to bias voltage VNB level. Since substrate bias voltage VNBS is transmitted to the substrate region having a relatively large capacitance, substrate bias voltage VNBS changes relatively slowly. The bias voltage of the substrate region of the n-channel MOS transistor in the peripheral circuit has a large absolute value, the threshold voltage thereof increases, and thus subthreshold current is reduced.

Similarly to the foregoing structure, select circuit 160p shown in FIG. 29A has such a structure that, in the stable or steady state after switching of the substrate bias voltage, all the MOS transistors which are the components are off, and a DC current scarcely flow. The MOS transistors which are the components are not required to have high speed operation ability, and hence have large threshold voltages. Although the voltages on nodes Dp and Dq change between power supply voltage VCC and bias voltage VNB, this change is made for establishing a strong on-state of MOS transistors N29-4 and N29-5 at the output stage. Such a structure may be employed that the voltage levels on nodes Dp and Dq change between ground voltage VSS and bias voltage VNB.

[Structures of Transistors in Peripheral Circuit]

FIG. 30A schematically shows a cross-sectional structure of MOS transistors which are components of the peripheral circuit. In FIG. 30A, the peripheral circuit includes a p-channel MOS transistor PT and an n-channel MOS transistor NT, which are formed with a space therebetween at N-wells (N-type substrate regions) 402 and 410 formed at a surface of P-type semiconductor substrate or semiconductor layer 400.

P-channel MOS transistor PT includes P+ regions 403 and 405 which are formed being spaced away from each other at the surface of N-well 402, and a gate electrode 409 which is formed on a channel region between P+ regions 403 and 405 with a gate insulating film 408 therebetween. Substrate bias voltage VPBS is applied to N-well 402 via an N+ region 407.

N-well 410 is supplied with power supply voltage VCC via an N+ region 411, and a P-well (P-type substrate region) 420 is formed at the surface of N-well 410. N-channel MOS transistor NT is formed at P-well 420. N-channel MOS transistor NT includes N+ regions 423 and 425 which are formed with a space therebetween at the surface of P-well 420, and a gate electrode 429 which is formed on a channel region between N+ regions 423 and 425 with a gate insulating film 428 therebetween. P-well 420 receives substrate bias voltage VNBS via P+ region 427.

P+ region 405 and N+ region 425 are connected together to generate an output signal OUT. Gate electrodes 409 and 429 are connected together to receive an input signal IN.

The structure shown in FIG. 30A has a structure of a CMOS inverter, as can be seen from an electrically equivalent circuit diagram of FIG. 30B. More specifically, gates of p-channel MOS transistor PT and n-channel MOS transistor NT receive input signal IN via input node Ti, and drains of MOS transistors PT and NT are commonly connected to an output terminal To to generate output signal OUT. MOS transistor PT receives substrate bias voltage VPBS on its back gate; and MOS transistor NT receives substrate bias voltage VNBS on its back gate.

Generally, in a CMOS circuit, a latch-up phenomenon, i.e., turn-on of a parasitic thyristor may occur when a source potential (i.e., potential on a node connected to a power supply node) of a p-channel MOS transistor exceeds a sum of substrate potential VPBS and a diffusion potential (forward voltage drop across a P/N junction). Particularly, when the power is turned on, power supply voltage VCC at P+ region 403 rises more rapidly than substrate bias voltage VPBS rising to the power supply voltage level (due to a large parasitic capacitance of a well), so that this latch-up phenomenon is liable to occur.

P-well 420 which provides the substrate region for forming n-channel MOS transistor NT is surrounded by N-well 410, and power supply voltage VCC is applied to N-well 410 Via N+ region 411. Thereby, in the case where a current flows from P+ region 403 forming the source region of p-channel MOS transistor PT to N-well 402 and a base current of a parasitic bipolar transistor flows to P-well 420, N-well 410 can absorb such currents, so that the CMOS latch-up phenomenon can be prevented.

As shown in FIG. 30A, n-channel MOS transistor NT has a triple well structure which is formed of the P-type substrate, the N-well formed at the surface thereof, and the P-well formed at the surface of the N-well. Therefore, the base current of the parasitic bipolar transistor can be absorbed by N-well 410, and the parasitic thyristor is kept off, so that occurrence of the latch-up phenomenon can be reliably suppressed.

FIGS. 30A and 30B show a structure of the CMOS inverter. However, even a logic gate of another CMOS structure such as an NAND circuit or a NOR circuit can similarly utilize such a triple well structure, so that the latch-up phenomenon can be surely suppressed.

[Structure of Array Bias Circuit]

Figure 31:
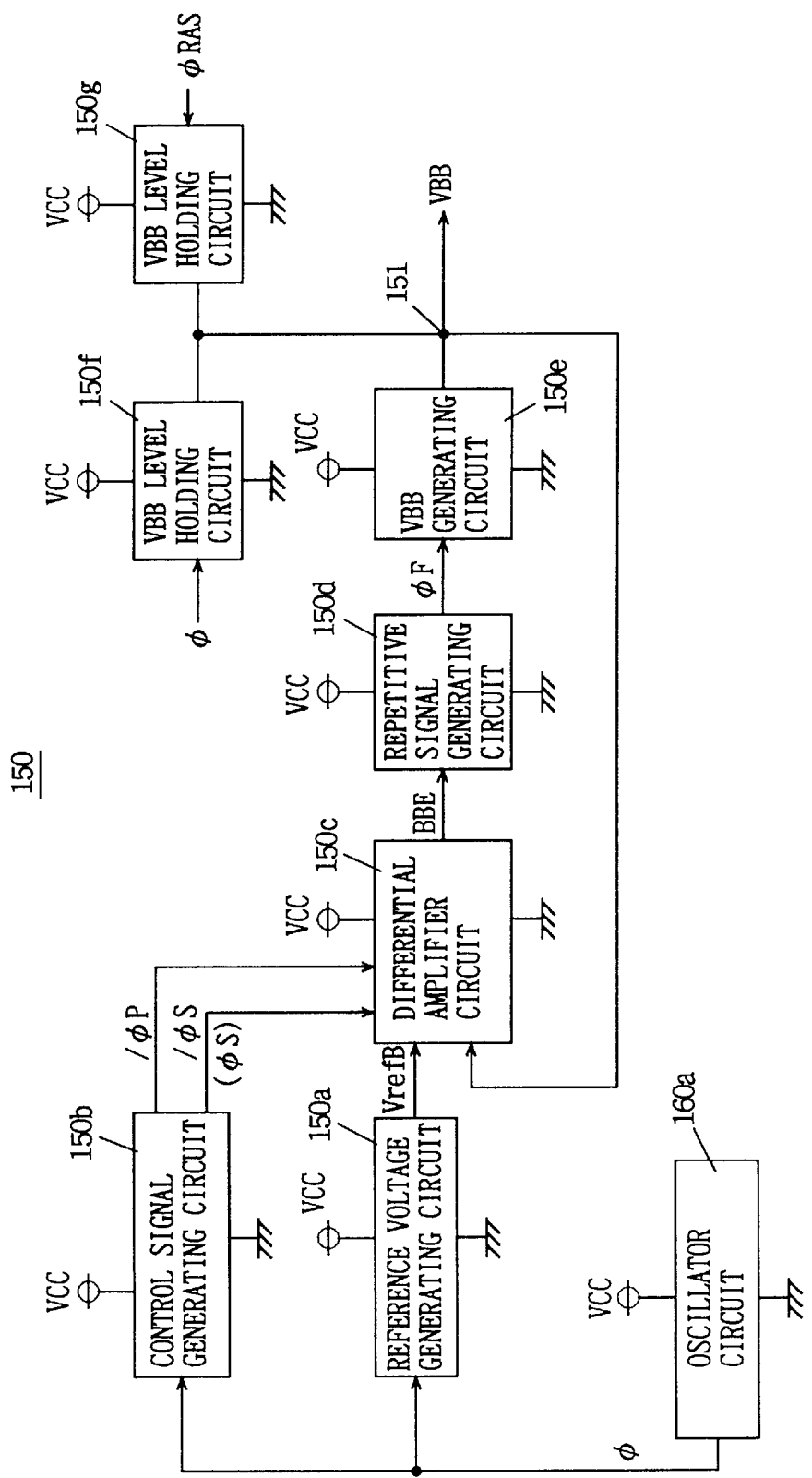
FIG. 31 is a block diagram showing a structure of an array bias circuit shown in FIG. 3.
Figure 33:
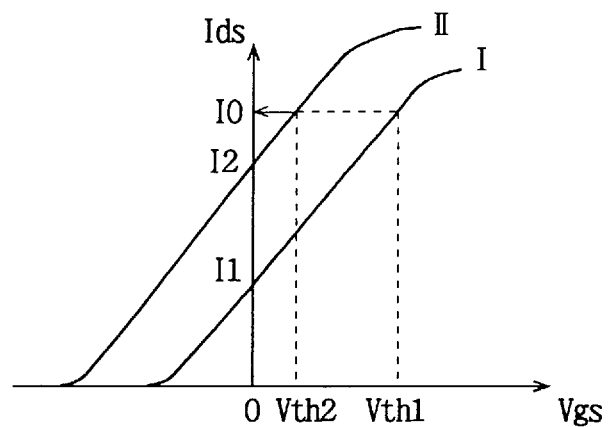
FIG. 33 illustrates a subthreshold current of an MOS transistor.
Figure 34:
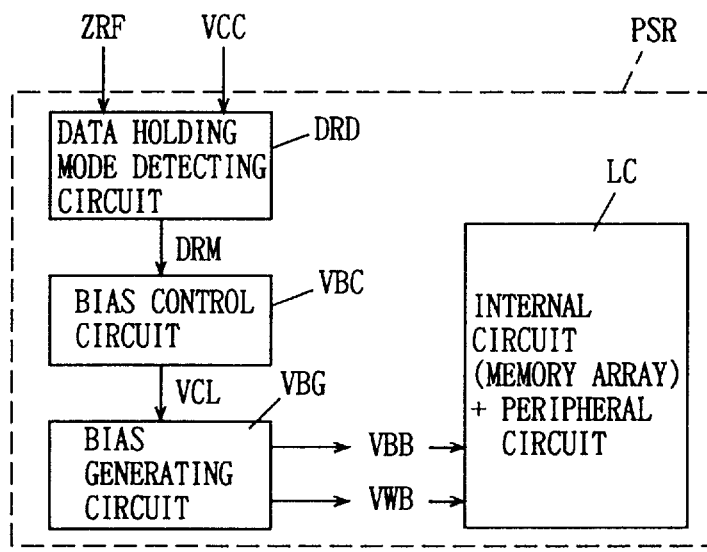
FIG. 34 schematically shows a structure of a semiconductor memory device in the prior art.
Figure 35:
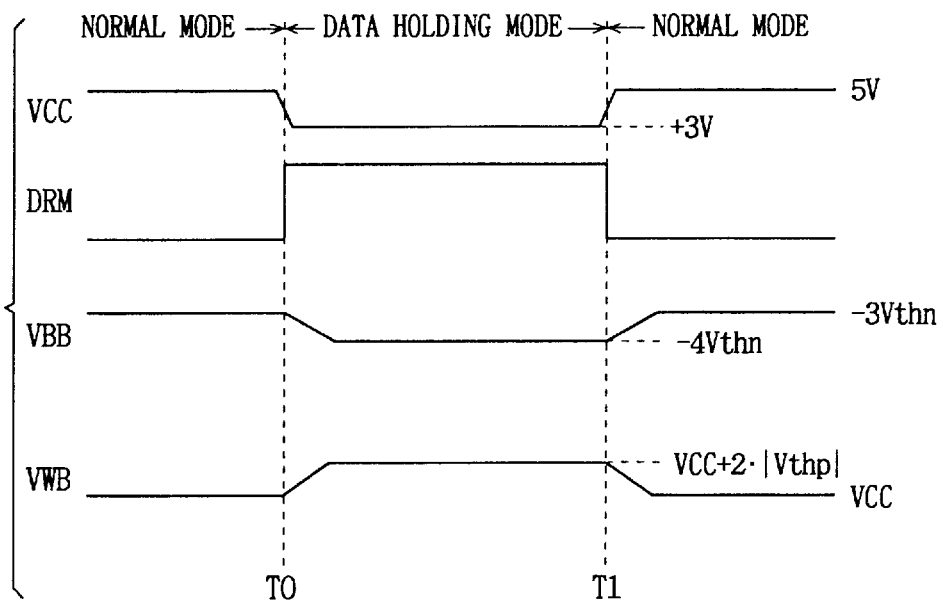
FIG. 35 is a waveform diagram representing an operation of the semiconductor memory device shown in FIG. 34.
Figure 36:
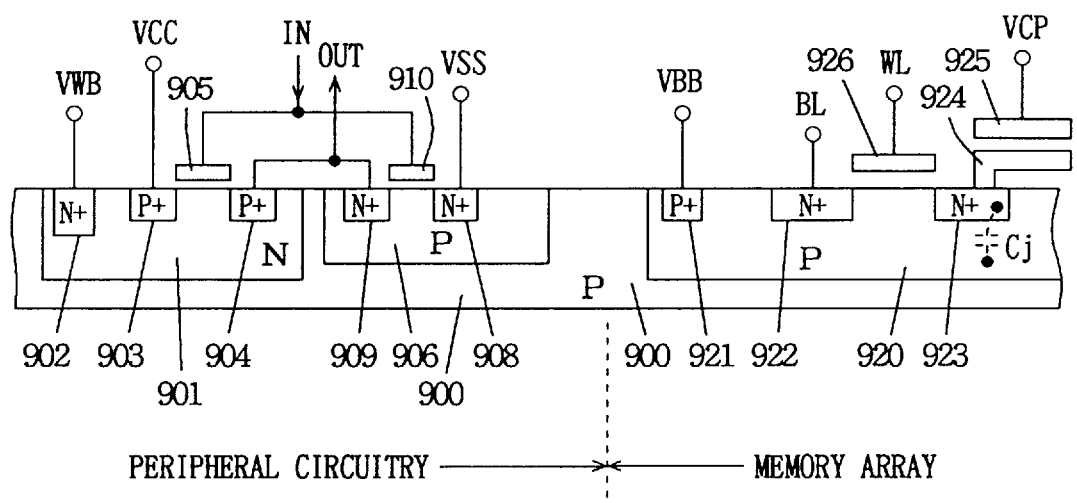
FIG. 36 schematically shows a sectional structure of an MOS transistor which is a component of an internal circuit shown in FIG. 34.

FIG. 31 is a block diagram showing a specific structure of array bias circuit 150 shown in FIG. 3. In FIG. 31, array bias circuit 150 includes a reference voltage generating circuit 150a which produces a constant reference voltage VrefB in accordance with repetitive signal φ from oscillator circuit 160a, a control signal generating circuit 150b which produces control signals /φP and /φS (φS) in response to repetitive signal φ, a differential amplifier circuit 150c which is selectively set to a precharge state and an operating state in accordance with control signals /φP and /φS (φS), and makes comparison between reference voltage VrefB and bias voltage VBB of output node 151 when it is in the operating state, a repetitive signal generating circuit 150d which repetitively issues repetitive signal φF when an output signal BBE of differential amplifier circuit 150c is active, a VBB generating circuit 150e which is responsive to repetitive signal φF to perform a charge pumping operation for producing bias voltage VBB, a VBB level holding circuit 150f which is responsive to repetitive signal φ to perform a charge pumping operation for supplying charges to node 151, and a VBB level holding circuit 150g which is responsive to internal RAS signal φRAS to perform a charge pumping operation for supplying charges to output node 151.

Oscillator circuit 160a used in array bias circuit 150 is common to oscillator circuit 160a used in peripheral bias circuit 160 described before. However, separate and independent oscillator circuits may be arranged for array bias circuit 150 and peripheral bias circuit 160, respectively. Reference voltage generating circuit 150a has a structure similar to that of reference voltage generating circuit 160l shown in FIG. 23, and produces reference voltage (negative voltage level) VrefB at a constant voltage level.

Control signal generating circuit 150b has a structure similar to that of control signal generating circuit 160b shown in FIG. 13A. Although control signal generating circuit 150b may be used commonly as control signal generating circuits 160b and 160k in the peripheral bias circuit, this results in such a state that the operation timing of differential amplifier circuit in peripheral bias circuit 160 has to be coincident with that in the array bias circuit 150, and the current consumption upon comparing operation increases. Therefore, the differential amplifier circuits are provided independently for slightly shifting the timings from each other.

Figure 24B:
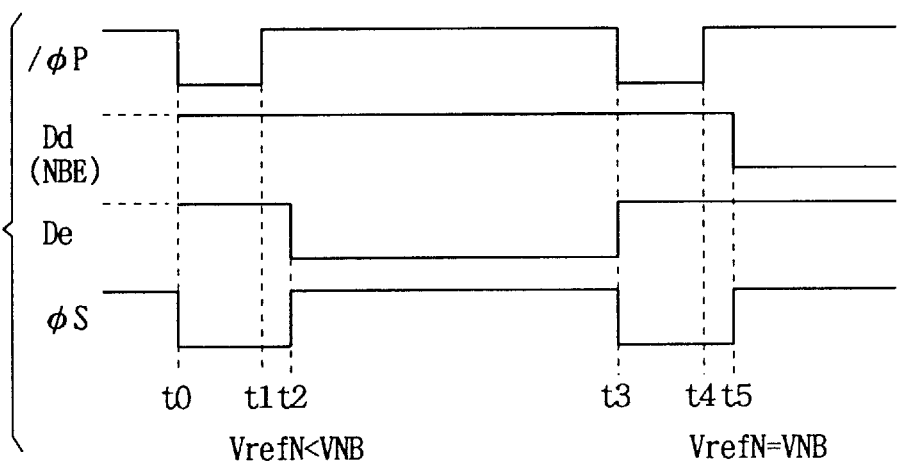
FIG. 24B is a waveform diagram representing an operation of the circuit shown in FIG. 24A.

The structure of differential amplifier circuit 151c is the same as that shown in FIG. 24A except for that bias voltage VBB is applied instead of bias voltage VNB in FIG. 24B, and signal BBE is generated instead of signal NBE.

The structure of repetitive signal generating circuit 150d is the same as that of repetitive signal generating circuit 160n shown in FIG. 25, but uses signal BBE instead of signal NBE in the structure shown in FIG. 25.

VPB generating circuit 150e has a structure similar to that of VNB generating circuit shown in FIG. 26. In this structure, if bias voltage VBB at the array substrate region is different in voltage level from bias voltage VNB at the substrate region in the peripheral circuit, the number of n-channel MOS transistors (N26-2 and N26-3) for clamping is adjusted depending on these different voltage levels, and the number of MOS transistors P26-1, P26-2 and N26-1 is also adjusted appropriately.

VBB level holding circuit 150f has the same structure as VNB level holding circuit 160q shown in FIG. 27, and compensates for rise of bias voltage VBB due to a leak current with a small charge supply capability during standby (normal operation mode) and data holding mode (self-refresh mode).

VBB level holding circuit 150g has a structure similar to that of VNB level holding circuit 160r shown in FIG. 28. However, VBB level holding circuit 150g performs a charge supply operation (charge pump operation) in accordance with internal RAS signal φRAS and suppresses rise of bias voltage VBB of the substrate region in the array. In either of the normal operation mode and data holding mode (self-refresh mode), therefore, VBB level holding circuit 150g performs the charge pumping operation to supply charges to node 151, when the memory cell selecting operation is performed.

[Modification]

Figure 32:
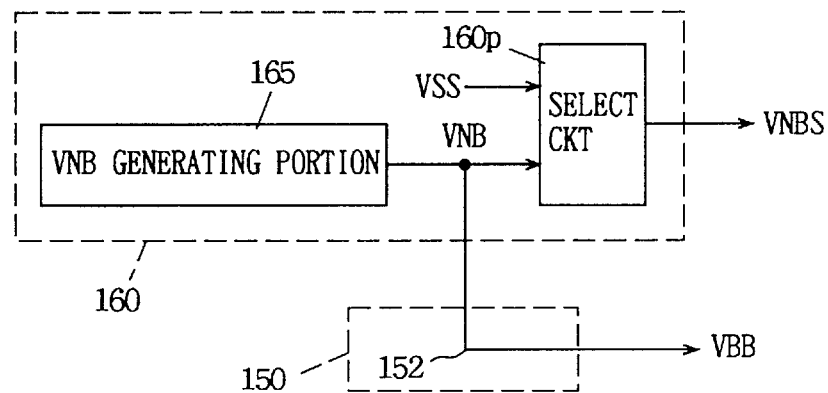
FIG. 32 shows a structure of a modification of the array bias circuit shown in FIG. 3.

FIG. 32 shows a structure of a modification of the array bias circuit. In FIG. 32, array bias circuit 150 applies bias voltage VNB, which is supplied from a VNB generating portion 165 included in peripheral bias circuit 160, as substrate bias voltage VBB to the substrate region of array via an interconnection 152.

In the structure shown in FIG. 32, the transistor of memory cell receives substrate bias voltage VNB on its back gate, so that its threshold voltage is large. In this case, the n-channel MOS transistor, which is a component of the peripheral circuit, and the memory cell transistor may be formed of MOS transistors having different threshold voltages, whereby the threshold voltage of memory cell transistor can be set to an appropriate value.

The array bias circuit 150 may have the same structure as VNB generating portion 155 included in peripheral bias circuit 160, whereby substrate bias voltage VBB can be stably produced with a low current consumption.

[Another Structure]

In the embodiment described above, the self-refresh mode has been described as the data holding mode. Such a structure may be employed that the data holding mode of semiconductor memory device is designated in accordance with a condition other than the CBR condition and the condition of holding signals /RAS and /CAS at L-level for a predetermined time.

The peripheral bias circuit selects one of the power supply voltage (VCC or VSS) and the bias voltage, and applies the same to the peripheral circuit substrate region. Such a structure may be utilized that two kinds of bias voltages are prepared, and one of them is selected depending on the operation mode and is applied to the substrate region in the peripheral circuit. Since the power supply voltage may be either of operation power supply voltage VCC and ground voltage VSS, the power source voltage in the appended claims includes both of them.

According to the invention, as described hereinabove, the bias potential of the substrate region in the memory array is fixed, and the bias potential of the substrate region in the peripheral circuit is increased in absolute value in the data holding mode. Therefore, the current consumption in the data holding mode can be reduced without adversely affecting the storage data of memory cell.

Since the bias potential on the substrate region in the peripheral circuit is selected from one of the power supply voltage (VCC or VSS) and the bias voltage of a larger absolute value, it is required to produce only one bias voltage for one power supply voltage, so that the circuit structure can be simple, and an area occupied by the circuit can be reduced.

The substrate region of the transistor which is a component of the peripheral circuit has the triple well structure including first and second wells, and the lower first well is biased to the power supply voltage. Therefore, the latch-up phenomenon can be reliably prevented even in the CMOS circuit, and the peripheral circuit can stably operate.

Since the bias potentials of large absolute values in the data holding mode are set for both the insulated gate type field-effect transistor of first and second conductivity types, the subthreshold current can be surely suppressed regardless of the potential levels to which the input and output signals of CMOS circuit are set in the data holding mode, and thus the current consumption can be reduced.

The insulated gate type field-effect transistor of the first conductivity type in the peripheral circuit is formed at the first well, and the second insulated gate field-effect transistor is formed at the substrate region of the triple well structure, so that the latch-up phenomenon of this peripheral circuit can be surely suppressed.

The peripheral bias circuit is formed of a circuit which performs the charge pumping operation to generate the reference voltage in accordance with the periodically generated repetitive signal, the comparing circuit which makes comparison between the reference voltage and the bias voltage in accordance with the control signal produced in response to this repetitive signal, the repetitive signal generating circuit which generates the second repetitive signal in accordance with the output signal of the comparing circuit, and the bias circuit which performs the charge pumping operation to generate the bias voltage to the output node in accordance with the second repetitive signal. Owing to this structure, the charge pumping operation is performed to supply charges to the output node only when the absolute value of the bias voltage is less than a predetermined value, and the comparing circuit performs the comparison only when it is active. Therefore, the current consumption of the peripheral bias circuit can be reduced.

There are provided the first bias holding circuit which performs the charge pumping operation with a small charge supply capability to supply charges to the output node in accordance with the clock signal, and a second bias holding circuit which operates with a relatively large charge supply capability to supply charges to the output node in accordance with the memory cell selection start instructing signal. Owing to this structure, it is possible to surely suppress reduction of the absolute value of bias voltage, and the bias voltage at an intended voltage level can be produced stably.

Since the comparing circuit is formed of a precharge circuit which precharges the first and second nodes to predetermined potentials when the first control signal is active, the differential amplifier circuit which is activated to amplify differentially the potentials on the first and second nodes when the second control signal is active, and the comparison stage which compares the reference potential with the bias potential on the output node, and supplies the current corresponding to the difference between them to the first and second nodes. Owing to this structure, it is possible to suppress a DC-wise current (i.e., current flowing from the power supply node to the ground node) during operations other than the operation at the time of completion of the comparing operation and the precharge operation, so that the current consumption can be reduced.

In the comparison stage, the insulated gate type field-effect transistor for comparing the reference voltage with the bias voltage is arranged between the first and second nodes, and is operable to cut off a current path from the power supply node to one of the first and second nodes when the one of the nodes is at L-level. Thereby, it is possible to suppress surely current flow from the power supply node through the one of the nodes and the differential amplification stage, so that the current consumption can be reduced.

The select circuit for switching the bias voltage is formed of the stage for converting the voltage level of the data holding mode instruction signal, and the switching stage for generating one of the power supply voltage and the bias voltage as the substrate bias voltage in accordance with the signal from the level converting stage. The back gate of the insulated gate type field-effect transistor at the switching stage is connected to receive the bias voltage. Owing to this structure, it is possible to suppress current flow to the substrate region of the insulated gate type field-effect transistor at this switching stage, and thus the current consumption can be reduced.

The level converting stage may be formed of a level converting circuit of a latch type, in which case it is possible to surely intercept a current flowing from the power supply node to the ground node after completion of the level conversion.

Even from the power supply voltage of 2.0 V, the bias voltage at the required voltage level can be surely produced with a low current consumption.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a memory cell array including a plurality of memory cells arranged in rows and columns;
   array bias means for supplying a constant bias voltage to a memory substrate region having said memory cell array formed thereat;
   a peripheral circuit for driving said memory cell array to a selected state; and
   peripheral bias means for supplying a bias voltage to a peripheral substrate region having said peripheral circuit formed thereat, said peripheral bias means including bias control means for rendering the bias voltage supplied by said peripheral bias means during a data holding mode, larger in absolute value than that during a normal mode of operation different than said data holding mode, while said constant bias voltage supplied to said memory substrate region is maintained constant at a common value regardless of mode.

2. The semiconductor memory device according to claim 1, wherein said peripheral bias means includes:
   bias generating means for generating a voltage larger in absolute value than a power source voltage, and
   selecting means for selecting the voltage generated by said bias generating means in response to activation of said data holding mode, selecting said power source voltage in response to deactivation of said data holding mode, and supplying the selected voltage to the peripheral substrate region having said peripheral circuit formed thereat.

3. The semiconductor memory device according to claim 1, wherein
   said peripheral circuit includes a transistor element formed at a second well formed at a surface of a first well formed at a surface of a semiconductor layer of a first conductivity type,
   said first well has a second conductivity type and being biased to a power source voltage, and
   said second well has the first conductivity type and receives the bias voltage from said peripheral bias means.

4. The semiconductor memory device according to claim 1, wherein
   said peripheral circuit includes a first insulated gate field-effect transistor of a first conductivity type, and a second insulated gate field-effect transistor of a second conductivity type;
   said peripheral bias means includes:
      means for producing a first bias voltage applied to a substrate region having said first insulated gate field-effect transistor formed thereat, and
      means for producing a second bias voltage applied to a substrate region having said second insulated gate field-effect transistor formed thereat; and
      said bias control means includes means for increasing in absolute value both of said first and second bias voltages in response to activation of said data holding mode.

5. The semiconductor memory device according to claim 4, further comprising:
   a first power source that generates a first operation power source voltage, and
   a second power source that generates a second operation power source voltage, wherein
      said first insulated gate field-effect transistor is formed at a first well of the second conductivity type formed at a surface of a semiconductor layer of the first conductivity type, said first well supplied with said first bias voltage,
      said second insulated gate field-effect transistor is formed at a third well formed at a surface of a second well formed at the surface of said semiconductor layer, said second well spaced from said first well,
      said second well has said second conductivity type and is supplied with said first operation power source voltage,
      said third well has said first conductivity type and is supplied with said second bias voltage, and
      said first bias voltage is equal to or larger in absolute value than said first operation power source voltage, and said second bias voltage is equal to or larger in absolute value than said second operation power source voltage.

6. The semiconductor memory device according to claim 1, wherein said peripheral bias means includes:
   clock generating means for periodically generating a clock signal,
   reference voltage generating means for performing a charge pumping operation to generate a reference voltage in response to said clock signal,
   control signal generating means for producing a comparison control signal, in response to said clock signal, that controls a comparison performed on said reference voltage with a voltage of an output node,
   comparing means responsive to said comparison control signal for generating a signal indicative of a result of said comparison,
   repetitive signal generating means activated for periodically generating a repetitive signal when the result of said comparison of said comparing means indicates that said reference voltage is larger in absolute value than the voltage of said output node, and
   bias generating means for performing a charge pumping operation to generate the bias voltage to said output node in accordance with the repetitive signal received from said repetitive signal generating means.

7. The semiconductor memory device according to claim 6, wherein
   said peripheral bias means further includes:
   first bias holding means for performing a charge pumping operation to supply charges to said output node in response to said clock signal, and having a charge supply capability smaller than a charge supply capability of said bias generating means, and
   second bias holding means for performing a charge pumping operation to supply charges to said output node in response to a memory cell selection start instructing signal for refreshing, and having a charge supply capability larger than that of said firs t bias holding means.

8. The semiconductor memory device according to claim 6, wherein
   said control signal generating means include means, responsive to said clock signal, for generating first and second control signals having non-overlapping active time periods with each other; and
   said comparing means includes:
      precharge means for precharging first and second nodes to a predetermined potential in response to activation of said first control signal,
      a comparison stage for making a comparison between said reference voltage and the voltage on said output node, and supplying currents corresponding to a difference between said reference voltage and the voltage on said output node to said first and second nodes, respectively, and a differential amplifier stage activated in response to activation of said second control signal, for differentially amplifying the voltages on said first and second nodes, and for generating the signal indicative of the result of said comparison as said bias voltage.

9. The semiconductor memory device according to claim 8, wherein said comparison stage includes:

a first insulated gate field-effect transistor coupled between a power source node and the first node for receiving on its gate said reference voltage, first cutting means coupled to receive the voltage on said first node, and responsive to the voltage on said first node for cutting off a current path formed via said first insulated gate field-effect transistor between said power source node and said first node, a second insulated gate field-effect transistor coupled between said power source node and the second node for receiving on its gate the voltage on said output node, and second cutting means coupled to receive the voltage on said second node, and responsive to the voltage on said second node for cutting off a current path formed via said second insulated gate field-effect transistor between said power source node and said second node.

10. The semiconductor memory device according to claim 2, further comprising:

a first power source that generates a first operation power source voltage, and a second power source that generates a second operation power source voltage; and said selecting means includes:

level converting means for converting a data holding mode designating signal to a first level signal at a level at said bias voltage and a second level signal at a level of said first operation power source voltage, and producing first and second select signals complementary to said first and second level signals, a first insulated gate field-effect transistor responsive to activation of the first select signal from said level converting means for being turned on to transmit said bias voltage to an output node, and a second insulated gate field-effect transistor responsive to activation of the second select signal from said level converting means for being turned on to transmit said second operation power source voltage to said output node, a back gate of said second insulated gate field-effect transistor being coupled to receive said bias voltage.

11. The semiconductor memory device according to claim 4, wherein said first bias voltage has a voltage level at least equal to or larger than that of a positive power source voltage having a value of 2.0 volts or less, and said second bias voltage has a voltage level equal to or less than that of a ground voltage.

12. The semiconductor memory device according to claim 1, further comprising precharge means provided corresponding to respective columns of memory cells in said memory cell array, for precharging corresponding columns to a predetermined potential, said precharge means including an insulated gate type field effect transistors having a back gate receiving a first power source potential;

sense amp means provided corresponding to respective columns for amplifying potentials on corresponding columns when activated, said sense amp means including a first insulated gate type field effect transistor having a back gate receiving a second power source potential, and a second insulated gate type field effect transistor having a back gate receiving the second power source potential.

13. The semiconductor memory device according to claim 1, wherein said plurality of memory cells each includes an insulated gate type field effect transistor having a back gate as said memory substrate region receiving a negative voltage as said constant bias voltage from said array bias means.

14. The semiconductor memory device according to claim 2, wherein said array bias means includes means receiving the voltage from said bias generating means for application to said memory substrate region of said memory cell array.

* * * * *